(12) United States Patent
Hitomi et al.

(10) Patent No.: US 8,399,774 B2
(45) Date of Patent: Mar. 19, 2013

(54) SUBSTRATE FOR SUSPENSION

(75) Inventors: Yoichi Hitomi, Shinjuku-Ku (JP);
Hiroaki Miyazawa, Shinjuku-Ku (JP);
Shinji Kumon, Kitamoto (JP);
Terutoshi Momose, Shinjuku-Ku (JP)

(73) Assignee: Dai Nippon Printing Co., Ltd.,
Shinjuku-Ku (JP)

( * ) Notice: Subject to any disclaimer, the term of this patent is extended or adjusted under 35 U.S.C. 154(b) by 0 days.

(21) Appl. No.: 13/303,769

(22) Filed: Nov. 23, 2011

(65) Prior Publication Data

US 2012/0090878 A1 Apr. 19, 2012

Related U.S. Application Data

(62) Division of application No. 12/062,730, filed on Apr. 4, 2008, now Pat. No. 8,097,811.

(30) Foreign Application Priority Data

| Apr. 4, 2007 | (JP) | 2007-098794 |
| Apr. 4, 2007 | (JP) | 2007-098818 |
| Apr. 19, 2007 | (JP) | 2007-110857 |

(51) Int. Cl.
*H05K 1/00* (2006.01)
*H05K 1/02* (2006.01)

(52) U.S. Cl. ........ 174/250; 174/255; 174/260; 257/699; 257/701; 438/699

(58) Field of Classification Search .................. 174/250, 174/255, 256, 257, 258, 259, 260, 261, 262, 174/263, 264, 265, 266, 51; 439/678, 687; 257/699, 701, 702

See application file for complete search history.

(56) References Cited

U.S. PATENT DOCUMENTS

| 6,100,582 | A | 8/2000 | Omote et al. |
| 6,399,899 | B1 | 6/2002 | Ohikawa et al. |
| 7,129,418 | B2 | 10/2006 | Aonuma et al. |
| 7,132,607 | B2 | 11/2006 | Yoshimi et al. |
| 7,272,889 | B2 | 9/2007 | Aonuma et al. |
| 7,495,178 | B2 | 2/2009 | Ishii et al. |
| 7,571,540 | B2 | 8/2009 | Aonuma et al. |
| 8,097,811 | B2 * | 1/2012 | Hitomi et al. .................. 174/250 |
| 2007/0074899 | A1 | 4/2007 | Aonuma et al. |

FOREIGN PATENT DOCUMENTS

| CN | 1921735 | 2/2007 |
| JP | 2004-164813 A1 | 6/2004 |
| JP | 2006-202359 A1 | 8/2006 |

* cited by examiner

*Primary Examiner* — Angel R Estrada
(74) *Attorney, Agent, or Firm* — Burr & Brown

(57) ABSTRACT

A substrate for suspension comprises a metallic substrate, an insulating layer formed on the metallic substrate, having an opening for grounding terminal, and a grounding conductor formed on the insulating layer. A grounding-terminal-forming material is placed in the opening for grounding terminal to form a grounding terminal that connects the metallic substrate and the grounding conductor. The grounding conductor does not surround a portion of the circumference of the opening for grounding terminal.

8 Claims, 31 Drawing Sheets

4d

SUBSTRATE FOR SUSPENSION

CROSS-REFERENCE TO RELATED APPLICATIONS

This application is a division of U.S. application Ser. No. 12/062,730, filed Apr. 4, 2008, and claims the benefit under 35 USC §119(a)-(d) of Japanese Patent Application Nos. 2007-098794 and 2007-098818, both filed Apr. 4, 2007, and Japanese Patent Application No. 2007-110857 filed Apr. 19, 2007, the entireties of which are incorporated herein by reference.

FIELD OF THE INVENTION

The present invention relates to a substrate for suspension for use in hard disk drives (HDDs), and so forth.

BACKGROUND OF THE INVENTION

In recent years, the spread of the Internet, etc. have generated demand for personal computers with increased information processing capacity and speed. To meet this demand, it has come to be necessary to increase the storage capacity and information transmission rate of HDDs incorporated in personal computers. As for a component called a magnetic head suspension, which is used to support a magnetic head in an HDD, a conventional suspension to which signal conductors made of gold wires or the like are connected has come to be replaced with a so-called wireless suspension of conductor-integrated type (flexor), in which signal conductors made of copper lines or the like are formed directly on a stainless-steel-made spring.

Demand on HDDs for use in a variety of small-sized devices including mobile phones has increased recently. HDDs therefore have been increased in the density of signal conductors, and, at the same time, magnetic heads have been decreased in size. Moreover, magnetic heads have come to have higher sensitivity, so that they are easily affected by static electricity with which they are charged. Therefore, one problem with small-sized magnetic head elements has been that, due to electric charges accumulated in sliders, they undergo change in their properties and are, in the worst case, destroyed.

There has been another problem in this field. High-frequency electrical signals have been more frequently used in recent years, in order to enhance the signal transmission rate and accuracy of HDDs. However, as the frequency of electrical signals to be transmitted increases, noises increase.

In order to solve the above problems, there has been used a means of grounding that connects electrically a slider and a suspension for a magnetic head via an electrically conductive resin placed between them. This means of grounding, however, has been disadvantageous in that since electrically conductive resins presently used for this purpose are not sufficient in conductivity, static electricity cannot be fully eliminated when an electrically conductive resin is used to connect a slider and a suspension. Moreover, the electrically conductive resins have been disadvantageous also in that since their adhesion is not satisfactory, they cannot bond a slider and a suspension with sufficiently high adhesion strength.

In order to overcome the above drawback, some proposals have been made in Japanese Laid-Open Patent Publication No. 2004-164813 A1. One of them is to connect electrically a grounding conductor connected to a slider and a metallic substrate by an electrically conductive resin. In this method, there is no need to use an adhesive whose adhesion is weak, such as an electrically conductive resin, to bond the slider and the metallic substrate, and an adhesive having strong adhesion can be used. This method, however, has been disadvantageous in that since an electrically conductive resin is used to connect the grounding conductor and the metallic substrate, the static electricity with which the slider is charged cannot be fully eliminated.

In order to prevent electrostatic destruction of a slider and to suppress the occurrence of noises, Japanese Laid-Open Patent Publication No. 2006-202359 A1 proposes a means of grounding in which a metallic pad is formed on the surface of an insulating layer layered over a metallic substrate, and a grounding terminal for connecting the metallic substrate and the metallic pad is formed in a through hole so made in the insulating layer and in the metallic pad that the metallic substrate is exposed. When such a means of grounding is used, it becomes possible to prevent electrostatic destruction of a slider by connecting a grounding conductor connected to the slider and the metallic pad, and, moreover, to bond the slider and the metallic substrate with sufficiently high strength. Furthermore, by placing the metallic pad in the vicinity of signal conductors formed on a substrate for suspension, it is possible to suppress the occurrence of noises on the substrate for suspension, and electrical signals transmitted by the signal conductors can thus be stabilized.

However, the means of grounding disclosed in Japanese Laid-Open Patent Publication No. 2006-202359 A1 has been disadvantageous in that since the metallic pad occupies a large area, it may be difficult to provide a substrate for suspension with this means of grounding. This is because there is a demand for substrates for suspensions that occupy only very small areas, since magnetic heads are getting smaller in size with the recent increase in the density of signal conductors in HDDs.

SUMMARY OF THE INVENTION

In the light of the above-described problems in the prior art, the present invention was accomplished. A major object of the present invention is therefore to provide a substrate for suspension having a means of grounding with which prevention of electrostatic destruction and suppression of the occurrence of noises can be fully achieved even when higher-density, narrow-pitched signal conductors have been formed on the substrate for suspension.

The present invention is a substrate for suspension, comprising a metallic substrate, an insulating layer formed on the metallic substrate, having an opening for grounding terminal so that the metallic substrate is exposed, a grounding conductor formed on the insulating layer, and a grounding terminal made of a grounding-terminal-forming material placed in the opening for grounding terminal, connecting the metallic substrate and the grounding conductor, a portion of the circumference of the opening for grounding terminal being not surrounded by the grounding conductor.

According to the present invention, since the grounding conductor does not surround a portion of the circumference of the opening for grounding terminal, it occupies a smaller area. Therefore, even when higher-density, narrow-pitched signal conductors have been formed on the substrate for suspension, it is easy to form the grounding conductor, and prevention of electrostatic destruction and suppression of the occurrence of noises can be fully achieved.

The present invention is the substrate for suspension, in which the grounding conductor has a protective deposit on its surface.

The protective deposit can make the grounding conductor resistant to corrosion.

The present invention is the substrate for suspension, in which the surface of the grounding conductor is covered directly with the grounding-terminal-forming material.

Since the surface of the grounding conductor is covered directly with the grounding-terminal-forming material, there is no need to form a protective deposit, which is usually formed on the surface of the grounding conductor. This makes the production of the substrate for suspension of the invention easier. Further, since connection between the grounding conductor and signal conductors on the substrate for suspension, which is required to form the protective deposit, need not be taken into account, the layout of the grounding conductor can be designed with a higher degree of freedom. Furthermore, there is no need to form a bridge, which can make the degree of springiness, etc., of the substrate for suspension of the invention easy to control.

The present invention is the substrate for suspension, in which the opening for grounding terminal exists apart from the grounding conductor with the entire circumference of the opening for grounding terminal not surrounded by the grounding conductor.

It is preferred that the opening for grounding terminal be not surrounded by the grounding conductor. This is because, if the grounding conductor need not surround the opening for grounding terminal, it can be made thinner (the line width of the grounding conductor can be made smaller). Moreover, the substrate for suspension of the invention can be made easier to process, which leads to improvement in yield.

The present invention is a substrate for suspension, comprising a metallic substrate, an insulating layer formed on the metallic substrate, having an opening for grounding terminal so that the metallic substrate is exposed, a grounding conductor formed on the insulating layer, including an opening forming area that has an opening situated above the opening for grounding terminal and that surrounds the opening for grounding terminal, and a grounding terminal made of a grounding-terminal-forming material placed in the opening for grounding terminal, connecting the metallic substrate and the grounding conductor, the opening forming area being entirely covered with the grounding-terminal-forming material.

According to the present invention, since the opening area of the grounding conductor is entirely covered with the grounding-terminal-forming material, application of the grounding-terminal-forming material does not demand high positional accuracy, and it is easy to make the opening area smaller. Therefore, even when higher-density, narrow-pitched signal conductors have been formed on the substrate for suspension, the grounding conductor including the opening area can be easily formed, and prevention of electrostatic destruction and suppression of the occurrence of noises can be fully achieved.

Furthermore, since the opening area is entirely covered with the grounding-terminal-forming material, excellent connection stability can be obtained.

The present invention is the substrate for suspension, in which the entire surface of the grounding conductor is covered directly with a protective deposit.

Since the surface of the grounding conductor is directly covered with the protective deposit, the grounding conductor can have resistance to corrosion.

The present invention is the substrate for suspension, in which the entire surface of the grounding conductor is covered directly with the grounding-terminal-forming material.

Since the surface of the grounding conductor is covered directly with the grounding-terminal-forming material, the grounding conductor can have resistance to corrosion even when a protective deposit is not formed on its surface, which makes the production of the substrate for suspension of the invention easier. Further, since connection between the grounding conductor and signal conductors on the substrate for suspension, which is necessary to form the protective deposit, need not be taken into account, the layout of the grounding conductor can be designed with a higher degree of freedom. Furthermore, there is no need to form a bridge, which makes the degree of springiness, etc., of the substrate for suspension of the invention easy to control.

The present invention is the substrate for suspension, in which the opening forming area has an outer diameter ranging from 50 to 400 μm.

An opening area with an outer diameter in the above range can make the area the grounding conductor occupies smaller. Therefore, even when higher-density, narrow-pitched signal conductors have been formed on the substrate for suspension, it is easy to form the grounding conductor.

The present invention is the substrate for suspension, in which the opening for grounding terminal, made in the insulating layer, has a diameter ranging from 30 to 300 μm.

It is difficult to make an opening for grounding terminal having a diameter of more than or less than the above range, in the insulating layer on the substrate for suspension on which higher-density, narrow-pitched signal conductors have been formed.

The present invention is a substrate for suspension, comprising a metallic substrate, an insulating layer formed on the metallic substrate, signal conductors formed on the insulating layer, and a grounding terminal formed on the metallic substrate, one side of the grounding terminal being connected to the metallic substrate, the other side exposed outside.

According to the present invention, since the grounding terminal is formed directly on the metallic substrate, the position in which the grounding terminal is placed can be determined with a higher degree of freedom. Therefore, even when higher-density, narrow-pitched signal conductors have been formed on the substrate for suspension, it is easy to form the grounding terminal.

The present invention is the substrate for suspension, in which the grounding terminal is not in contact with the insulating layer.

The present invention is the substrate for suspension, in which the insulating layer has an opening for grounding terminal, and the grounding terminal is so situated in the opening for grounding terminal that the grounding terminal is in contact with the insulating layer.

The present invention is the substrate for suspension, in which the grounding terminal is greater than the insulating layer in thickness.

Since the grounding terminal is greater than the insulating layer in thickness, it can easily connect to those components, such as a slider, that are mounted on the substrate for suspension of the invention. Moreover, the occurrence of noises can be efficiently suppressed.

The present invention can provide a substrate for suspension, having a means of grounding with which prevention of electrostatic destruction and suppression of the occurrence of noises can be fully achieved even when higher-density, narrow-pitched signal conductors have been formed on the substrate.

DETAILED DESCRIPTION OF THE INVENTION

First Embodiment

The first embodiment of a substrate for suspension of the present invention will be hereinafter described in detail.

A substrate for suspension of the present invention comprises a metallic substrate, an insulating layer formed on the metallic substrate, having an opening for grounding terminal so made that the metallic substrate is exposed, a grounding conductor formed on the insulating layer, and a grounding terminal made of a grounding-terminal-forming material placed in the opening for grounding terminal, being connected to the metallic substrate and to the grounding conductor, and, in this substrate for suspension, the opening for grounding terminal is partly not covered by the grounding conductor. The substrate for suspension in the first embodiment has two forms, a form (first form) in which a protective deposit is formed on the surface of the grounding conductor, and a form (second form) in which the surface of the grounding conductor is covered directly with the grounding-terminal-forming material. Each form of the substrate for suspension of the present invention will be described below.

1. First Form

The first form of the substrate for suspension according to the present invention will be first described. A substrate for suspension in this form is that a protective deposit is formed on the surface of the grounding conductor in the above-described substrate for suspension.

Figure 1:
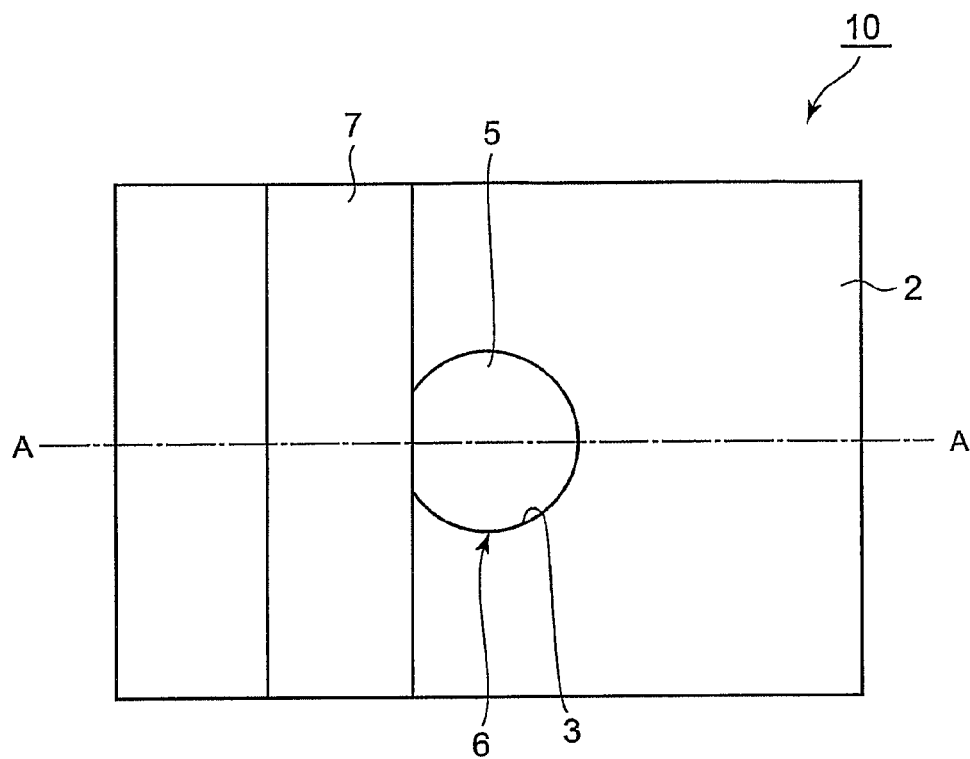
FIG. 1 is a diagrammatic plane view showing a substrate for suspension in the first form according to the first embodiment of the present invention.
Figure 2:
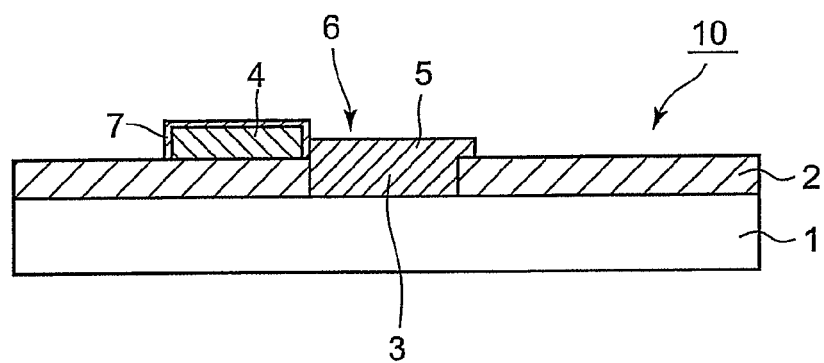
FIG. 2 is a diagrammatic cross-sectional view showing the substrate for suspension in the first form of the present invention.

The substrate for suspension in this form will be described with reference to the accompanying drawings. FIG. 1 is a plane view showing an example of the substrate for suspension in this form, and FIG. 2 is a cross-sectional view of the substrate for suspension, taken along line A-A in FIG. 1. As illustrated in FIGS. 1 and 2, the substrate for suspension 10 in this form comprises a metallic substrate 1, an insulating layer 2 formed on the metallic substrate 1, having an opening for grounding terminal 3 so that the metallic substrate 1 is exposed, a grounding conductor 4 formed on the insulating layer 2, and a grounding terminal 6 made of a grounding-terminal-forming material 5 placed in the opening for grounding terminal 3, being connected to the metallic substrate 1 and to the grounding conductor 4.

The grounding conductor 4 surrounds a part of the circumference of the opening for grounding terminal 3, but does not surround the remaining great portion of the circumference. Further, the grounding conductor 4 has, on its surface, a protective deposit 7.

Figure 23:
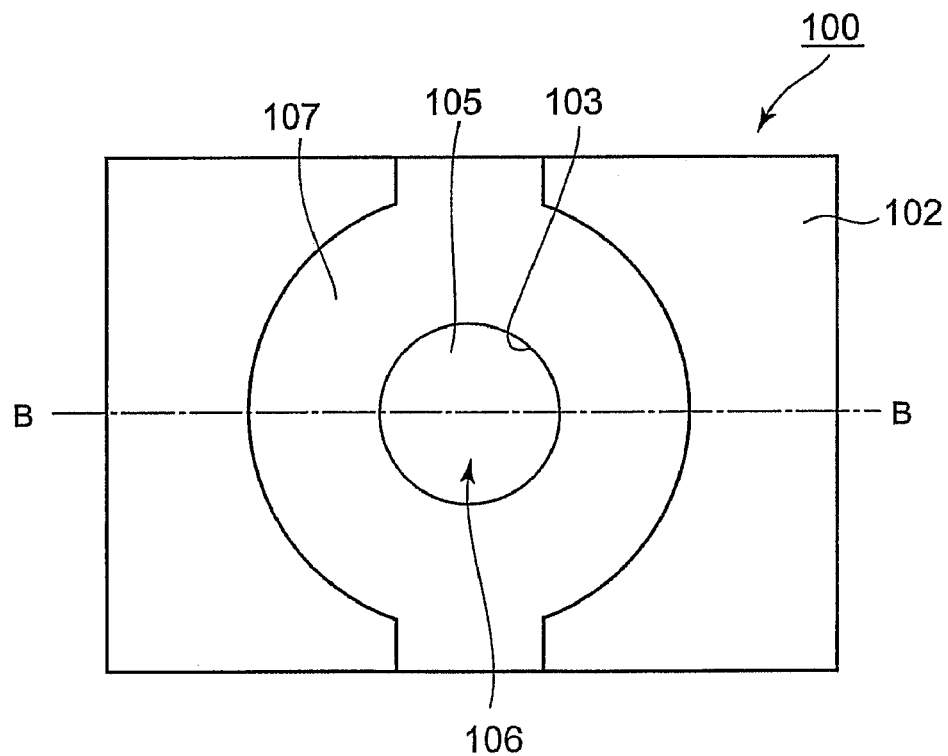
FIG. 23 is a diagrammatic plane view showing a conventional substrate for suspension.
Figure 24:
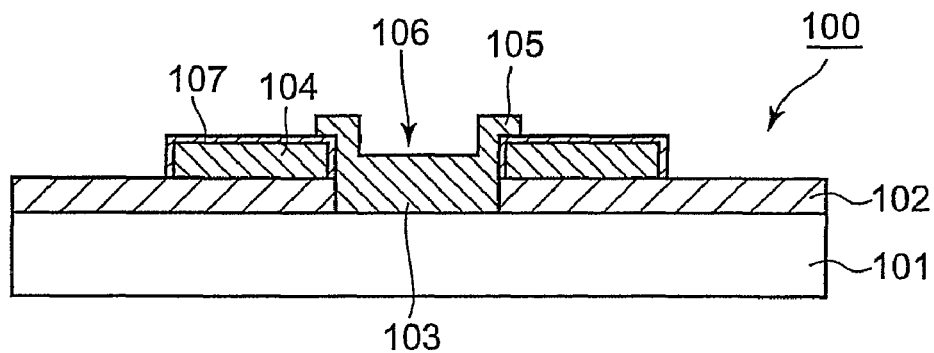
FIG. 24 is a diagrammatic cross-sectional view showing the conventional substrate for suspension.

As illustrated in a plane view in FIG. 23 and in a cross-sectional view in FIG. 24, taken along line B-B in FIG. 23, a conventional substrate for suspension comprises a metallic substrate 101, an insulating layer 102 formed on the metallic substrate 101, having an opening for grounding terminal 103, a grounding conductor 104 surrounding the circumference of the opening for grounding terminal 103, covered by a protective deposit 107, a grounding-terminal-forming material 105 so placed in the opening for grounding terminal 103 that it connects the metallic substrate 101 and the grounding conductor 104, and a grounding terminal 106 made of the grounding-terminal-forming material 105 placed in the opening for grounding terminal 103. In the above conventional substrate for suspension, since the grounding conductor is so formed that it surrounds the circumference of the opening for grounding terminal, it occupies a large area. It has been not easy to use such a conventional substrate for suspension in a magnetic head because there has been a demand for substrates for suspensions that occupy only very small areas, since magnetic heads have become smaller in size with the recent increase in the density of signal conductors in HDDs.

On the other hand, according to this form, since the grounding conductor does not surround a portion 8 of the circumference of the opening for grounding terminal, the area the grounding conductor occupies is smaller. The grounding conductor can therefore be formed with ease even when higher-density, narrow-pitched signal conductors have been formed on the substrate for suspension.

Further, since the grounding conductor is connected to the metallic substrate via the grounding terminal, it becomes possible to prevent fully electrostatic destruction of e.g., a slider by connecting the grounding conductor to the slider. Furthermore, when the grounding conductor is placed in the vicinity of signal conductors formed on the substrate for suspension of the present invention, the occurrence of noises on the substrate for suspension can be fully suppressed, and signals transmitted by the signal conductors can be stabilized.

In addition, since a protective deposit is formed on the grounding conductor, the grounding conductor is resistant to corrosion.

The substrate for suspension in this form has at least the metallic substrate, the insulating layer, the grounding conductor, the grounding terminal, and the protective deposit. These components of the substrate for suspension in this form will be described hereinafter.

(1) Grounding Terminal 6

The grounding terminal for use in this form is made by filling the opening for grounding terminal with a grounding-terminal-forming material, and connects to the metallic substrate and the grounding conductor that will be described later.

The expression "the grounding terminal connects to the metallic substrate and the grounding conductor" does not mean that the grounding terminal is in direct contact with the metallic substrate and with the grounding conductor, but that the grounding terminal can electrically connect the metallic substrate and the grounding conductor to produce continuity. Therefore, the above expression encompasses a case where the grounding terminal connects to the metallic substrate and to the grounding conductor via other layer made from an electrically conductive material.

(a) Opening for Grounding Terminal 3

The opening for grounding terminal in which the grounding terminal for use in this form will be formed is so made in the insulating layer (that will be described later) that the metallic substrate is exposed. A portion of the circumference of this opening is not surrounded by the grounding conductor that will be described later.

Figure 5:
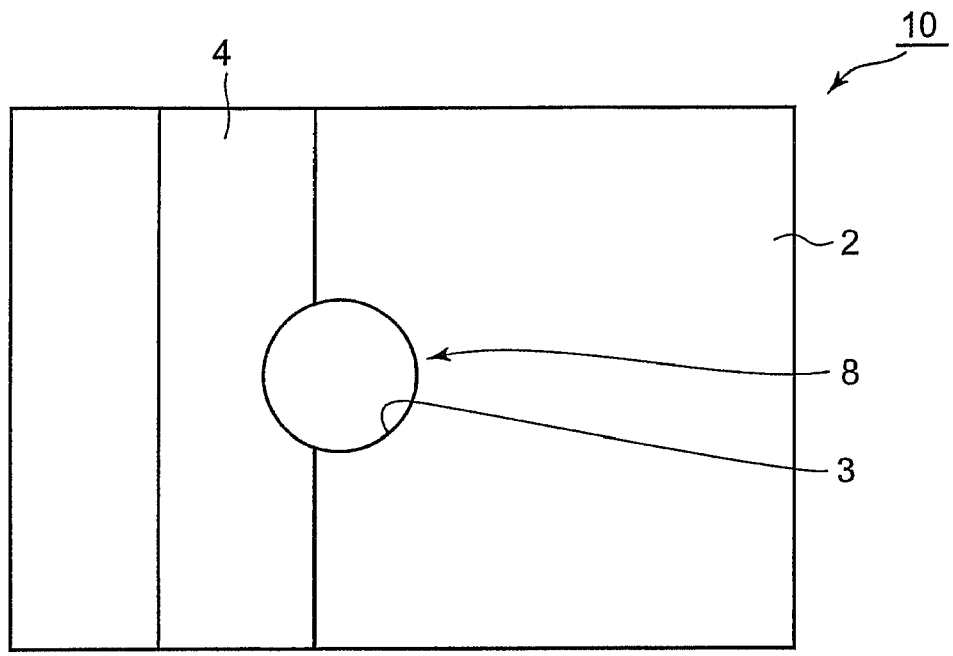
FIG. 5 is a view illustrating a grounding terminal for use in the present invention.
Figure 6:
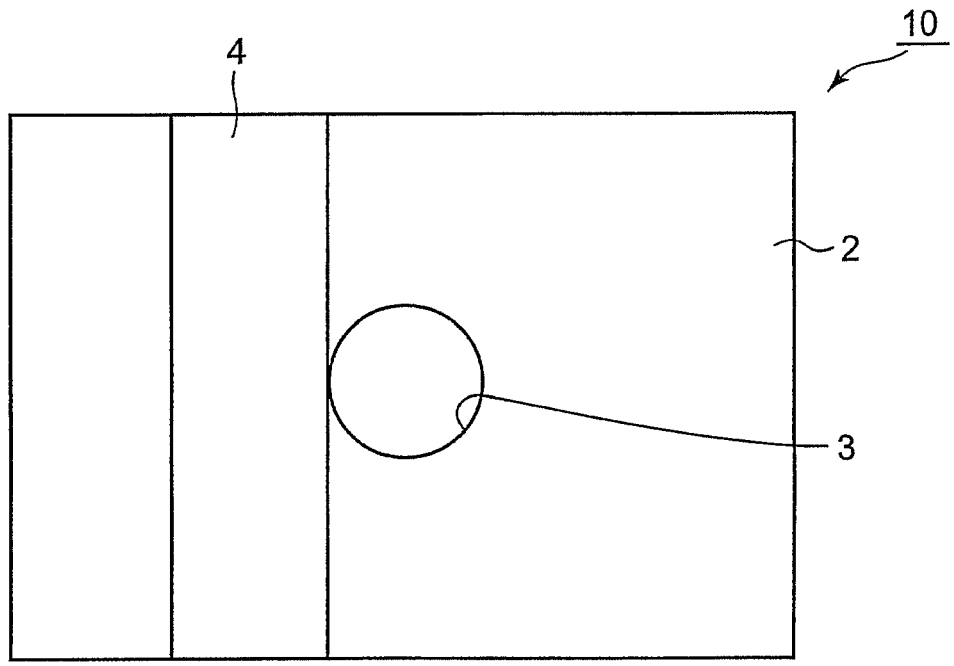
FIG. 6 is a view illustrating a grounding terminal for use in the present invention.
Figure 7:
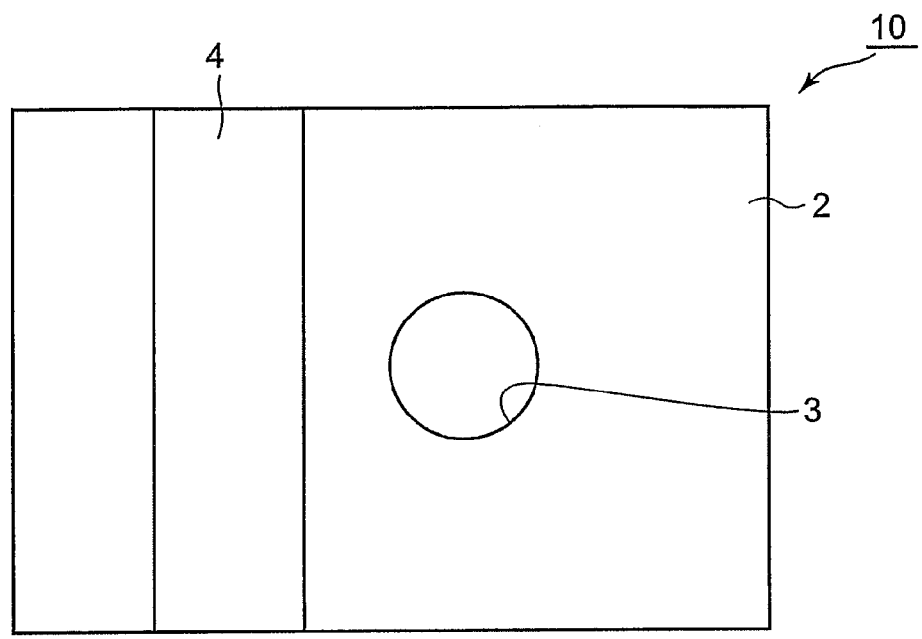
FIG. 7 is a view illustrating a grounding terminal for use in the present invention.
Figure 8:
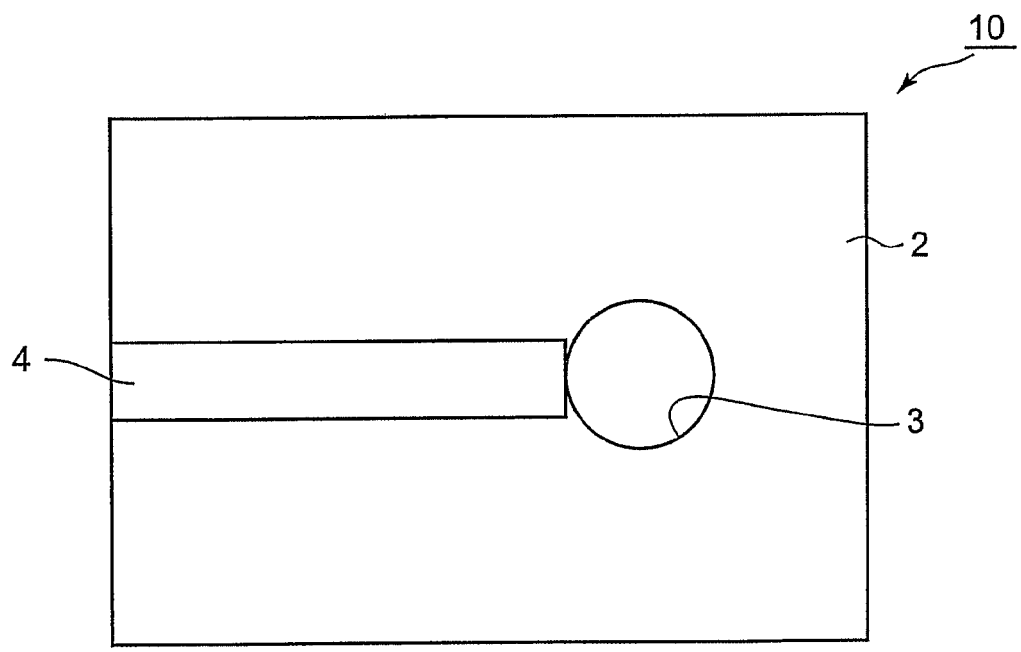
FIG. 8 is a view illustrating a grounding terminal for use in the present invention.

The opening for grounding terminal for use in this form can be made in any position as long as a portion of its circumference is not surrounded by the grounding conductor. For example, even when the most part of the opening for grounding terminal 3 exists inside the grounding conductor 4 as illustrated in plane views in FIGS. 3 and 4, the object of the invention can be fulfilled as long as a portion 8 of the outer periphery of the opening 3 is not surrounded by the grounding conductor 4. Also useful herein is an opening for grounding terminal 3 in which part of the opening for grounding terminal 3 exists inside the grounding conductor 4 and that a great portion of the outer periphery of the opening 3 is the portion 8 not surrounded by the grounding conductor 4, as illustrated in FIG. 5. Other useful openings for grounding terminal 3 are an opening in which it does not exist inside the grounding conductor 4 and that its outer periphery is in contact with the grounding conductor 4, as illustrated in FIG. 6; and an opening so made that it exists apart from the grounding conductor 4, as illustrated in FIG. 7. Besides the openings made in the inside of or in the sidewall of the grounding conductor, as illustrated in FIGS. 3 to 7, an opening 3 made at the end of the grounding conductor, as illustrated in FIG. 8, is also useful.

For convenience of explanation of the position of the opening for grounding terminal relative to the grounding conductor, the grounding-terminal-forming material and the protective deposit, components of the substrate for suspension in this form, are not depicted in FIGS. 3 to 8.

In this form, any of the above-described openings for grounding terminal can be used favorably. When the opening for grounding terminal and the grounding conductor are in contact with each other in a plane view, it is preferred that an opening is not present in the grounding conductor. On the other hand, when the opening for grounding terminal is made apart from the grounding conductor, it is preferred that the distance between the outer periphery of the opening for grounding terminal and the grounding conductor be 50 μm or less.

Further, in this form, particularly preferred is that the opening for grounding terminal and the grounding conductor are in contact with each other and that no other opening is present in the grounding conductor. This is because, in this case, it is easy to connect the grounding terminal and the grounding conductor.

In the case where the grounding conductor 4 has an opening 4a, the size of the opening 4a may be greater than that of the opening for grounding terminal 3, made in the insulating layer 2.

Figure 4:
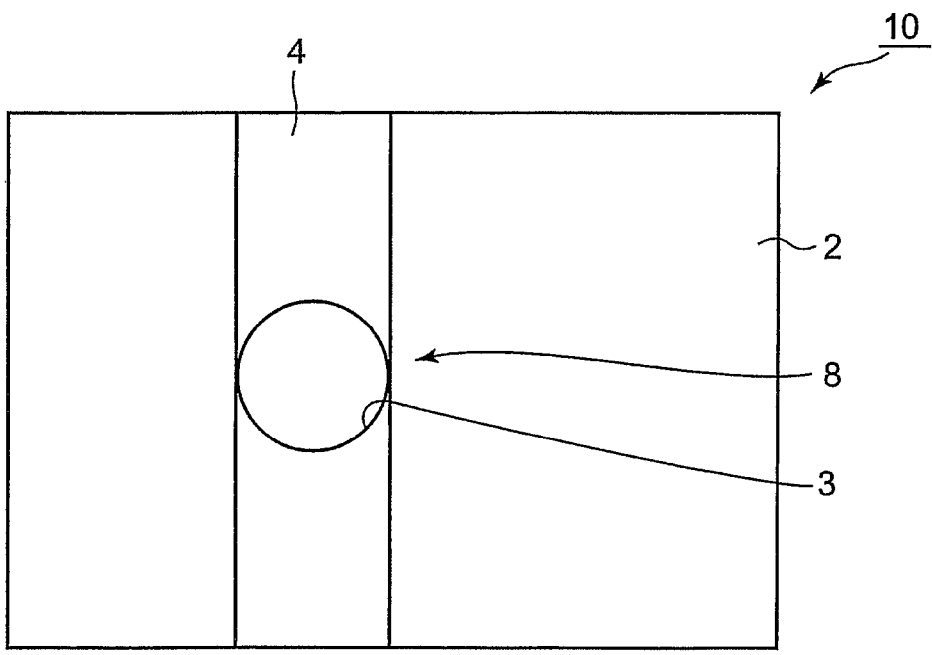
FIG. 4 is a view illustrating a grounding terminal for use in the present invention.

Although the grounding conductor 4 as illustrated in FIG. 4 is divided by the opening for grounding terminal 3, the divided parts of the grounding conductor 4 become continuous when the opening for grounding terminal 3 is filled with a grounding-terminal-forming material 5. Further, if feeder lines are attached to the two divided parts, a protective deposit 7 can be formed on the grounding conductor 4 by electroplating.

The opening for grounding terminal for use in this form may be in any shape in a plane view, as long as a grounding-terminal-forming material can be placed in the opening to form the grounding terminal. Examples of shapes useful herein include half circles, circles, ovals, polygons such as squares and pentagons, combs, crosses, and rods. Specifically, a circular opening for grounding terminal as illustrated in FIG. 6, a semicircular opening for grounding terminal as illustrated in FIG. 9, or a triangular opening for grounding terminal as illustrated in FIG. 10 may be made so that it is in contact with the grounding conductor.

Figure 9:
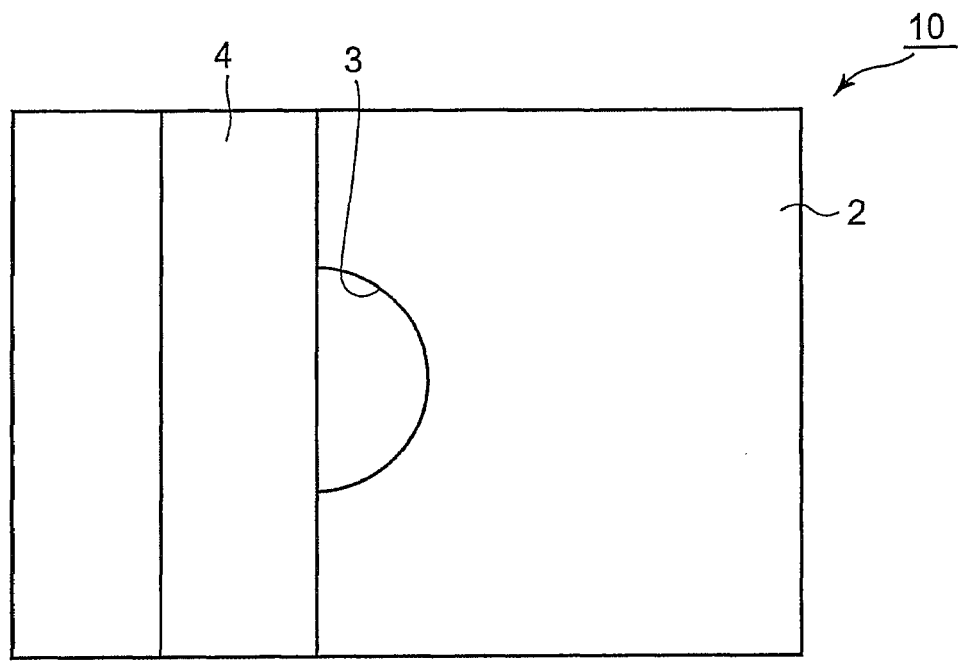
FIG. 9 is a view illustrating a grounding terminal for use in the present invention.
Figure 10:
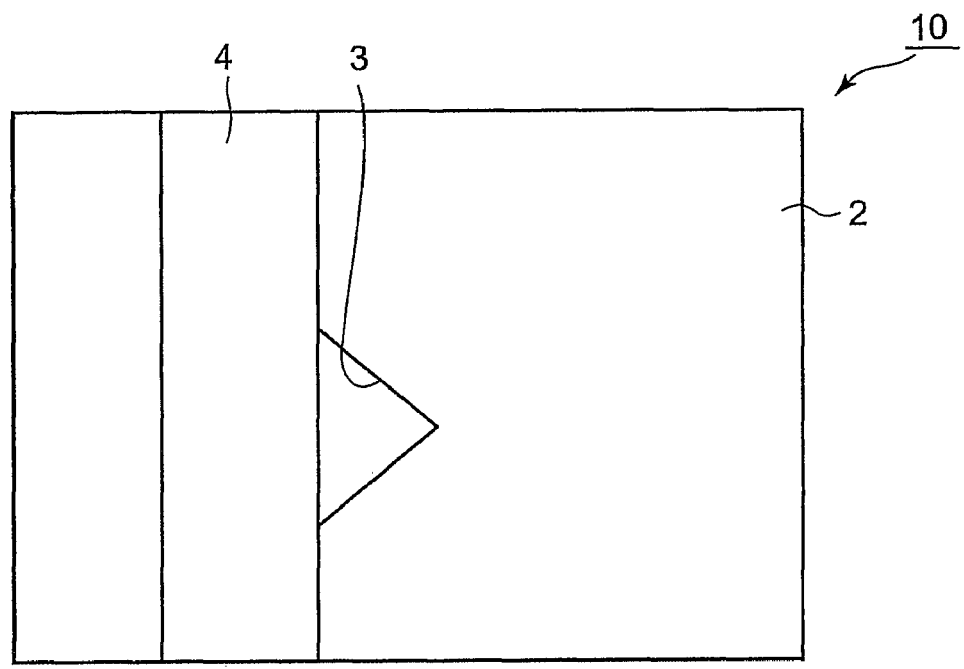
FIG. 10 is a view illustrating a grounding terminal for use in the present invention.

For convenience of explanation of the shape of the opening for grounding terminal in a plane view, the grounding-terminal-forming material and the protective deposit, components of the substrate for suspension, are not depicted in FIGS. 9 and 10.

In this form, when the opening for grounding terminal is circular, the diameter of the circle is from 30 to 300 μm, preferably from 30 to 200 μm, most preferably from 50 to 80 μm. This is because a circular opening for grounding terminal with a diameter in the above range can be easily made even when higher-density, narrow-pitched signal conductors have been formed on the substrate for suspension.

In this form, it is particularly preferred that the opening for grounding terminal be in the shape of a half circle in a plane view. This is because a grounding terminal formed in a semicircular opening for grounding terminal can stably connect to the grounding conductor.

(b) Grounding-Terminal-Forming Material 5

The grounding-terminal-forming material for use in this form is placed in the opening for grounding terminal and connects to the grounding conductor and to the metallic substrate.

Any material can be used in this form as the grounding-terminal-forming material, as long as it is an electrically conductive material having excellent conductivity and can be placed in the opening for grounding terminal. It is however preferred that the grounding-terminal-forming material have excellent adhesion to the metallic substrate and to the grounding conductor. Examples of such materials include metals and electrically conductive resins. Of these, metals are preferably used in the present invention. Specifically, it is possible to use silver (Ag), gold (Au), copper (Cu), nickel (Ni), and so forth. Of these, silver (Ag) and nickel (Ni) are preferred, and nickel (Ni) is most preferred because it has high conductivity and is inexpensive.

These materials can be identified by XPS (X-ray Photoelectron Spectroscopy).

Examples of electrically conductive resins useful herein include resins that exhibit conductivity by themselves, and mixtures of resins and metals.

A variety of methods, such as electroplating, electroless plating, and soldering, can be used to fill up the opening for grounding terminal with the grounding-terminal-forming material when the material is metal. Of these, electroplating is preferred because, with this method, a grounding terminal having low resistivity can be obtained, and, moreover, it is easy to make the grounding terminal finer.

In the case where the grounding-terminal-forming material is an electrically conductive resin, it can be applied with a dispenser or by printing to form the grounding terminal.

Figure 11:
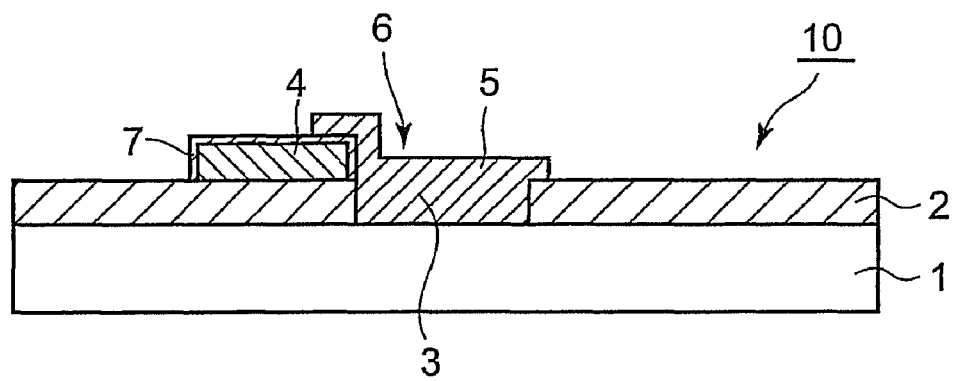
FIG. 11 is a view illustrating a grounding terminal for use in the present invention.
Figure 12:
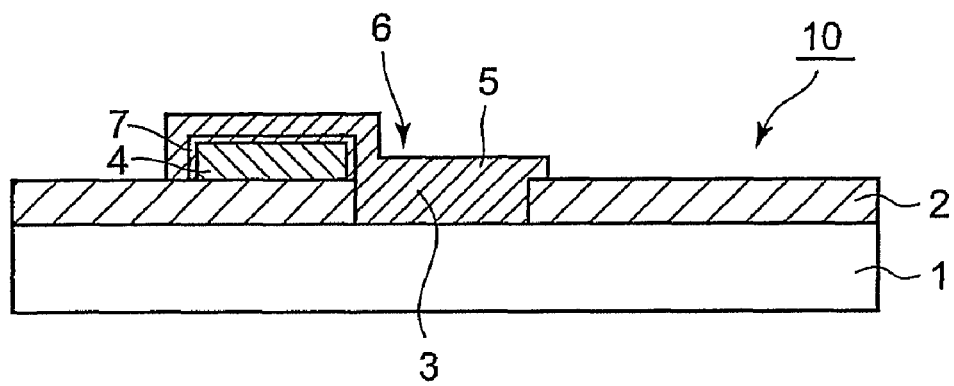
FIG. 12 is a view illustrating a grounding terminal for use in the present invention.

The section of the grounding-terminal-forming material applied may be in any shape, as long as the material is in contact with the grounding conductor and with the metallic substrate. The section of the grounding-terminal-forming material 5 placed in the opening for grounding terminal may be in such a shape that the material 5 is in contact with the sidewall of the grounding conductor 4, as illustrated in FIG. 2 whose explanation has been given already, or that the material 5 partly covers the upper Surface of the grounding conductor 4, as illustrated in FIG. 11, or that the material 5 covers the entire surface of the grounding conductor 4, as illustrated in FIG. 12.

In this form, particularly preferred is that the grounding-conductor-forming material 5 covers the entire surface of the grounding conductor. This is because, in this case, the grounding-conductor-forming material 5 and the grounding conductor can be brought into stable contact with each other.

Figure 13:
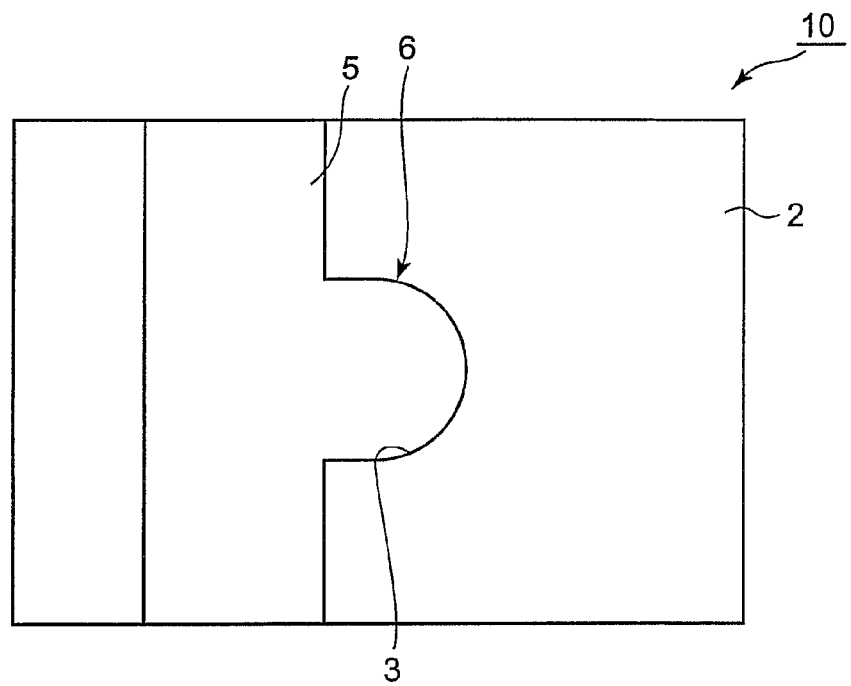
FIG. 13 is a view illustrating a grounding terminal for use in the present invention.
Figure 14:
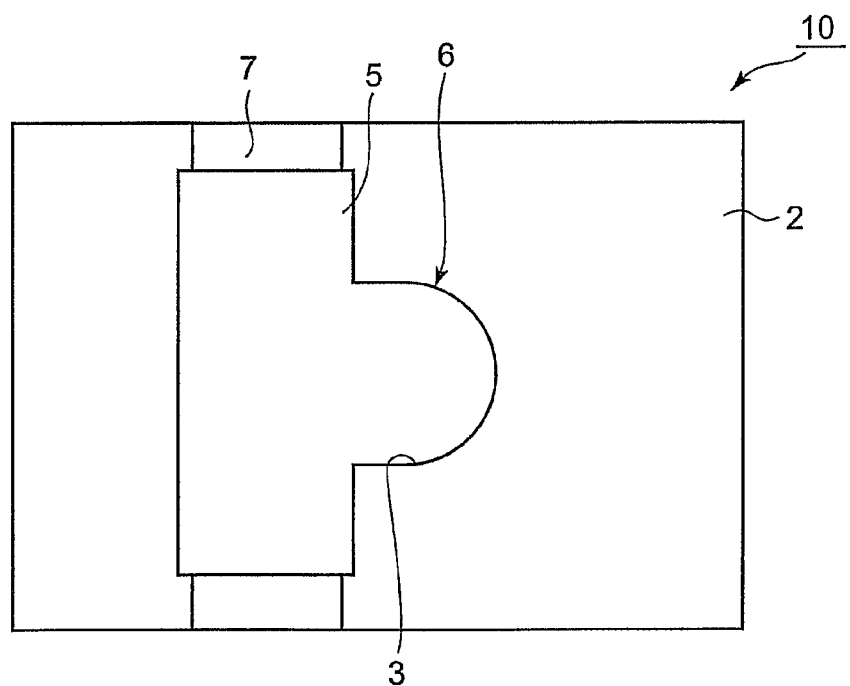
FIG. 14 is a view illustrating a grounding terminal for use in the present invention.

In the case where the grounding-terminal-forming material for use in this form is applied to cover the grounding conductor, it can be applied to any portion of the surface of the grounding conductor as long as the opening for grounding terminal is filled up with the material and the material is in contact with the grounding conductor and with the metallic substrate. The grounding-terminal-forming material 5 may be applied to cover the entire surface of the grounding conductor, as illustrated in FIG. 13. Alternatively, the grounding-terminal-forming material 5 may be applied to cover only a portion of the grounding conductor surface, in the vicinity of the opening for grounding terminal 3. In this form, the grounding-terminal-forming material 5 may be applied in either fashion, and the selection of a suitable fashion can be made with consideration for the use of the substrate for suspension in this form, and so forth.

Of the grounding-terminal-forming material applied, the material in the opening for grounding terminal can have any thickness, as long as it can stably connect to the metallic substrate and the grounding conductor that will be described later. The thickness of the material in the opening for grounding terminal is preferably from 100 nm to 50 μm, more preferably from 500 nm to 20 μm, although it depends on the thickness of the insulating layer that will be described later. When the grounding-terminal-forming material placed in the opening for grounding terminal has a thickness of less than 100 nm, it cannot stably connect to the metallic substrate and to the grounding conductor, and, moreover, static electricity and noises may not be fully eliminated. On the other hand, when the grounding-terminal-forming material in the opening for grounding terminal has a thickness of more than 50 μm, there can occur some troubles, e.g., contact between the material and those components, such as a slider, that are mounted on the substrate for suspension.

The thickness of the grounding-terminal-forming material placed in the opening for grounding terminal herein refers to the distance between the surface of the metallic substrate and that of the grounding-terminal-forming material.

In the case where the grounding-terminal-forming material is applied so that it covers the grounding conductor, the thickness of the material on the upper surface of the grounding conductor is preferably from 5 to 40 μm. This is because, as long as the thickness of the material on the upper surface of the grounding conductor is in the above range, there occurs no such a trouble as contact between the substrate for suspension and those components, such as a slider, that are mounted on the substrate.

(c) Grounding Terminal 6

The grounding terminal for use in this form is made of the grounding-terminal-forming material placed in the opening for grounding terminal and connects the metallic substrate and the grounding conductor that will be described later.

The grounding terminal can have any resistivity as long as it can achieve prevention of electrostatic destruction and suppression of the occurrence of noises. The resistivity of the grounding terminal is preferably 5Ω or less, more preferably 1Ω or less, most preferably from 0.10 to 0.25 Ω.

(2) Grounding Conductor 4

The grounding conductor for use in this form is formed on the insulating layer that will be described later and connects to the metallic substrate via the grounding terminal.

Figure 3:
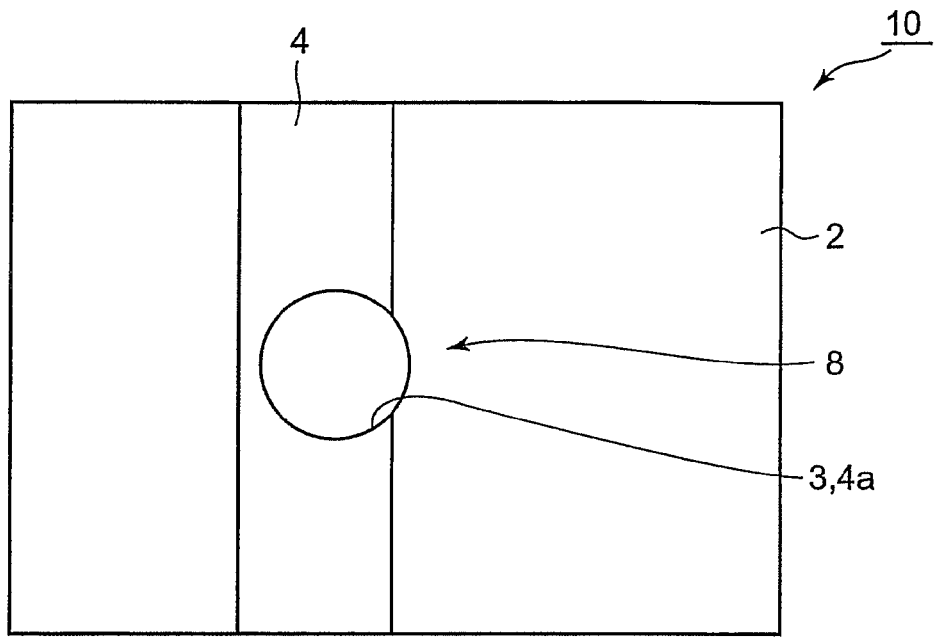
FIG. 3 is a view illustrating a grounding terminal for use in the present invention.

The grounding conductor may be in any shape in a plane view, as long as it surrounds partly the circumference of the opening for grounding terminal and can be made continuous with the metallic substrate by the grounding terminal. Specifically, the grounding conductor 4 may be formed so that it surrounds the opening for grounding terminal 3, as illustrated in FIGS. 3 to 5 whose explanations have been given already, or that it exists apart from the opening for grounding terminal 3, as illustrated in FIGS. 6 to 8.

In this form, it is preferred that an opening be not present in the grounding conductor 4. In the case where an opening is made in the grounding conductor 4, the line width of the grounding conductor 4 must be greater than the opening for grounding terminal because the grounding conductor is usually formed so that it surrounds the opening for grounding terminal. On the other hand, when no opening is made in the grounding conductor, the line width of the grounding conductor can be smaller than the opening for grounding terminal, so that it is possible to make the line width of the grounding conductor smaller. Moreover, in this case, the substrate for suspension in this form can be easily processed, which leads to an improvement in yield. Namely, in the case where an opening is made in the grounding conductor, it is necessary that, after making this opening, the opening for grounding terminal be made in the insulating layer that will be described later, in the same position as that of the opening made in the grounding conductor. It is therefore needed to make the opening for grounding terminal in the grounding conductor and in the insulating layer with high positional accuracy. On the other hand, when no opening is made in the grounding conductor, it is necessary to make only the opening for grounding terminal in the insulating layer, in the vicinity of the grounding conductor, which makes processing easier. Moreover, in this case, there never occurs the trouble that, due to the positional deviation of the opening for grounding terminal, the grounding terminal cannot be formed so that it connects the metallic substrate and the grounding conductor, and a decrease in yield can thus be lessen.

Figure 15:
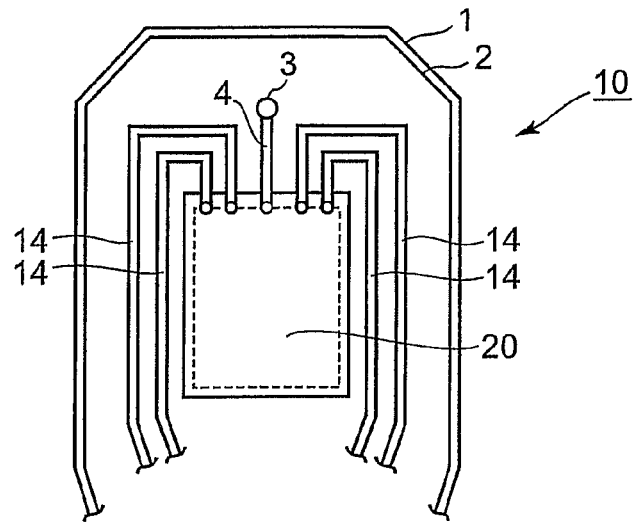
FIG. 15 is a view illustrating a grounding conductor for use in the present invention.

The grounding conductor for use in this form can be formed in any position on the substrate for suspension in this form, as long as it can achieve, as desired, prevention of electrostatic destruction and suppression of the occurrence of noises. The position in which the grounding terminal is formed may be selected according to the use of the substrate for suspension in this form, and so forth. Specifically, as illustrated in FIG. 15, the grounding conductor may be formed in the front part of the substrate for suspension, on which a slider for a magnetic head will be mounted. In FIG. 15, the opening for grounding terminal 3 exists in the front part of the substrate for suspension 10, and in this part are also present a grounding conductor 4 and signal conductors 14 for transmitting electrical signals, both conductors being extended to the points at which they can connect to a slider situated in a slider placement position 20.

Figure 16:
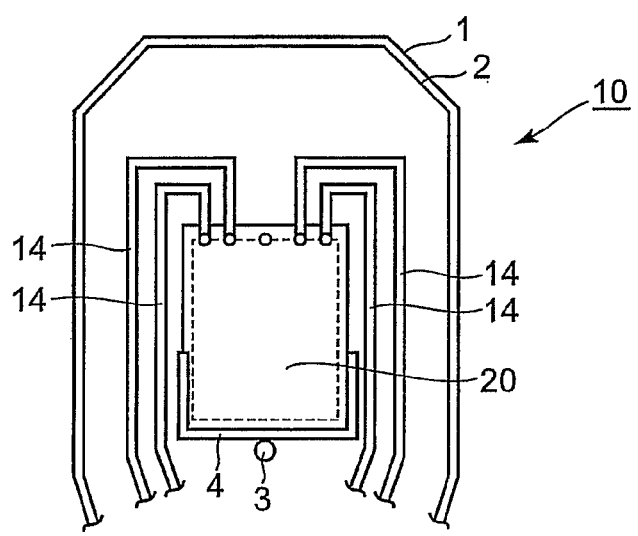
FIG. 16 is a view illustrating a grounding conductor for use in the present invention.

Further, the grounding conductor 4 may be formed around the slider placement position 20, as illustrated in FIG. 16. This is because, since a substrate for suspension and a slider are usually bonded with an adhesive, the grounding conductor formed around the slider placement position, in which a substrate for suspension and a slider are bonded with an adhesive, can prevent the adhesive from running off.

Figure 17:
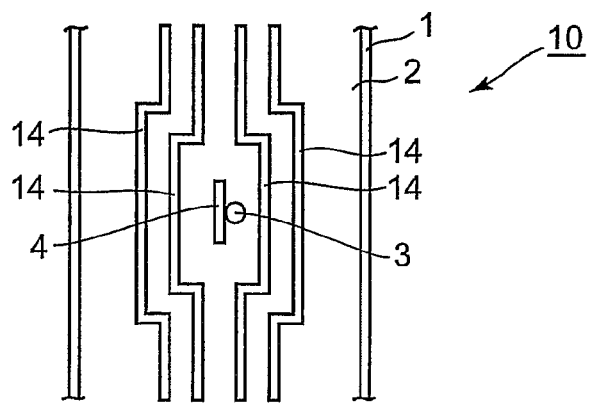
FIG. 17 is a view illustrating a grounding conductor for use in the present invention.

The grounding conductor 4 may also be formed in a part other than the front part of the substrate for suspension, as illustrated in FIG. 17. In FIG. 17, the grounding conductor 4 exists between two signal conductors 14, 14, and the opening for grounding terminal 3 is present in the insulating layer 2, in an area in which the grounding conductor 4 is present.

For convenience of explanation of the grounding conductor, the grounding-terminal-forming material and the protective deposit, components of the substrate for suspension in this form, are not depicted in FIGS. 15 to 17.

Examples of materials useful for the grounding conductor in this form include copper (Cu).

Although the grounding conductor for use in this form can have any thickness as long as it can exhibit the desired conductivity, its thickness is usually in the range of 6 to 18 μm, preferably in the range of 8 to 12 μm. This is because a grounding conductor with a thickness in the above range can make the substrate for suspension free from such a trouble as contact with those components, such as a slider, that are mounted on the substrate for suspension.

The grounding conductor for use in this form can have any line width, as long as it can exhibit the desired conductivity. It is, however, preferred that the line width of the grounding conductor be in the range of 10 to 100 μm, preferably in the range of 15 to 50 μm. This is because it is easy to form a grounding conductor with a line width in the above range even when higher-density, narrow-pitched signal conductors have been formed on the substrate for suspension. Further, in this form, the grounding conductor surrounds not the entire circumference of the opening for grounding terminal, so that it is possible to make the grounding conductor thinner (to make the line width smaller). Thus, the line width of the grounding conductor in the above range is effective in providing the substrate for suspension with finer conductors, and also in making the substrate for suspension smaller in size.

(3) Insulating Layer 2

The insulating layer for use in this form is formed on the metallic substrate that will be described later, and has the opening for grounding terminal 3 so that the metallic substrate is exposed.

Examples of materials useful for the insulating layer include polyimide (PI).

The insulating layer can have any thickness as long as it can exhibit the desired insulating properties, and its thickness is usually about 5 to 30 μm.

(4) Metallic Substrate 1

The metallic substrate for use in this form has electrical conductivity. Moreover, it usually has a moderate degree of springness because it constitutes a substrate to be used for a suspension.

Examples of materials useful for the metallic substrate include SUS.

Preferably, the metallic substrate for use in this form has an electrically conductive layer on the side in which the opening for grounding terminal will be made. This is because when such an electrically conductive layer is present, the grounding terminal can produce continuity more efficiently. Specific examples of materials useful for the electrically conductive layer include copper (Cu). The electrically conductive layer can be formed by a variety of methods including plating.

The metallic substrate can have any thickness as long as it can exhibit the desired degree of springness. The thickness of the metallic substrate is usually from 10 to 30 μm, preferably from 15 to 25 μm, although it depends on the material for the metallic substrate, and so on.

(5) Protective Deposit 7

The protective deposit in this form is formed directly on the surface of the grounding conductor. Copper (Cu) is usually used to form the grounding conductor, so that the grounding conductor is corrosive. A protective deposit of a metal other than copper is therefore formed on the surface of the grounding conductor to make the grounding conductor resistant to corrosion.

In this form, a protective deposit so formed that it entirely covers at least a portion of the grounding conductor surface, not protected from corrosion without being coated with e.g., a cover lay that will be described later, is enough to make the grounding conductor resistant to corrosion. Therefore, the protective deposit may be formed so that it covers the entire surface of the grounding conductor, or that it covers only the exposed portion, not coated with a cover lay or the like, of the surface of the grounding conductor.

In this form, nickel (Ni) or gold (Au) can be used to form the protective deposit, and gold (Au) is particularly preferred. This is because, since gold is excellent in resistance to corrosion, a deposit of gold can make the grounding conductor highly resistant to corrosion.

It is preferred that the thickness of the protective deposit for use in this form be 5 μm or less, preferably from 1 to 2 μm. This is because a protective deposit with a thickness in the above range can be stably formed on the surface of the grounding conductor.

To cut production costs, the protective deposit in this form is usually formed in the following manner. Signal conductors for transmitting electrical signals and the grounding conductor that are connected by a connecting line are formed on the insulating layer; and using the signal conductors and the grounding conductor as feeder layers, a protective deposit is then formed on the surfaces of the signal conductors and that of the grounding conductor. The protective deposit may also be formed by electroless plating without forming a connecting line for connecting the grounding conductor and the signal conductors.

(6) Substrate for Suspension 10

The substrate for suspension in this form can have a cover lay (CL) on the insulating layer, if necessary. The cover lay can have any thickness, and its thickness is usually about 5 to 30 μm. Any material can be used to form the cover lay, and the same materials as those used to form cover lays on ordinary flexible substrates, etc. can be used herein.

The substrate for suspension in this form further has signal conductors for transmitting electrical signals, in addition to the above-described grounding conductor. The signal conductors usually include conductors for writing and those for reading. Although the signal conductors may be made from a material either the same as or different from the material for the grounding conductor, they are usually formed from the same material (the signal conductors and the grounding conductor are made from one conductor-forming layer). This is because the use of the same material can achieve reduction in costs.

The smallest of the pitches with which the signal conductors are formed is preferably between 60 μm and 200 μm, more preferably between 60 μm and 100 μm. This is because the substrate for suspension in this form can more fully exhibit its effects when the minimum pitch is in the above range.

Figure 18:
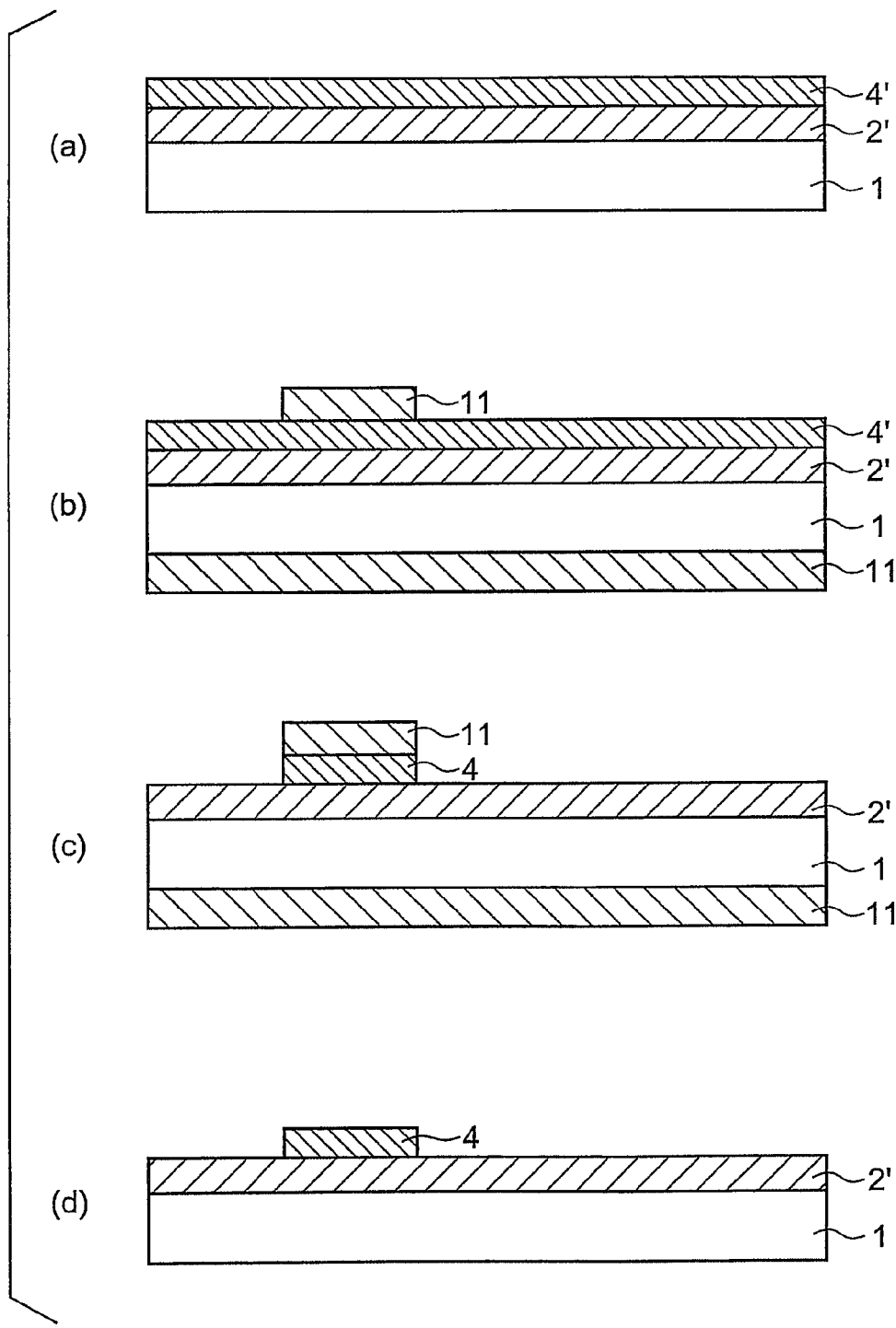
FIG. 18 is a flow chart showing a process of producing a substrate for suspension in the first form of the present invention.

Any method can be employed to produce a substrate for suspension in this form, as long as the components of the substrate for suspension can be accurately placed in the desired positions. For example, the following method can be used to produce a substrate for suspension 10 in this form. A laminate of a metallic substrate 1, an insulating-layer-forming layer 2' of a material for an insulating layer, and a grounding-conductor-forming layer 4' of a material for a grounding conductor is first made as shown in FIG. 18(*a*). Thereafter, a photoresist 11 in the form of a dry film or the like is formed on each side of the laminate and is patterned as desired (FIG. 18(*b*)). Patterning of the grounding-conductor-forming layer 4' is then conducted by etching (FIG. 18(*c*)), and the photoresist 11 is stripped, thereby forming a grounding conductor 4 (FIG. 18(*d*)). In this step, signal conductors 14 are simultaneously formed, if necessary.

Figure 19:
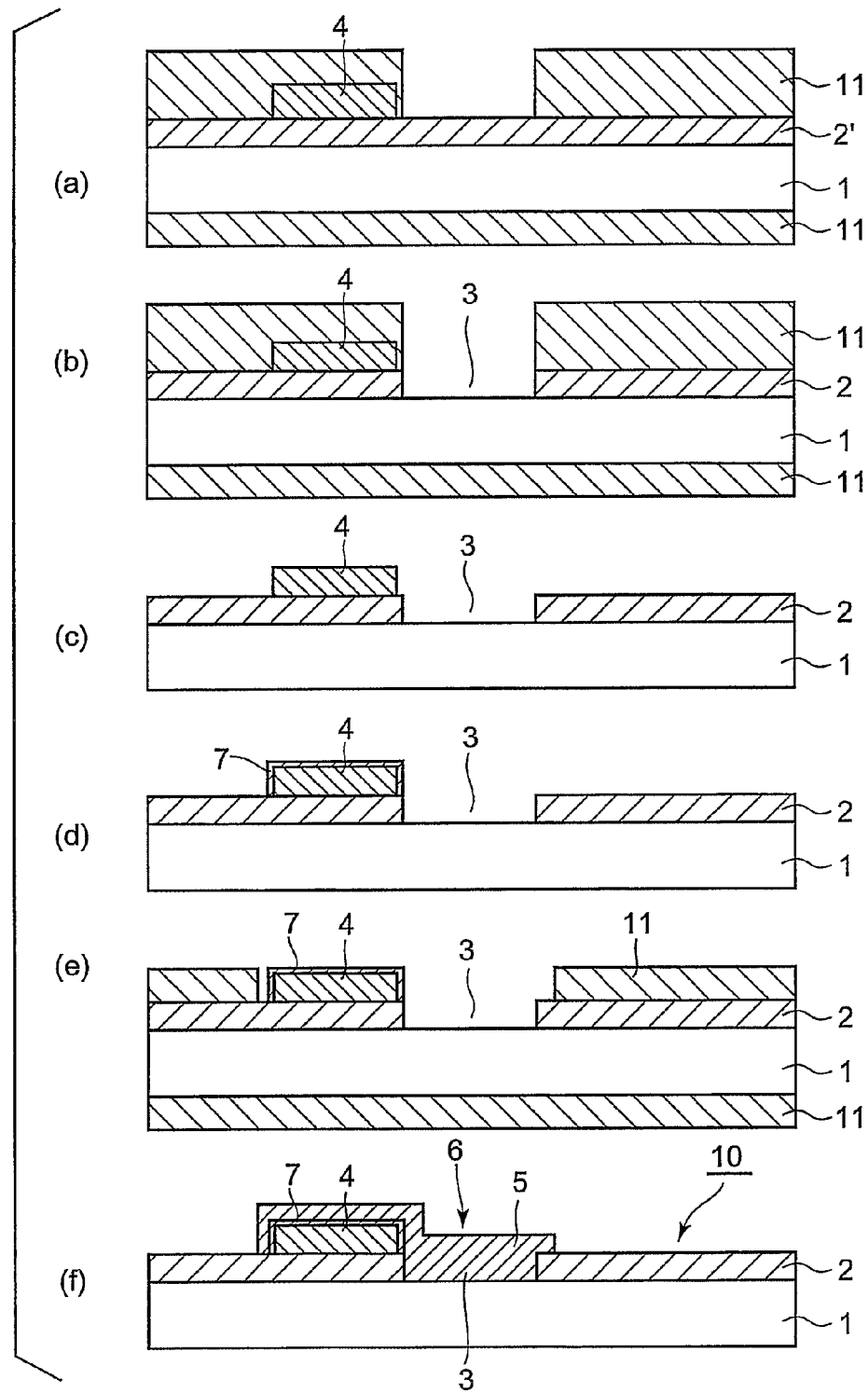
FIG. 19 is a flow chart showing a process of producing a substrate for suspension in the first form of the present invention.

Subsequently, a photoresist 11 in the form of a dry film or the like is formed and is patterned as desired, as shown in FIG. 19(*a*). The insulating-layer-forming layer 2' is then subjected to patterning by etching (FIG. 19(*b*)), and the photoresist 11 is stripped, thereby forming an insulating layer 2 having an opening for grounding terminal 3 (FIG. 19(*c*)).

Using the grounding conductor 4 as a feeder layer, a protective deposit 7 is formed on the grounding conductor 4 (FIG. 19(*d*)).

Thereafter, a photoresist 11 in the form of a dry film or the like is formed on each side of the laminate and is patterned as desired (FIG. 19(*e*)). Using the metallic substrate 1 as a feeder layer, the opening for grounding terminal 3 is filled with a metal serving as the grounding-terminal-forming material 5 by electroplating to form a grounding terminal 6 that connects the metallic substrate 1 and the grounding conductor 4. The photoresist 11 is then stripped, thereby obtaining a substrate for suspension 10 (FIG. 19(*f*)).

FIGS. 18(*a*)-(*d*) show the process of grounding conductor formation, and FIGS. 19(*a*)-(*c*), the process of insulating layer formation. FIG. 19(*d*) shows the process of protective deposit formation, and FIGS. 19(*e*)-(*f*), the process of grounding terminal formation.

The substrate for suspension in this form is used for a magnetic head suspension in a hard disc drive (HDD). In particular, it is favorably used for a magnetic head suspension for use in an HDD having higher-density, narrow-pitched signal conductors.

2. Second Form

Next, the second form of the substrate for suspension according to the present invention will be described. A substrate for suspension in the second form is equivalent to the above-described substrate for suspension in which the surface of the grounding conductor is covered directly with the grounding-terminal-forming material.

Figure 20:
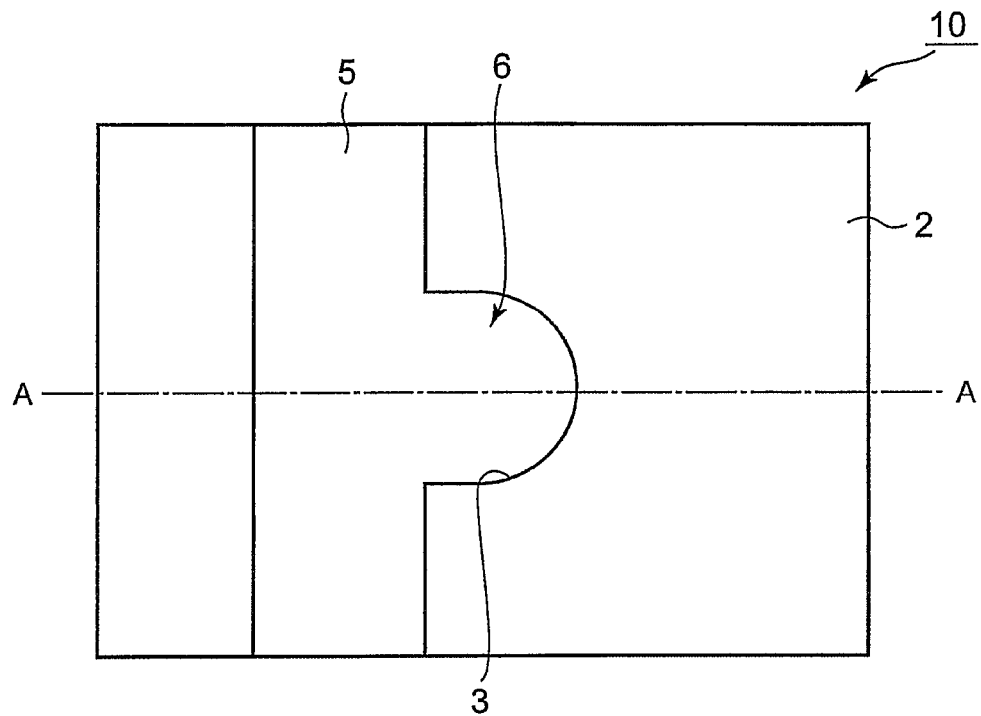
FIG. 20 is a diagrammatic plane view showing a substrate for suspension in the second form according to the first embodiment of the present invention.
Figure 21:
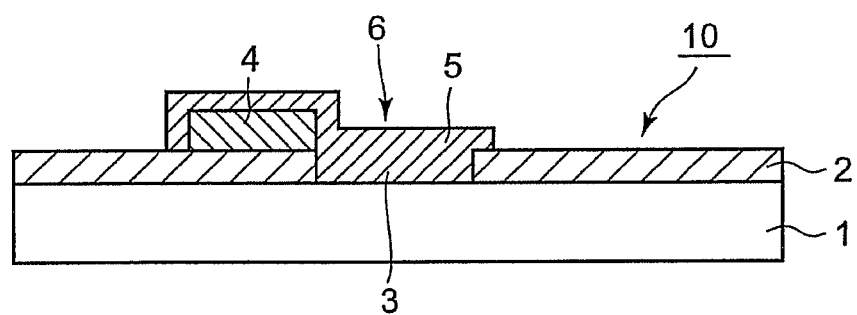
FIG. 21 is a diagrammatic cross-sectional view showing the substrate for suspension in the second form of the present invention.

A substrate for suspension in the second form will be described with reference to the accompanying drawings. FIG. 20 is a plane view of a substrate for suspension in this form, and FIG. 21 is a cross-sectional view of the substrate for suspension, taken along line A-A in FIG. 20. The substrate for suspension 10 comprises a metallic substrate 1, an insulating layer 2 formed on the metallic substrate 1, having an opening for grounding terminal 3 so that the metallic substrate 1 is exposed, a grounding conductor 4 formed on the insulating layer 2, and a grounding terminal 6 formed by filling the opening for grounding terminal 3 with a grounding-terminal-forming material 5 so that the material 5 connects to the metallic substrate 1 and to the grounding conductor 4, as illustrated in FIGS. 20 and 21.

The circumference of the opening for grounding terminal 3 is partly surrounded by the grounding conductor 4, and a great portion of it is not. Further, the surface of the grounding conductor 4 is covered directly with the material 5 for forming the grounding terminal 6.

According to this form, since the grounding conductor occupies only a small area, it is easy to form the grounding conductor even when higher-density, narrow-pitched signal conductors have been formed on the substrate for suspension, and prevention of electrostatic destruction and suppression of the occurrence of noises can be fully achieved.

Figure 22:
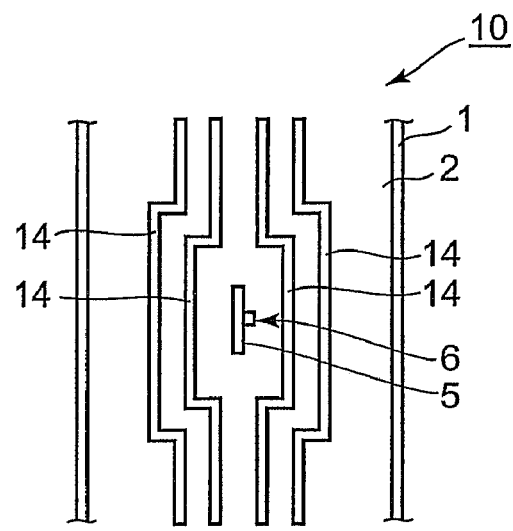
FIG. 22 is a view illustrating the second form of the substrate for suspension of the present invention.

Since the surface of the grounding conductor is covered directly with the material for forming the grounding terminal, the grounding conductor can be protected from corrosion even when it has no protective deposit on its surface. Therefore, connection between the grounding conductor and the signal conductors, as described under the item "(5) Protective Deposit" in the above "1. First Form", need not be taken into account. This makes it possible to form the grounding conductor and the signal conductors separately, and can make the degree of freedom in designing the layout of the signal conductors and the grounding conductor on the substrate for suspension higher. It is therefore easy to produce, for example, a substrate for suspension comprising a metallic substrate 1, an insulating layer 2 formed on the metallic substrate 1, and signal conductors 14 for transmitting electrical signals, etc., formed on the insulating layer 2, in which an independent grounding terminal 6 and a grounding conductor covered with a grounding-terminal-forming material 5 are present between the signal conductors 14, 14, as illustrated in FIG. 22.

Furthermore, since there is no need, in this form, to form a line for connecting the signal conductors and the grounding conductor, the formation of a bridge is unnecessary. The bridge herein means a place, on the substrate for suspension, in which a line for connecting the signal conductors and the grounding conductor is formed. Since a conventional substrate for suspension is relatively large and the layout of conductors on it can be designed with a high degree of freedom, it has been possible to form a grounding conductor extended to a point apart from the position in which the grounding conductor must be formed, and to form a bridge for the extended grounding conductor. However, in a substrate for suspension on which higher-density, narrow-pitched signal conductors have been formed, it is often difficult to extend the grounding conductor to a point apart from the position in which the grounding conductor must be formed, and in this case, it is necessary to form a bridge around the position in which the grounding conductor must be formed. When such a bridge is formed in the front part of the substrate for suspension, on which a slider for reading out the data from a disk and writing the data on a disk is mounted, the substrate for suspension is not easy to control the degree of springness, etc., and may be difficult to read out the data from a disk and write the data on a disk with a slider while stably floating on the desk in a hard disk drive. On the other hand, there is no need in this form to form the above-described connecting line, and this makes the formation of a bridge unnecessary, so that the substrate for suspension in this form can be made easy to control the degree of springness, etc.

The substrate for suspension in this form has at least the metallic substrate, the insulating layer, the grounding conductor, and the grounding terminal. These components of the substrate for suspension in this form will be described hereinafter. The metallic substrate, the insulating layer, and the grounding conductor in the substrate for suspension in this form are the same as those described in the above "1. First Form", so that explanations of them will not be repeated in the following description.

(1) Grounding Terminal 6

The grounding terminal for use in this form is formed by filling the opening for grounding terminal with the grounding-terminal-forming material and connects to the grounding conductor and to the metallic substrate.

The details of the opening for grounding terminal in this form may be the same as those described in the item "(a) Opening for Grounding Terminal" in "(1) Grounding Terminal" in the above "1. First Form".

The grounding-terminal-forming material for use in this form is so applied that it directly covers the surface of the grounding conductor. Namely, the grounding conductor having, on its surface, no such a layer as a protective deposit is covered directly with the material for forming the grounding terminal.

A grounding-terminal-forming material applied to cover at least the entire portion of the grounding conductor surface, not protected from corrosion or the like by a cover lay that will be described later, or the like, can fulfill its purpose. Therefore, the grounding-terminal-forming material may be applied so that it covers the entire surface of the grounding conductor, or that it covers only the exposed portion of the grounding conductor, not covered with a cover lay or the like.

Specifically, the position in which the grounding-terminal-forming material is applied, and the sectional form of the grounding-terminal-forming material applied are as illustrated in FIGS. 20 and 21 whose explanations have been given already.

The grounding-terminal-forming material can be applied to the upper surface of the grounding conductor to any thickness, as long as it can protect the grounding conductor from corrosion or the like. The thickness of the grounding-terminal-forming material applied is preferably in the range of 0.5 to 20 µm, more preferably in the range of 1 to 10 µm. This is because a grounding-terminal-forming material layer with a thickness in the above range can make the grounding conductor resistant to corrosion or the like.

The grounding-terminal-forming material placed in the opening for grounding terminal can have any thickness, as long as it can stably connect to the metallic substrate and to the grounding conductor and can also cover the surface of the grounding conductor. This thickness is preferably from 8 µm to 50 µm, more preferably from 15 µm to 25 µm, although it varies depending on the thickness of the insulating layer. When the thickness of the grounding-terminal-forming material placed in the opening for grounding terminal is less than 8 µm, the material may be difficult to cover the grounding conductor and may not stably connect to the metallic substrate and to the grounding conductor, and, moreover, static electricity and noises may not be fully eliminated. On the other hand, when the thickness of the grounding-terminal-forming material placed in the opening for grounding terminal is in excess of the above range, the substrate for suspension in this form may come into contact with those components, such as a slider, that are mounted on the substrate for suspension.

The thickness of the grounding-terminal-forming material placed in the opening for grounding terminal herein refers to the vertical distance between the surface of the metallic substrate and that of the grounding-terminal-forming material in the opening.

The type of the grounding-terminal-forming material for use in this form may be the same as the one described in the item "(b) Grounding-Terminal-Forming Material" in the above "1. First Form".

The resistivity of the grounding terminal for use in this form may be the same as that described in the item "(c) Grounding Terminal" in the above "1. First Form".

(2) Substrate for Suspension 10

The substrate for suspension in this form usually has signal conductors. It can also have a cover lay (CL) on the insulating layer, if necessary. The details of the signal conductors and those of the cover lay may be the same as those described in the item "(6) Substrate for Suspension" in the above "1. First Form".

A method not comprising the above-described process of protective deposit formation in which a protective deposit is formed on the grounding conductor can be employed to produce the substrate for suspension in this form. For example, a production method useful herein comprises the above-described process of grounding conductor formation, process of insulating layer formation, and process of grounding terminal formation.

The substrate for suspension in this form is used, for example, for a magnetic head suspension in a hard disc drive (HDD). In particular, it is favorably used as a substrate of a magnetic head suspension for use in an HDD having higher-density, narrow-pitched signal conductors.

The present invention is not limited to the above-described embodiment. The aforementioned embodiment is to be considered in all respects as illustrative and not restrictive, and all changes which come within the meaning and range of equivalency of the appended claims are therefore intended to be embraced in the scope of the invention.

EXAMPLE

Figure 25:
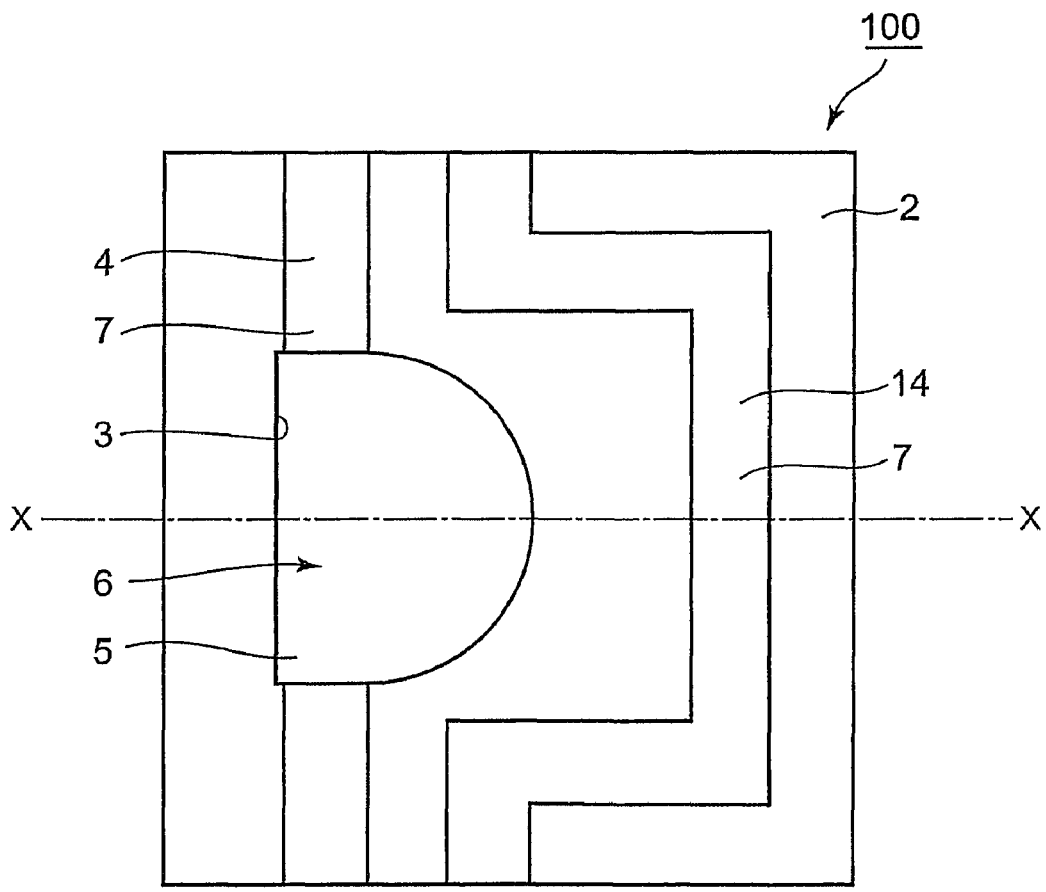
FIG. 25 is a plane view of a substrate for suspension produced in Example.
Figure 26:
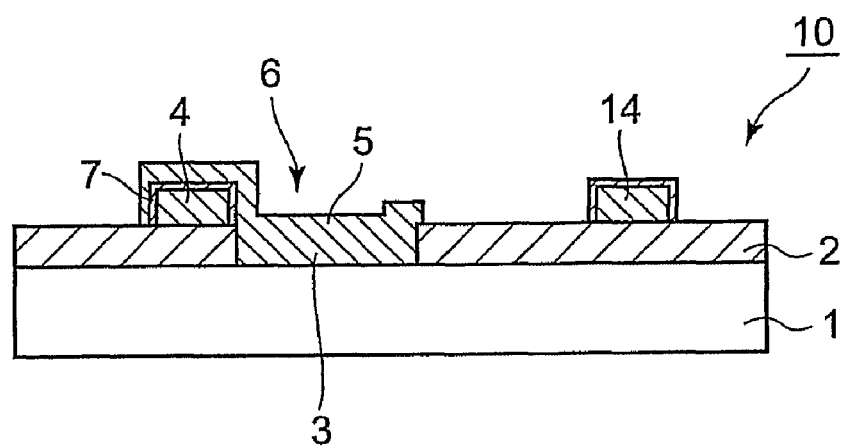
FIG. 26 is a cross-sectional view of the substrate for suspension produced in Example.

The present invention will now be described more specifically by way of Example. FIG. 25 is a plane view of a substrate for suspension made in Example. FIG. 26 is a cross-sectional view of the substrate for suspension, taken along line X-X in FIG. 25.

Example

A laminate of SUS 304 with a thickness of 20 μm (metallic substrate), a polyimide layer with a thickness of 10 μm (insulating-layer-forming layer), and a 9-μm thick electrolytic copper layer (conductor-forming layer), the layers being laminated in the order named, was prepared and was then subjected to chemical etching, etc., as will be described below, in accordance with the method of producing a substrate for suspension as shown in FIGS. 18 and 19. In this manner, there was obtained a substrate for suspension that had a means of grounding composed of a grounding conductor and a grounding terminal, formed between signal conductors, occupying an area smaller than ever.

First, a grounding conductor and signal conductors were formed by chemically etching the conductor-forming Cu layer in the laminate so that the line width of the conductors was 25 μm, that the distance between the conductors in the area in which a grounding terminal would not be formed was 25 μm, and that the distance between the conductors in the area in which a grounding terminal would be formed was 100 μm.

Next, patterning of the 10-μm thick polyimide layer was conducted by chemical etching using a photosensitive resist, thereby forming an insulating layer 2 having, beside the grounding conductor 4, a semicircular opening for grounding terminal 3 with a radius of 50 μm so made that the metallic substrate was exposed, as shown in FIG. 25.

Thereafter, by electroplating, nickel (Ni) was deposited on the surfaces of the grounding conductor 4 and of the signal conductors 14 to a thickness of about 0.2 μm, and gold (Au) was then deposited on the nickel deposit to a thickness of about 1.5 μm, whereby a protective deposit was formed.

The opening for grounding terminal 3 was then filled with nickel (Ni) by electroplating using the metallic substrate 1 as a feeder, thereby forming a grounding-terminal-forming material layer 5. The process of nickel plating started from the electrodeposition of nickel on a portion of the metallic substrate surface exposed in the opening for grounding terminal, and ended when the deposit connected to the grounding conductor 4. The thickness of the nickel deposit on the upper surface of the grounding conductor 4 was 5 μm, and that of the nickel deposit in the opening for grounding terminal, on the metallic substrate exposed, was about 16 μm. Depending on the shape of the grounding-terminal-forming material layer 5, electroplating is conducted after patterning the layer as desired, using a resist.

A photosensitive cover lay was further formed on the conductors for protection thereof and was then subjected to exposure and development to form a cover lay in the desired shape. In this manner, there was obtained a substrate for suspension.

The resistivity of the above-obtained substrate for suspension, determined at the grounding terminal, was 0.2Ω. The grounding terminal on the substrate for suspension obtained was thus confirmed to be comparable in properties to a grounding terminal constituting the means of grounding of a conventional substrate for suspension.

Further, in the conventional substrate for suspension as shown in FIGS. 23 and 24, the diameter of the opening for grounding terminal is usually about 100 μm, and the line width of the grounding conductor surrounding the opening for grounding terminal is about 85 μm, so that the width of the whole means of grounding composed of the grounding terminal and the grounding conductor is about 270 μm. On the other hand, the width of the whole means of grounding as shown in FIGS. 25 and 26, composed of the grounding terminal and the grounding conductor surrounding the opening for grounding terminal, made in this Example, is 75 μm. This demonstrates that the present invention can provide a substrate for suspension smaller than ever.

Second Embodiment

A substrate for suspension according to the second embodiment of the present invention will be described hereinafter in detail.

A substrate for suspension of the present invention comprises a metallic substrate, an insulating layer formed on the metallic substrate, having an opening for grounding terminal so made that the metallic substrate is exposed, a grounding conductor formed on the insulating layer, including an opening area that surrounds the opening for grounding terminal and that has an opening situated above the opening for grounding terminal, and a grounding terminal made of a grounding-terminal-forming material placed in the opening for grounding terminal, being connected to the metallic substrate and to the grounding conductor, and in the substrate for suspension, the opening area includes no platform and is entirely covered with the grounding-terminal-forming material. The substrate for suspension in this embodiment has two forms, a form (first form) in which the surface of the grounding conductor is directly coated with a protective deposit, and a form (second form) in which the surface of the grounding conductor is covered directly with the grounding-terminal-forming material. Each form of the substrate for suspension of the present invention will be described below.

1. First Form

The first form of the substrate for suspension of the present invention will be first described. A substrate for suspension in this form is that the surface of the grounding conductor in the above-described substrate for suspension is covered directly with a protective deposit.

Figure 27:
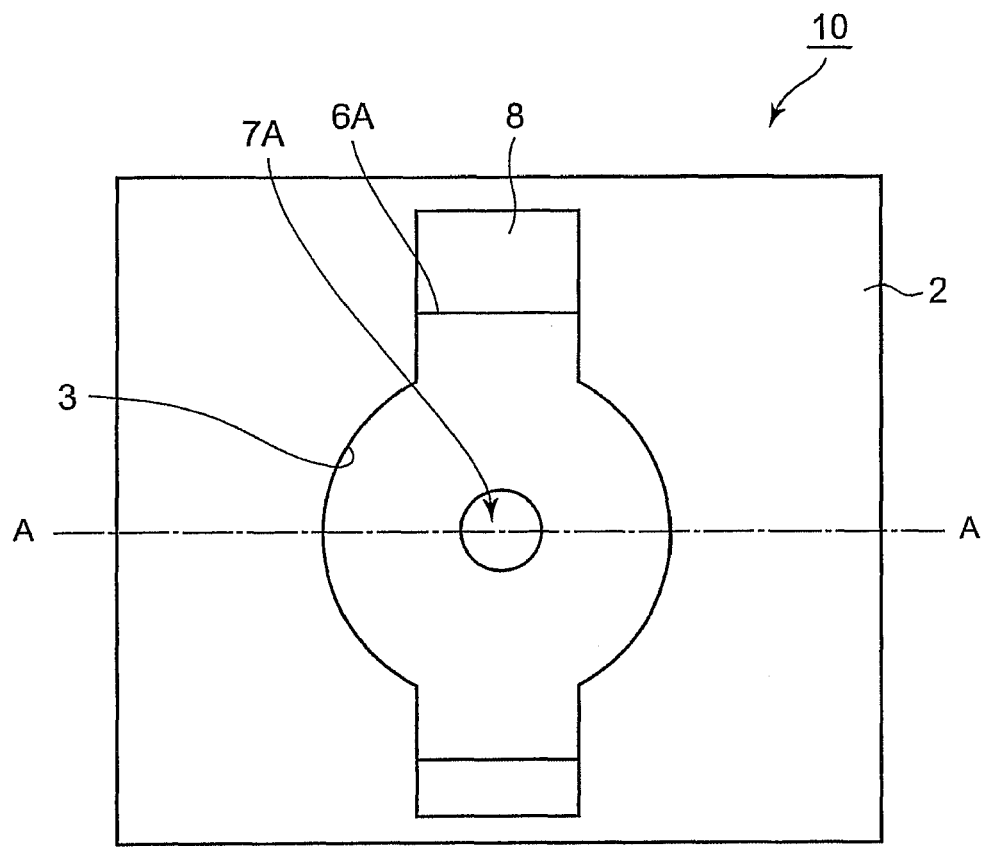
FIG. 27 is a diagrammatic plane view showing a substrate for suspension in the first form according to the second embodiment of the present invention.
Figure 28:
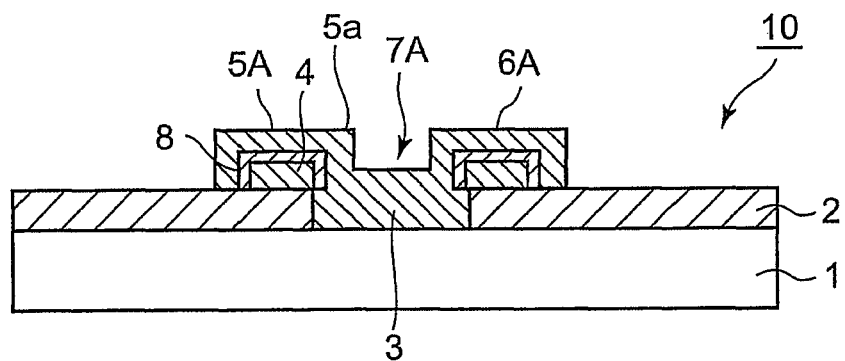
FIG. 28 is a diagrammatic cross-sectional view showing the substrate for suspension in the first form of the present invention.

The substrate for suspension in this form will be described with reference to the accompanying drawings. FIG. 27 is a plane view showing an example of the substrate for suspension in this form, and FIG. 28 is a cross-sectional view of the substrate for suspension, taken along line A-A in FIG. 27. As illustrated in FIGS. 27 and 28, the substrate for suspension 10 in this form comprises a metallic substrate 1, an insulating layer 2 formed on the metallic substrate 1, having an opening for grounding terminal 3 so that the metallic substrate 1 is exposed, a grounding conductor 4 formed on the insulating layer 2, including an opening area (opening forming area) 5A that surrounds the opening for grounding terminal 3 and that has an opening 5a situated above the opening for grounding terminal 3, and a grounding terminal 7A formed by filling the opening for grounding terminal 3 with a grounding-terminal-forming material 6A, being connected to the metallic substrate 1 and to the grounding conductor 4.

The upper surface of the opening area (opening forming area) 5A is entirely covered with the grounding-terminal-forming material 6A and does not have a platform that is a portion not covered with the grounding-terminal-forming material 6A. Further, the entire surface of the grounding conductor 4 including the opening area 5A is covered directly by a protective deposit 8.

Figure 41:
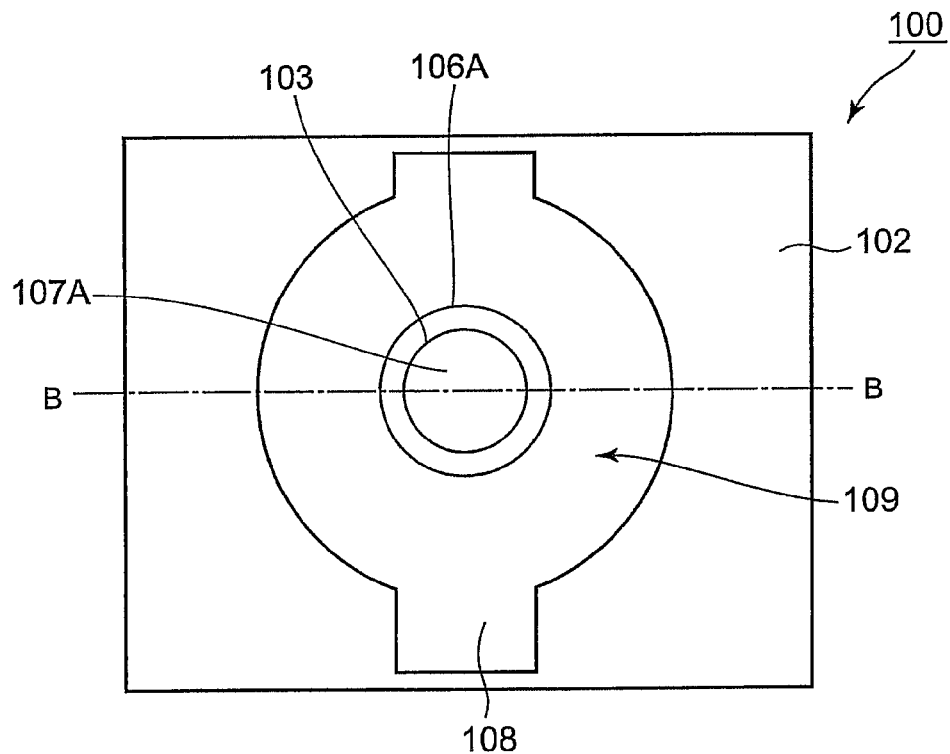
FIG. 41 is a diagrammatic plane view showing a conventional substrate for suspension.
Figure 42:
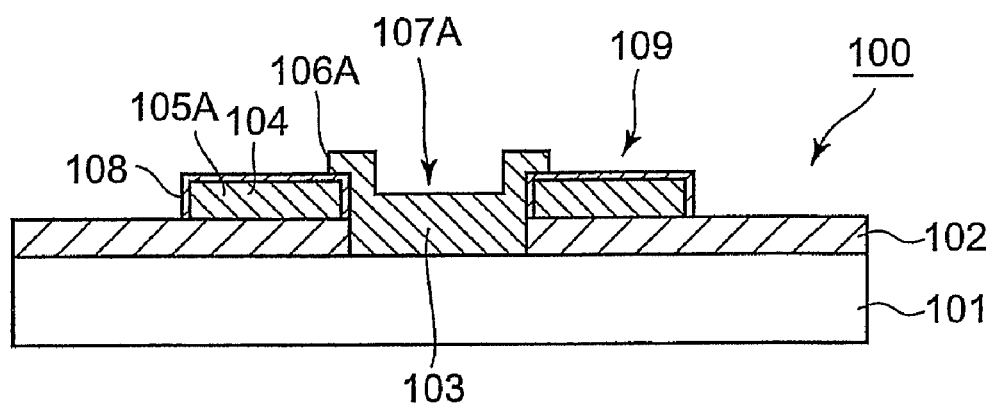
FIG. 42 is a diagrammatic cross-sectional view showing the conventional substrate for suspension.

As illustrated in a plane view in FIG. 41 and in a cross-sectional view in FIG. 42, taken along line B-B in FIG. 41, a conventional substrate for suspension 100 comprises a metallic substrate 101, an insulating layer 102 formed on the metallic substrate 101, having an opening for grounding terminal 103, a grounding conductor 104 including an opening area 105A that surrounds the opening for grounding terminal 103, a protective deposit 108 covering directly the surface of the grounding conductor 104, a grounding-terminal-forming material 106A so placed in the opening for grounding terminal 103 that it connects to the metallic substrate 101 and to the grounding conductor 104, and a grounding terminal 107A formed by filling the opening for grounding terminal 103 with the grounding-terminal-forming material 106A. The opening area 105A included in the grounding conductor 104 has, on its upper surface, a platform 109 that is a portion not covered by the grounding-terminal-forming material 106A. Thus, the conventional substrate for suspension is so made that a platform not covered by the grounding terminal exists in the opening area included in the grounding conductor, so that the grounding conductor occupies a large area. There has therefore been the problem that it is not easy to use the conventional substrate for suspension in a magnetic head because there has been a demand for substrates for suspensions that occupy only very small areas since magnetic heads have become smaller in size with the recent increase in the density of signal conductors in HDDs. Further, if the opening area including such a platform is made smaller, the area to which the grounding-terminal-forming material must be applied becomes smaller. Therefore, formation of the grounding terminal has demanded high positional accuracy, and it has thus been difficult to form the grounding terminal.

On the other hand, according to this form, since the opening area included in the grounding conductor is covered with the grounding-terminal-forming material across the width (covered entirely with the grounding-terminal-forming material), application of the grounding-terminal-forming material does not demand high positional accuracy even if the opening area is made smaller. It is therefore easy to make the opening area smaller, and even when higher-density, narrow-pitched signal conductors have been formed on the substrate for suspension, the grounding conductor including the opening area can be formed easily.

Further, since the opening area is covered with the grounding-terminal-forming material across the width, high connection stability can be obtained.

Furthermore, the substrate for suspension has the grounding terminal made by filling the opening for grounding terminal with the grounding-terminal-forming material, being connected to the metallic substrate and to the grounding conductor. Therefore, by connecting the grounding conductor to e.g., a slider, it is possible to prevent satisfactorily electrostatic destruction of the slider. Moreover, when the grounding conductor is placed in the vicinity of signal conductors formed on the substrate for suspension, the occurrence of noises on the substrate for suspension can be fully suppressed, and signals transmitted by the signal conductors can be stabilized.

In addition, since a protective deposit is formed on the grounding conductor, the grounding conductor is resistant to corrosion.

The substrate for suspension in this form has the metallic substrate, the insulating layer, the grounding conductor, the grounding terminal, and the protective deposit. These components of the substrate for suspension in this form will be described hereinafter.

(1) Grounding Terminal 7A

The grounding terminal for use in this form is made by filling the opening for grounding terminal with the grounding-terminal-forming material, and connects to the metallic substrate and the grounding conductor that will be described later.

The expression "the grounding terminal connects to the metallic substrate and the grounding conductor" does not mean that the grounding terminal is in direct contact with the metallic substrate and with the grounding conductor, but that the grounding terminal can electrically connect the metallic substrate and the grounding conductor to produce continuity. Therefore, the above expression encompasses a case where the grounding terminal connects to the metallic substrate and to the grounding conductor via other layer made from an electrically conductive material.

(a) Opening for Grounding Terminal 3

The opening for grounding terminal, in which the grounding terminal for use in this form will be formed, is so made in the insulating layer (that will be described later) that the metallic substrate is exposed, and its circumference is surrounded by the grounding conductor that will be described later.

The opening for grounding terminal for use in this form may be in any shape in a plane view, as long as a grounding-terminal-forming material can be placed in the opening to form the grounding terminal. Examples of shapes useful herein include half circles, circles, ovals, polygons such as squares and pentagons, combs, crosses, and rods, and a circular opening for grounding terminal is usually used.

In this form, when the opening for grounding terminal is circular, the diameter of the circle is preferably from 30 to 300 µm, more preferably from 30 to 200 µm, most preferably from 50 to 100 µm. This is because it is not easy to make a circular opening for grounding terminal with a diameter of more than or less than the above range, on a substrate for suspension having higher-density, narrow-pitched signal conductors.

Figure 29:
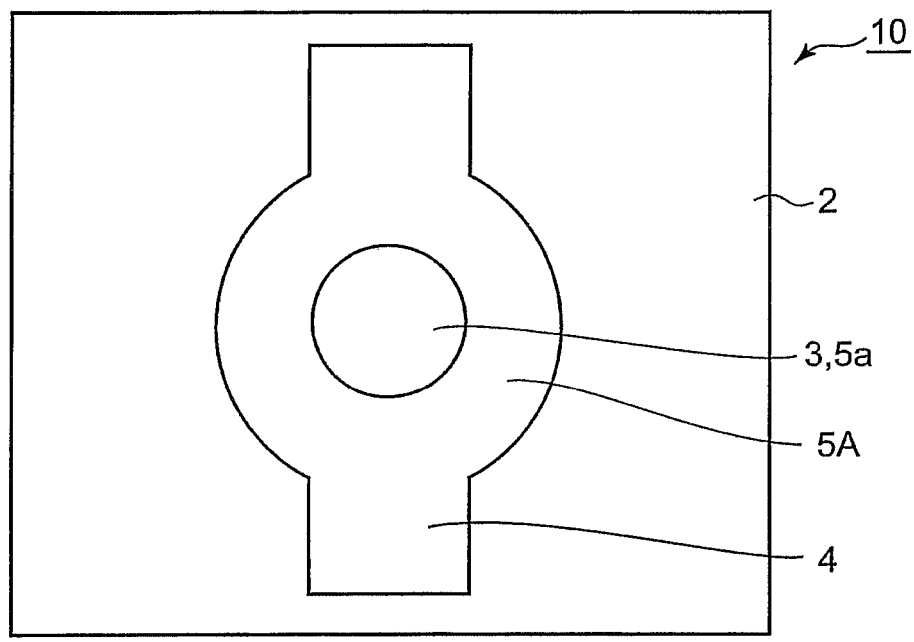
FIG. 29 is a view illustrating a grounding terminal for use in the present invention.

The opening for grounding terminal in this form can be made in any position in the opening area included in the grounding conductor that will be described later, as long as the opening area surrounds the entire circumference of the opening for grounding terminal. For example, the opening for grounding terminal may be so made that the distance between its outer periphery and the outer periphery of the opening area is constant, as shown in FIG. 29. The opening for grounding terminal may also be so made that the distance between its outer periphery and the outer periphery of the opening area is not constant, as shown in FIG. 30 or 31.

In this form, it is particularly preferred that the opening area of the grounding conductor be in such a shape that its outer diameter is greater in the vicinity of the opening for grounding terminal. This is because, in this case, an opening for grounding terminal surrounded by the opening area can be made easily.

Further, in this form, it is preferred that the distance between the outer periphery of the opening for grounding terminal and that of the opening area be constant. This is because, when the distance is constant, an opening for grounding terminal surrounded by the opening area can be made more easily.

Figure 30:
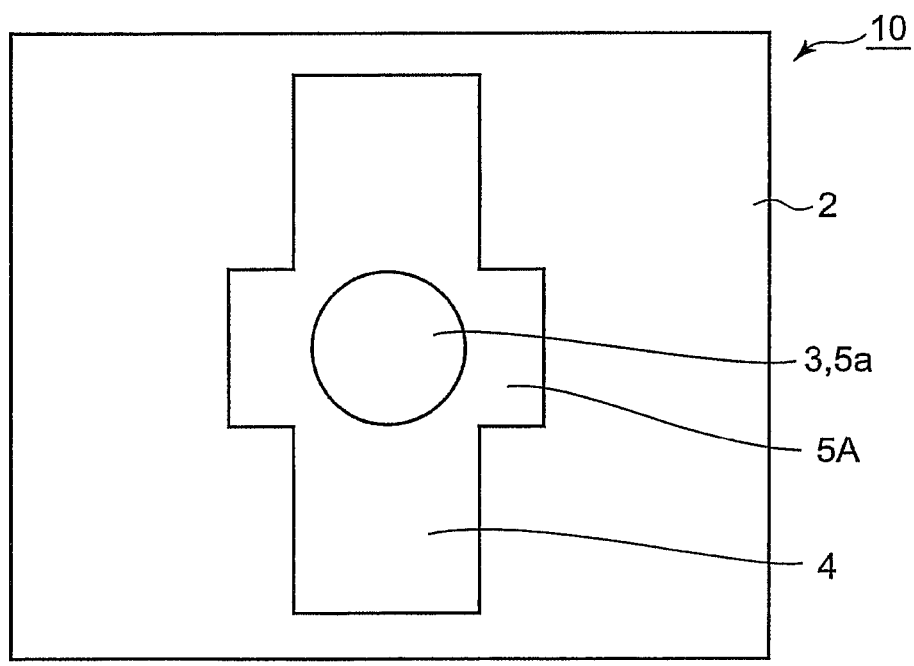
FIG. 30 is a view illustrating a grounding terminal for use in the present invention.
Figure 31:
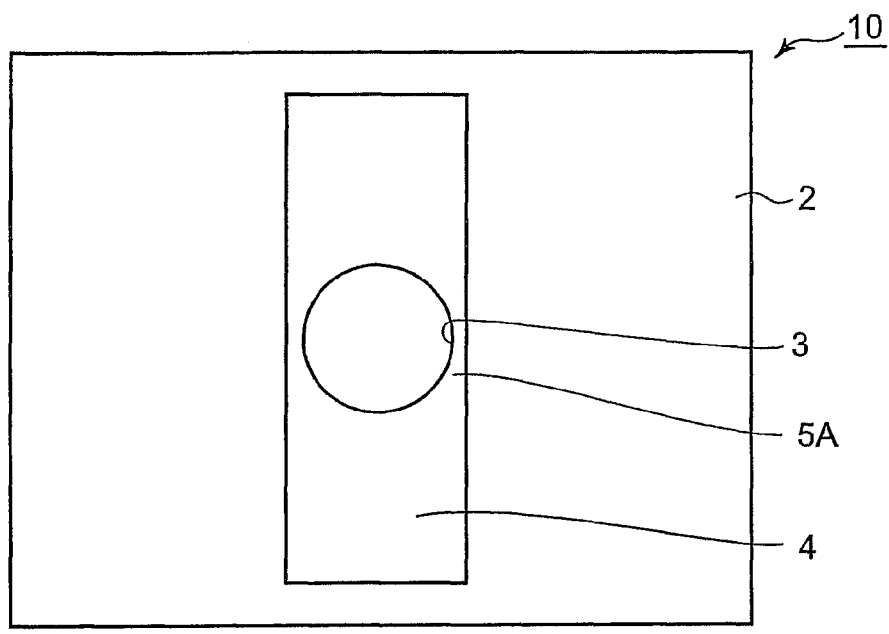
FIG. 31 is a view illustrating a grounding terminal for use in the present invention.

For convenience of explanation of the grounding conductor, the grounding-terminal-forming material and the protective deposit, components of the substrate for suspension in this form, are not depicted in FIGS. 29 to 31.

(b) Grounding-Terminal-Forming Material 6A

The grounding-terminal-forming material for use in this form is placed in the opening for grounding terminal so that it connects to the grounding conductor and to the metallic substrate. The grounding-terminal-forming material is further applied so that it covers, across the width, the opening area of the grounding conductor.

The expression "the grounding-terminal-forming material covers the opening area across the width" means that the material entirely covers at least the upper surface of the opening area that surrounds the circumference of the opening for grounding terminal.

Any material can be used in this form as the grounding-terminal-forming material, as long as it is an electrically conductive material having excellent conductivity and can be placed in the opening for grounding terminal. It is however preferred that the grounding-terminal-forming material have excellent adhesion to the metallic substrate and to the grounding conductor. Examples of such materials include metals and electrically conductive resins. Of these, metals are preferably used in the present invention. Specifically, it is possible to use silver (Ag), gold (Au), copper (Cu), nickel (Ni), and so forth.

Of these, silver (Ag) and nickel (Ni) are preferred, and nickel (Ni) is most preferred because it has high conductivity and is inexpensive.

These materials can be identified by XPS (X-ray Photoelectron Spectroscopy).

Examples of electrically conductive resins useful herein include resins that exhibit conductivity by themselves, and mixtures of resins and metals.

A variety of methods, such as electroplating, electroless plating, and soldering, can be used to fill up the opening for grounding terminal with the grounding-terminal-forming material when the material is metal. Of these, electroplating is preferred because, with this method, a grounding terminal having low resistivity can be obtained, and, moreover, a more minute grounding terminal can be made.

In the case where the grounding-terminal-forming material is an electrically conductive resin, it can be applied with a dispenser or by printing to form the grounding terminal.

Figure 32:
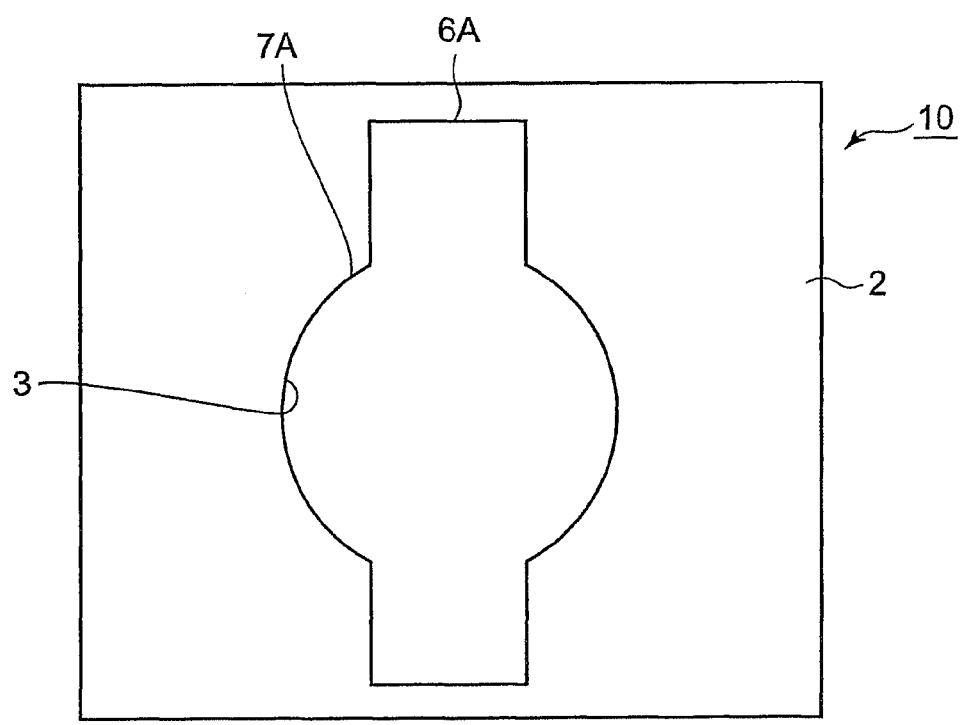
FIG. 32 is a view illustrating a grounding terminal for use in the present invention.

The grounding-terminal-forming material can be applied to any portion of the surface of the grounding conductor, as long as the opening for grounding terminal is filled up with the material and the material connects to the grounding conductor and to the metallic substrate, and at least the opening area included in the grounding conductor that will be described later is covered with the material across the width. For example, the grounding-terminal-forming material may be applied so that, in a plane view, it covers the entire surface of the opening area, as well as a portion of the grounding conductor surface, in the vicinity of the opening for grounding terminal 3, as shown in FIG. 27 whose explanation has been given already. The grounding-terminal-forming material may also be applied so that it covers the entire surface of the grounding conductor including the opening area, as illustrated in FIG. 32.

The grounding-terminal-forming material placed in the opening for grounding terminal can have any thickness, as long as it can stably connect to the metallic substrate and the grounding conductor that will be described later, and, moreover, can stably cover the opening area included in the grounding conductor. The thickness of the grounding-terminal-forming material applied is preferably from 100 nm to 50 µm, more preferably from 1 µm to 20 µm, although it depends on the thickness of the insulating layer that will be described later. A grounding-terminal-forming material layer with a thickness in the above range can stably connect to the metallic substrate and to the grounding conductor, and can stably cover the opening area across the width.

The thickness of the grounding-terminal-forming material placed in the opening for grounding terminal herein refers to the shortest vertical distance between the surface of the metallic substrate and that of the grounding-terminal-forming material.

The grounding-terminal-forming material for use in this form, applied to the upper surface of the opening area, can have any thickness as long as it can cover the opening area across the width. The thickness of the grounding-terminal-forming material layer is preferably between 5 µm and 40 µm, more preferably between 15 µm and 35 µm. This is because a grounding-terminal-forming material layer formed on the opening area, having a thickness in the above range, can stably cover the opening area across the width with ease, and, moreover, can make the substrate for suspension free from such a trouble as contact with those components, such as a slider, that are mounted on the substrate.

(c) Grounding Terminal 7A

The grounding terminal for use in this form is made by filling the opening for grounding terminal with the grounding-terminal-forming material and connects to the metallic substrate and the grounding conductor that will be described later.

The grounding terminal can have any resistivity as long as it can achieve prevention of electrostatic destruction and suppression of the occurrence of noises. For example, the resistivity of the grounding terminal is preferably 5Ω or less, more preferably 1Ω or less, most preferably from 0.10 to 0.25 Ω.

(2) Grounding Conductor 4

The grounding conductor for use in this form is formed on the insulating layer that will be described later, and includes the opening area.

(a) Opening area (opening forming area) 5A

The opening area (opening forming area) in this form is a part of the grounding conductor, defined so that it surrounds the circumference of the opening for grounding terminal.

The opening area included in the grounding conductor for use in this form may be in any shape, as long as it surrounds the opening for grounding terminal. For example, the opening area may so exist that the distance between the outer periphery of the opening for grounding terminal and that of the opening area is constant, as shown in FIG. 29 whose explanation has been given already. Alternatively, the opening area may so exist that the distance between the outer periphery of the opening for grounding terminal and that of the opening area is not constant, as shown in FIGS. 30 and 31.

In this form, although all the above-described opening areas are suitable, the preferred opening area is one whose outer diameter is greater in the vicinity of the opening for grounding terminal, and particularly that the distance between the outer periphery of the opening for grounding terminal and that of the opening area is constant. In this case, the opening area can be easily defined so that it surrounds the opening for grounding terminal.

Although the opening area in this form can have any outer diameter, as long as it is greater than the opening for grounding terminal, since it must surround the entire circumference of the opening for grounding terminal. The outer diameter of the opening area is preferably 50 to 400 μm, more preferably 80 to 300 μm, most preferably 100 to 200 μm. This is because an opening area having an outer diameter in the above range occupies only a smaller area, so that the grounding conductor including the opening area can be easily formed even when higher-density, narrow-pitched signal conductors have been formed on the substrate for suspension.

Further, in this form, since the opening area is covered with the grounding-terminal-forming material across the width, application of the material does not demand high positional accuracy, which makes it easy to make the opening area smaller. For this reason, as long as the outer diameter of the opening area is in the above range, the substrate for suspension in this form can more fully exhibit its effects.

Furthermore, an opening area having an outer diameter in the above range can be readily covered with the grounding-terminal-forming material.

The outer diameter of the opening area herein means the greatest width of the opening area.

(b) Grounding Conductor 4

The grounding conductor for use in this form includes the opening area and can further include other areas such as an area to be brought into contact with a slider.

Figure 33:
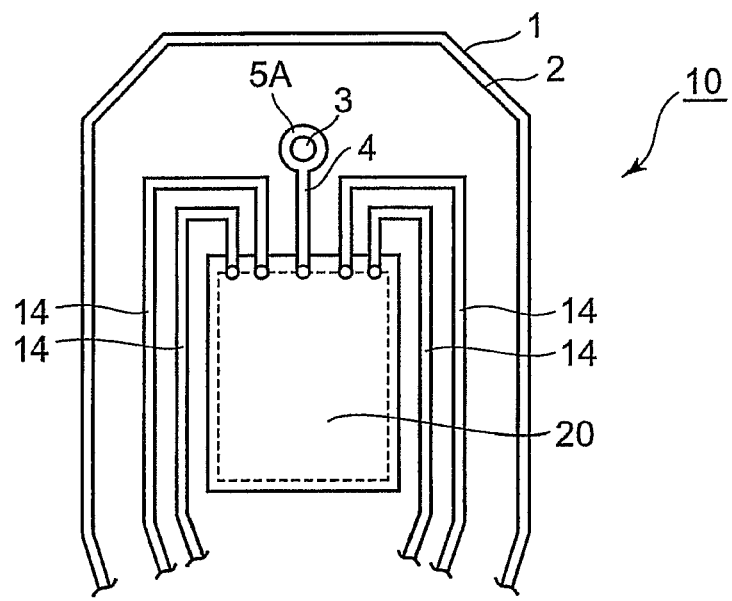
FIG. 33 is a view illustrating a grounding conductor for use in the present invention.

Such a grounding conductor can be formed in any position on the substrate for suspension in this form, as long as it can achieve, as desired, prevention of electrostatic destruction and suppression of the occurrence of noises. The position in which the grounding terminal is formed may be determined according to the use of the substrate for suspension in this form, and so forth. Specifically, as illustrated in FIG. 33, the grounding conductor may be formed in the front part of the substrate for suspension, on which a slider for a magnetic head will be mounted. In FIG. 33, the opening for grounding terminal 3 exists in the front part of the substrate for suspension 10, and in this part are also present the grounding conductor 4 including the opening area 5A and signal conductors 14 for transmitting electrical signals, both conductors being extended to the points at which they can connect to a slider situated in a slider placement position 20.

Figure 34:
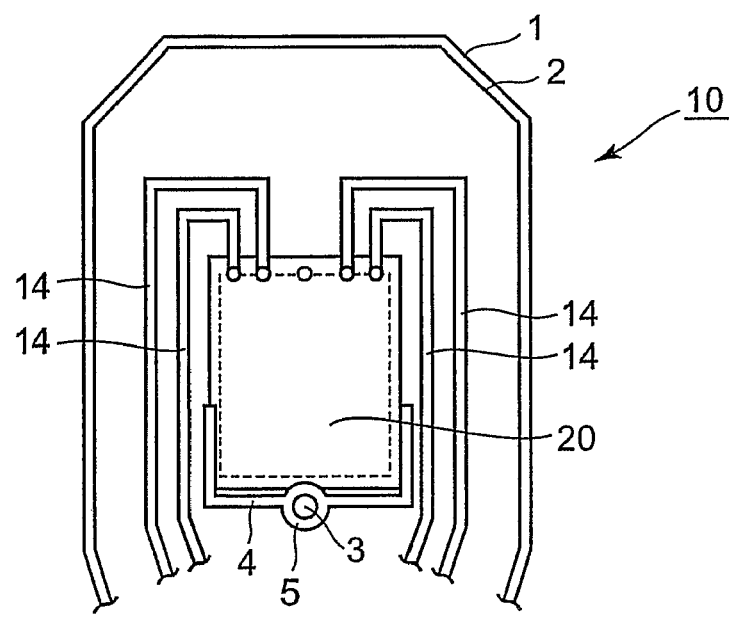
FIG. 34 is a view illustrating a grounding conductor for use in the present invention.

The grounding conductor 4 may also be formed around the slider placement position 20, as illustrated in FIG. 34. This is because, since a substrate for suspension and a slider are usually bonded with an adhesive, the grounding conductor formed around the slider placement position, in which a substrate for suspension and a slider are bonded with an adhesive, can prevent the adhesive from running off.

Figure 35:
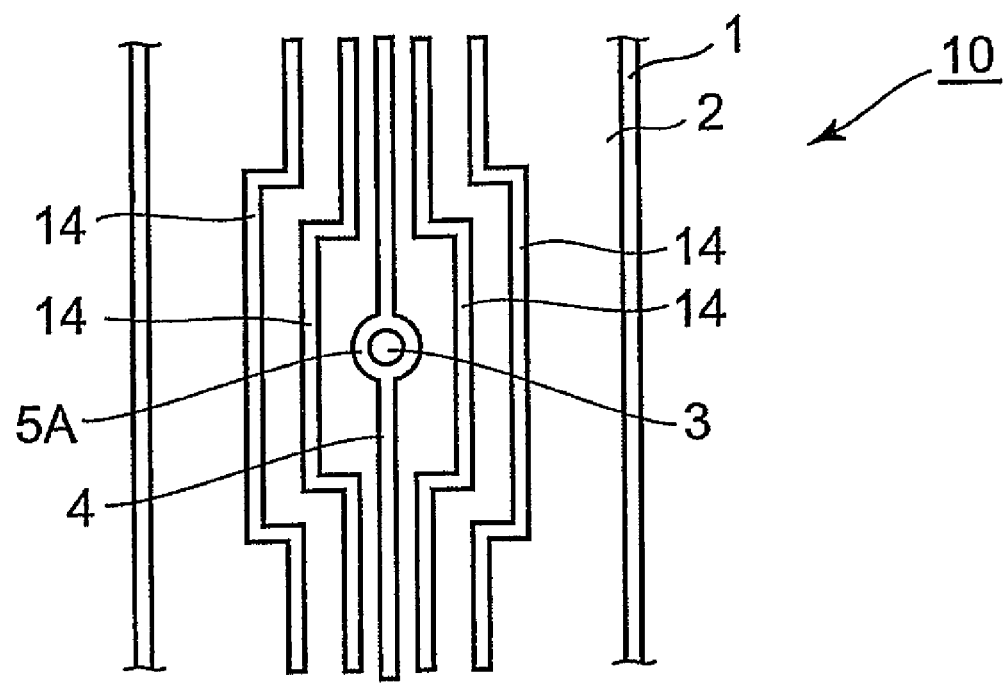
FIG. 35 is a view illustrating a grounding conductor for use in the present invention.

Moreover, the grounding conductor 4 may be formed in a part other than the front part of the substrate for suspension, as illustrated in FIG. 35. In FIG. 35, the grounding conductor 4 is present between two signal conductors 14, 14, and the opening area 5A and the opening for grounding terminal 3 are also present between the signal conductors 14, 14.

For convenience of explanation of the grounding conductor, the grounding-terminal-forming material and the protective deposit, components of the substrate for suspension in this form, are not depicted in FIGS. 33 to 35.

Examples of materials useful for the grounding conductor in this form include copper (Cu).

Although the grounding conductor for use in this form can have any thickness as long as it can exhibit the desired conductivity, its thickness is usually in the range of 6 to 18 μm, preferably in the range of 8 to 12 μm. This is because a grounding conductor with a thickness in the above range can make the substrate for suspension free from such a trouble as contact with those components, such as a slider, that are mounted on the substrate for suspension.

In this form, the line width of the grounding conductor in the part not including the opening area is preferably between 10 μm and 100 μm, more preferably between 15 μm and 50 μm. This is because a grounding conductor with a line width in the above range can be easily formed even when higher-density, narrow-pitched signal conductors have been formed on the substrate for suspension.

(3) Insulating Layer 2

The insulating layer for use in this form is formed on the metallic substrate that will be described later, and has the opening for grounding terminal so made that the metallic substrate is exposed.

Examples of materials useful for the insulating layer include polyimide (PI).

The insulating layer can have any thickness as long as it can exhibit the desired insulating properties, and its thickness is usually about 5 to 30 μm.

(4) Metallic Substrate 1

The metallic substrate for use in this form has electrical conductivity. Moreover, it usually has a moderate degree of springness because it constitutes a substrate to be used for a suspension.

Examples of materials useful for the metallic substrate include SUS.

Preferably, the metallic substrate for use in this form has an electrically conductive layer on the side on which the opening for grounding terminal will be made. This is because when such an electrically conductive layer is present, the grounding terminal can produce continuity more efficiently. Specific examples of materials useful for the electrically conductive layer include copper (Cu). The electrically conductive layer can be formed by a variety of methods including plating.

The metallic substrate can have any thickness as long as it can exhibit the desired degree of springness. The thickness of the metallic substrate is usually in the range of 10 μm to 30 μm, preferably in the range of 15 μm to 25 μm, although it depends on the material for the metallic substrate, and so on.

(5) Protective Deposit 8

The protective deposit for use in this form is formed directly on the surface of the grounding conductor. Copper (Cu) is usually used to form the grounding conductor, so that the grounding conductor is corrosive. By forming on the surface of the grounding conductor a protective deposit of a metal other than copper, it is possible to make the grounding conductor resistant to corrosion.

In this form, a protective deposit so formed that it entirely covers at least a portion of the grounding conductor surface, not protected from corrosion without being coated with e.g., a cover lay that will be described later, is enough to make the grounding conductor resistant to corrosion. Therefore, the protective deposit may be formed so that it covers the entire surface of the grounding conductor, or that it covers only the exposed portion of the grounding conductor surface, not coated with a cover lay or the like.

In this form, nickel (Ni) or gold (Au) can be used to form the protective deposit, and gold (Au) is particularly preferred. This is because, since gold is excellent in resistance to corrosion, a deposit of gold can make the grounding conductor highly resistant to corrosion.

It is preferred that the thickness of the protective deposit for use in this form be 5 μm or less, particularly between 1 μm and 2 μm. This is because a protective deposit with a thickness in the above range can be stably formed on the surface of the grounding conductor.

To cut production costs, the protective deposit in this form is usually formed in the following manner. Signal conductors for transmitting electrical signals and the grounding conductor that are connected by a connecting line are formed on the insulating layer; and using the signal conductors and the grounding conductor as feeder layers, a protective deposit is then formed on the surfaces of the signal conductors and that of the grounding conductor. The protective deposit may also be formed by electroless plating without forming a connecting line for connecting the grounding conductor and the signal conductors.

(6) Substrate for Suspension 10

The substrate for suspension in this form can have a cover lay (CL) on the insulating layer, if necessary. The cover lay can have any thickness, and its thickness is usually about 5 to 30 μm. Any material can be used to form the cover lay, and the same materials as those used to form cover lays on ordinary flexible substrates, etc. can be used herein.

The substrate for suspension in this form further has signal conductors for transmitting electrical signals, in addition to the above-described grounding conductor. The signal conductors usually include conductors for writing and those for reading. Although the signal conductors may be made from a material either the same as or different from the material for the grounding conductor, they are usually formed from the same material (the signal conductors and the grounding conductor are made from one conductor-forming layer). This is because the use of the same material can achieve reduction in costs.

The smallest of the pitches with which the signal conductors are formed in this form is preferably from 60 μm to 200 μm, more preferably from 60 μm to 100 μm. This is because the substrate for suspension in this form can more fully show its effects when the minimum pitch is in the above range.

Figure 36:
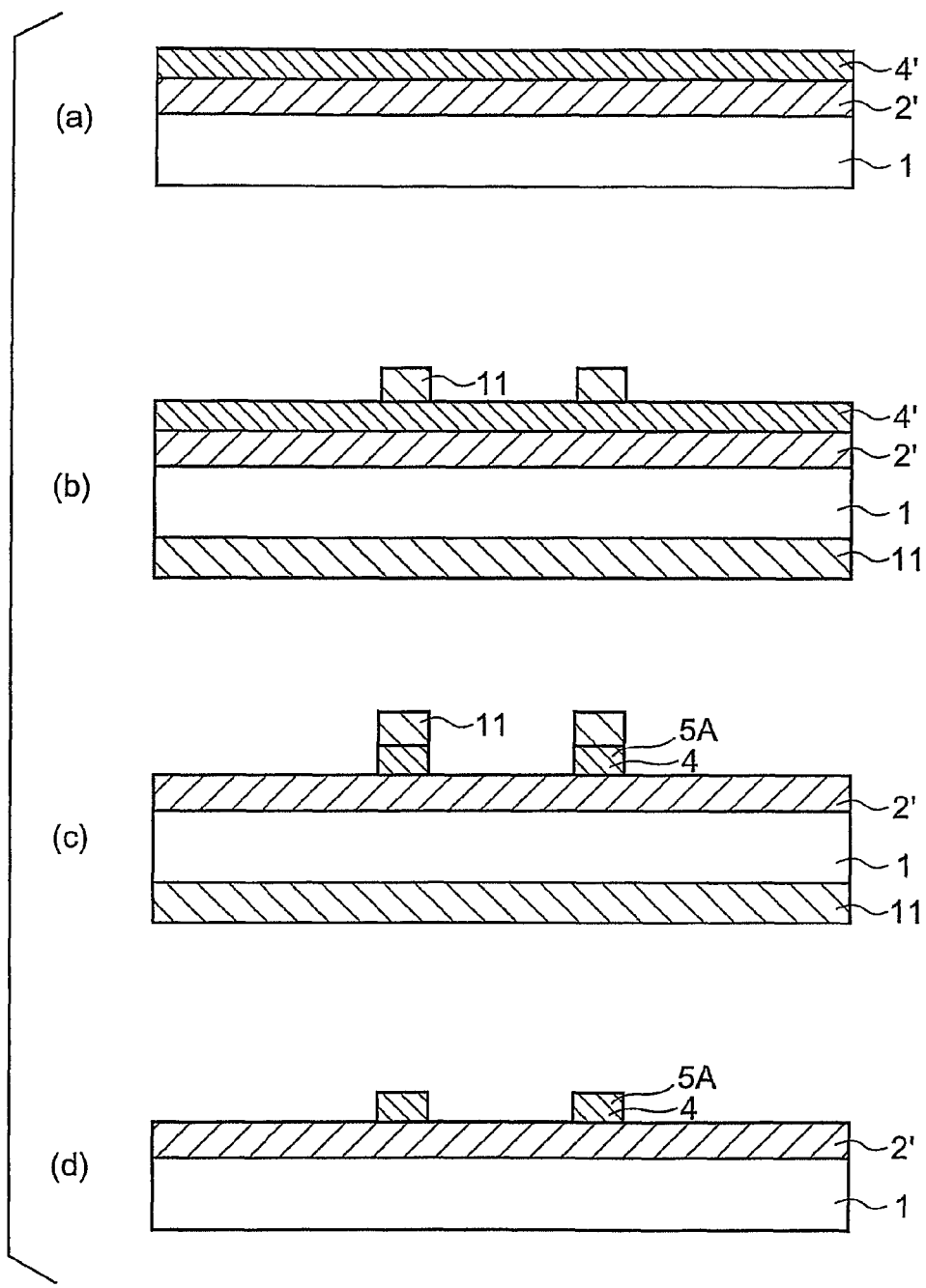
FIG. 36 is a flow chart showing a process of producing a substrate for suspension in the first form of the present invention.

Any method can be employed to produce a substrate for suspension in this form, as long as the components of the substrate for suspension can be accurately placed in the desired positions. For example, the following method can be used to produce a substrate for suspension 10 in this form. A laminate of a metallic substrate 1, an insulating-layer-forming layer 2' of a material for an insulating layer, and a grounding-conductor-forming layer 4' of a material for a grounding conductor is first made as shown in FIG. 36(*a*). Thereafter, a photoresist 11 in the form of a dry film or the like is formed on each side of the laminate and is patterned as desired (FIG. 36(*b*)). Patterning of the grounding-conductor-forming layer 4' is then conducted by etching (FIG. 36(*c*)), and the photoresist 11 is stripped, thereby forming a grounding conductor 4 including an opening area 5 (FIG. 36 (*d*)). In this step, signal conductors are simultaneously formed, if necessary.

Figure 37:
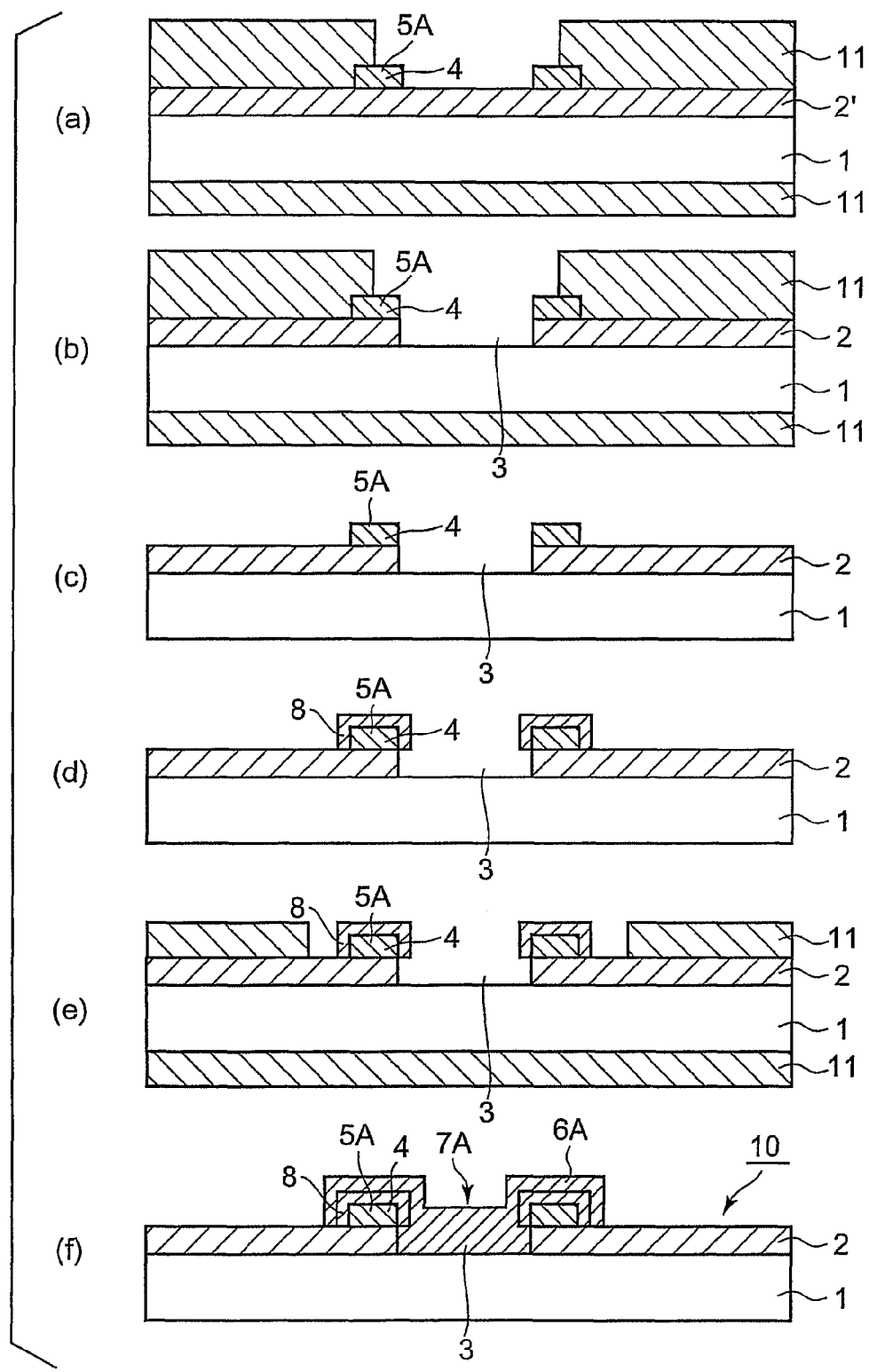
FIG. 37 is a flow chart showing a process of producing a substrate for suspension in the first form of the present invention.

Subsequently, a photoresist 11 in the form of a dry film or the like is formed and is patterned as desired, as shown in FIG. 37(*a*). The insulating-layer-forming layer 2' is then subjected to patterning by etching (FIG. 37(*b*)), and the photoresist 11 is stripped, thereby forming an insulating layer 2 having an opening for grounding terminal 3 (FIG. 37(*c*)).

Using the grounding conductor 4 as a feeder layer, a protective deposit 8 is formed on the surface of the grounding conductor 4 (FIG. 37(*d*)).

Thereafter, a photoresist 11 in the form of a dry film or the like is formed on each side of the laminate and is patterned as desired (FIG. 37(*e*)). Using the metallic substrate 1 as a feeder layer, the opening for grounding terminal 3 is filled with a metal serving as the grounding-terminal-forming material 6A by electroplating to form a grounding terminal 7A that connects the metallic substrate 1 and the grounding conductor 4. The photoresist 11 is then stripped, thereby obtaining a substrate for suspension 10 (FIG. 37(*f*)).

FIGS. 36(*a*)-(*d*) show the process of grounding conductor formation, and FIGS. 37(*a*)-(*c*), the process of insulating layer formation. FIG. 37(*d*) shows the process of protective deposit formation, and FIGS. 37(*e*)-(*f*), the process of grounding terminal formation.

The substrate for suspension in this form is used for a magnetic head suspension in a hard disc drive (HDD). In particular, it is favorably used for a magnetic head suspension for use in an HDD having higher-density, narrow-pitched signal conductors.

2. Second Form

Next, the second form of the substrate for suspension according to the present invention will be described. A substrate for suspension in the second form is equivalent to the above-described substrate for suspension in which the surface of the grounding conductor is covered directly with the material for the grounding terminal.

Figure 38:
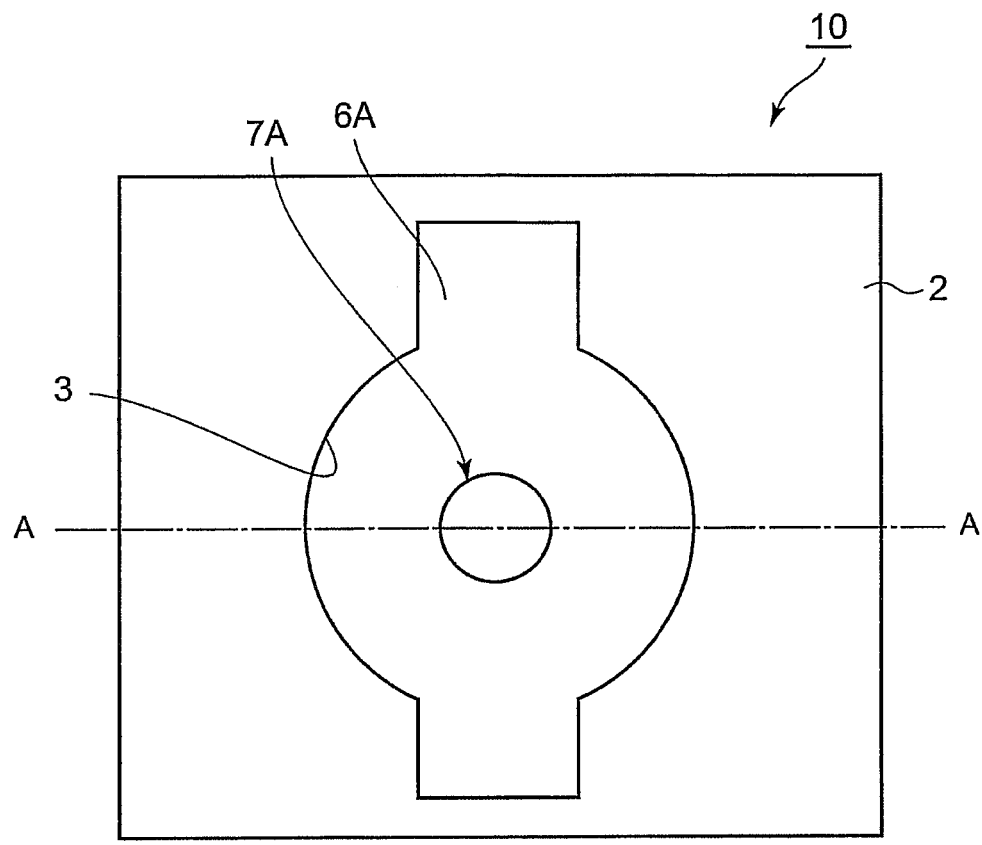
FIG. 38 is a diagrammatic plane view showing a substrate for suspension in the second form according to the second embodiment of the present invention.
Figure 39:
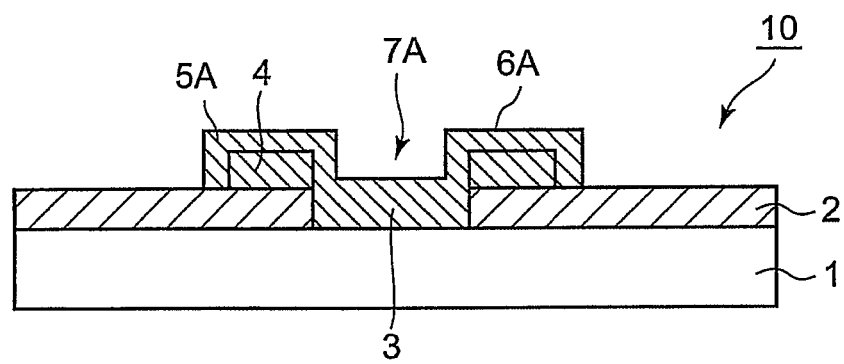
FIG. 39 is a diagrammatic cross-sectional view showing the substrate for suspension in the second form of the present invention.

A substrate for suspension in the second form will be described with reference to the accompanying drawings. FIG. 38 is a plane view of a substrate for suspension in this form, and FIG. 39 is a cross-sectional view of the substrate for suspension, taken along line A-A in FIG. 38. The substrate for suspension 10 comprises a metallic substrate 1, an insulating layer 2 formed on the metallic substrate 1, having an opening for grounding terminal 3 so made that the metallic substrate 1 is exposed, a grounding conductor 4 formed on the insulating layer 2, including an opening area 5A that has an opening 5a situated above the opening for grounding terminal 3 and that surrounds the opening for grounding terminal 3, and a grounding terminal 7A formed by filling the opening for grounding terminal 3 with a grounding-terminal-forming material 6A, being connected to the metallic substrate 1 and to the grounding conductor 4, as illustrated in FIGS. 38 and 39.

The surface of the opening area 5A is entirely covered with the grounding-terminal-forming material 6A and does not include a platform, a portion not covered with the grounding-terminal-forming material 6A. Further, the entire surface of the grounding conductor 4 is covered directly with the grounding-terminal-forming material 6A for the grounding terminal 7A.

According to this form, since the area the grounding conductor occupies can be made smaller, it is easy to form the grounding conductor even when higher-density, narrow-pitched signal conductors have been formed on the substrate for suspension, and prevention of electrostatic destruction and suppression of the occurrence of noises can be fully achieved.

Figure 40:
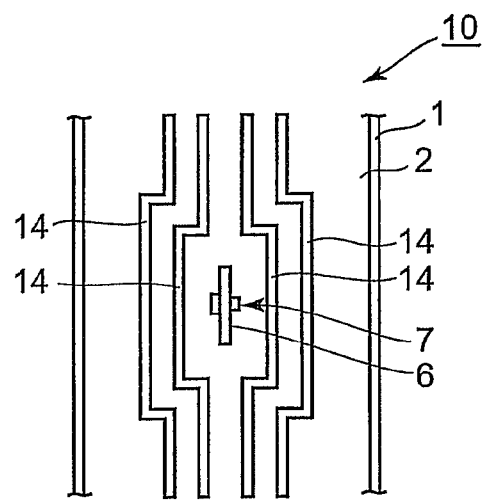
FIG. 40 is a view illustrating the second form of the substrate for suspension of the present invention.

Since the surface of the grounding conductor is covered directly with the material for forming the grounding terminal, the grounding conductor can be protected from corrosion even when it has no protective deposit on its surface. Therefore, connection between the grounding conductor and the signal conductors, as described under the item "(5) Protective Deposit" in the above "1. First Form", need not be taken into account. This makes it possible to form the grounding conductor and the signal conductors separately, and can make the degree of freedom in designing the layout of these conductors on the substrate for suspension higher. It is therefore easy to produce, for example, a substrate for suspension, comprising a metallic substrate 1, an insulating layer 2 formed on the metallic substrate 1, and signal conductors 14 for transmitting electrical signals, etc., formed on the insulating layer 2, in which a grounding terminal 7A and a grounding conductor covered with a grounding-terminal-forming material 6A, both being independent and not electrically connected to the signal conductors 14, are present between the signal conductors 14, 14, as illustrated in FIG. 40.

Furthermore, there is no need, in this form, to form a line for connecting the signal conductors and the grounding conductor, so that the formation of a bridge is unnecessary. The bridge herein means a place, on the substrate for suspension in this form, in which a line for connecting the signal conductors and the grounding conductor is formed. Since a conventional substrate for suspension is relatively large and the layout of conductors on it can be designed with a high degree of freedom, it has been possible to form a grounding conductor extended to a point apart from the position in which the grounding conductor must be formed and to form a bridge for the extended grounding conductor. However, in a substrate for suspension on which higher-density, narrow-pitched signal conductors have been formed, it is often difficult to form a grounding conductor extended to a point apart from the position in which the grounding conductor must be formed, and in this case, it is necessary to form a bridge around the position in which the grounding conductor must be formed. When such a bridge is formed in the front part of the substrate for suspension, on which a slider for reading out the data from a disk and writing the data on a disk is mounted, the substrate for suspension is not easy to control the degree of springness, etc., and may be difficult to read out the data from a disk and write the data on a disk with a slider while stably floating on the desk in a hard disk drive. On the other hand, there is no need, in this form, to form the above-described connecting line, and this makes the formation of a bridge unnecessary, so that the substrate for suspension in this form can be made easy to control the degree of springness, etc.

The substrate for suspension in this form has at least the metallic substrate, the insulating layer, the grounding conductor, and the grounding terminal. These components of the substrate for suspension in this form will be described hereinafter. The metallic substrate, the insulating layer, and the grounding conductor in the substrate for suspension in this form are the same as the ones described in the above "1. First Form", so that explanations of them will not be repeated in the following description.

(1) Grounding Terminal 7A

The grounding terminal for use in this form is formed by filling the opening for grounding terminal with the grounding-terminal-forming material and connects to the grounding conductor and to the metallic substrate.

The details of the opening for grounding terminal in this form may be the same as those of the one described in the above "1. First Form".

The grounding-terminal-forming material for use in this form is so applied that it directly covers the surface of the grounding conductor. Namely, the grounding conductor having, on its surface, no such a layer as a protective deposit is covered directly with the material for forming the grounding terminal.

The grounding-terminal-forming material applied to cover at least the entire surface of the opening area included in the grounding conductor, and the entire portion of the grounding conductor surface, not protected from corrosion or the like by e.g., a cover lay that will be described later, can fulfill its purpose. Therefore, the grounding-terminal-forming material may be applied so that it covers the entire surface of the grounding conductor, or that it covers the entire upper surface of the opening area and the exposed portion of the grounding conductor, not covered with a cover lay or the like.

Specifically, the position in which the grounding-terminal-forming material is applied, and the sectional form of the grounding-terminal-forming material applied are as illustrated in FIGS. 38 and 39 whose explanations have been given already.

The grounding-terminal-forming material placed in the opening for grounding terminal can have any thickness, as long as it can cover the opening area across the width and entirely cover a portion of the grounding conductor surface, not protected from corrosion or the like. The thickness of the grounding-terminal-forming material applied is preferably between 8 $\mu$m and 50 $\mu$m, more preferably between 15 $\mu$m and 25 $\mu$m, although it varies depending on the thickness of the insulating layer. This is because a grounding-terminal-forming material layer with a thickness in the above range can stably cover the opening area across the width and entirely cover a portion of the grounding conductor surface, not protected from corrosion or the like.

The thickness of the grounding-terminal-forming material in the opening for grounding terminal refers to the shortest distance between the surface of the metallic substrate and that of the grounding-terminal-forming material.

The grounding-terminal-forming material applied to the upper surface of the opening area included in the conductor grounding can have any thickness, as long as it can stably cover the opening area across the width and entirely cover a portion of the grounding conductor surface, not protected from corrosion or the like. It is preferred that this thickness be in the range between 5 $\mu$m and 40 $\mu$m, particularly between 15 $\mu$m and 35 $\mu$m. This is because a grounding-terminal-forming material layer with a thickness in the above range can stably cover the opening area across the width and entirely cover a portion of the grounding conductor surface, not protected from corrosion or the like. Moreover, a grounding-terminalforming material layer with such a thickness can lessen the possibility that the substrate for suspension in this form and those components, such as a slider, that are mounted on the substrate for suspension might come into contact with each other.

The type of the grounding-terminal-forming material for use in this form may be the same as the one described in the above "1. First Form".

The resistivity of the grounding terminal for use in this form may be the same as that described in the above "1. First Form".

(2) Substrate for Suspension 10

The substrate for suspension in this form usually has signal conductors. It can also have a cover lay (CL) on the insulating layer, if necessary. The signal conductors and the cover lay may be the same as those described in the item "(6) Substrate for Suspension" in the above "1. First Form".

A method not comprising the above-described process of protective deposit formation in which a protective deposit is formed on the grounding conductor can be employed to produce the substrate for suspension in this form. For example, a production method useful herein comprises the above-described process of grounding conductor formation, process of insulating layer formation, and process of grounding terminal formation.

The substrate for suspension in this form is used, for example, for a magnetic head suspension in a hard disc drive (HDD). In particular, it is favorably used as a substrate of a magnetic head suspension for use in an HDD having higher-density, narrow-pitched signal conductors.

The present invention is not limited to the above-described embodiment. The aforementioned embodiment is to be considered in all respects as illustrative and not restrictive, and all changes which come within the meaning and range of equivalency of the appended claims are therefore intended to be embraced in the scope of the invention.

EXAMPLE

The present invention will now be described more specifically by way of Example.

Example

Production of Substrate for Suspension

A laminate of SUS 304 with a thickness of 20 μm (metallic substrate), a polyimide layer with a thickness of 10 μm (insulating-layer-forming layer), and a 9-μm thick electrolytic copper layer (conductor-forming layer), the layers being laminated in the order named, was prepared and was then subjected to chemical etching, etc., as will be described below. In this manner, there was obtained a substrate for suspension that had a downsized means of grounding composed of a grounding conductor and a grounding terminal, being present between signal conductors.

The conductor-forming Cu layer in the laminate was first chemically etched, thereby forming a grounding conductor including an opening area whose outer diameter was 150 μm and that had an opening with a diameter of 50 μm.

The line width of the grounding conductor in the part not including the opening area was made 25 μm.

Simultaneously with the formation of the grounding conductor, signal conductors with the same line width as that of the grounding conductor in the part not including the opening area were formed so that the distance between the signal conductor and the grounding conductor in the part not including the opening area was 25 μm and that the distance between the signal conductor and the grounding conductor in the part including the opening area was 100 μm.

The distance between the signal conductor and the grounding conductor in the part including the opening area refers to the distance between the outer periphery of the opening area and the signal conductor.

Thereafter, the polyimide layer was subjected to chemical etching using a photosensitive resist to make, in it, an opening for grounding terminal having the same diameter as that of the opening in the opening area so that its position agreed with the position of the opening in the opening area, and that the metallic substrate was exposed.

Next, by electroplating, nickel (Ni) was deposited on the surface of the grounding conductor and those of the signal conductors to a thickness of about 0.2 μm, and gold (Au) was then deposited on the nickel deposit to a thickness of about 1.5 μm.

Thereafter, by electroplating using the metallic substrate as a feeder, the opening for grounding terminal was filled with nickel (Ni) serving as the grounding-terminal-forming material. The process of nickel plating started from the electrodeposition of nickel on a portion of the metallic substrate surface, exposed in the opening for grounding terminal, and was continued until nickel deposit was fully formed on the opening area across the width, as well as on a portion of the grounding conductor, in the vicinity of the opening for grounding terminal, as shown in FIG. 1. The thickness of the nickel deposit on the upper surface of the opening area after the electroplating had been completed was 20 μm.

Application of the grounding-terminal-forming material could be done without experiencing such a trouble as discrepancy in position.

A photosensitive cover lay useful for protecting the conductors was further applied and was then subjected to exposure and development to form a cover lay in the desired shape. In this manner, there was obtained a substrate for suspension.

Evaluation

The size and resistivity of the substrate for suspension produced in the above Example were compared with those of a conventional substrate for suspension.

In a conventional substrate for suspension, the outer diameter of a means of grounding composed of a grounding conductor and a grounding terminal is about 270 μm, and it has been needed to make the distance between the grounding conductor and the signal conductor 100 μm or more. On the other hand, in the substrate for suspension produced in Example, the means of grounding composed of the grounding conductor and the grounding terminal had an outer diameter of 150 μm, which was equal to the outer diameter of the opening area, and the distance between the grounding conductor and the signal conductor was 100 μm. Thus, the substrate for suspension of the invention was confirmed to be smaller than a conventional one in size.

Further, the resistivity of the substrate for suspension produced in Example, determined at the grounding terminal, was 0.2Ω. The grounding terminal in the means of grounding of the substrate for suspension obtained was thus confirmed to be comparable in properties to a grounding terminal constituting the means of grounding of a conventional substrate for suspension.

Third Embodiment

A substrate for suspension according to the third embodiment of the present invention will be described hereinafter in detail.

A substrate for suspension in this form comprises a metallic substrate, an insulating layer formed on the metallic substrate, signal conductors formed on the insulating layer, and a grounding terminal formed directly on the metallic substrate. The substrate for suspension in this embodiment has two forms, a form (first form) in which the grounding terminal is not in contact with the insulating layer, and a form (second form) in which the insulating layer is formed so that it has an opening for grounding terminal, and the grounding terminal is formed in the opening for grounding terminal so that it is in contact with the insulating layer. Each form of the substrate for suspension of the present will be described below.

The expression "the grounding terminal is formed directly on the metallic substrate" herein means that a grounding terminal is formed singly without forming a grounding conductor that is formed in a conventional substrate for suspension and connects to a grounding terminal.

1. First Form

The first form of the substrate for suspension according to the present invention will be first described. A substrate for suspension in this form is that the grounding terminal in the above-described substrate for suspension is not in contact with the insulating layer.

Figure 43:
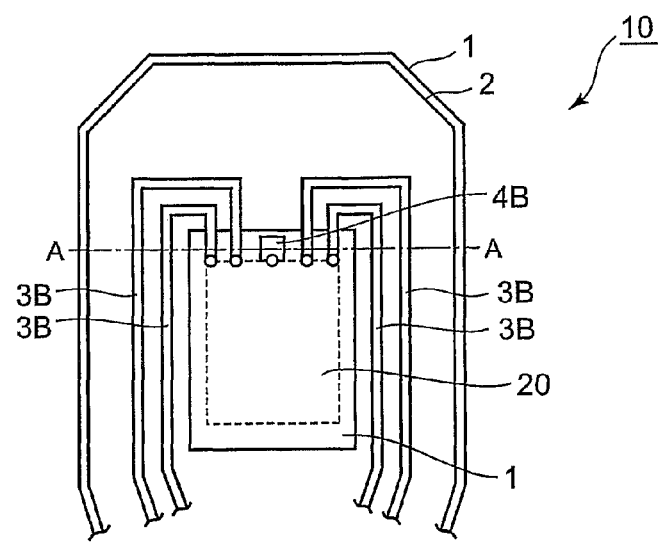
FIG. 43 is a diagrammatic plane view showing a substrate for suspension in the first form according to the third embodiment of the present invention.
Figure 44:
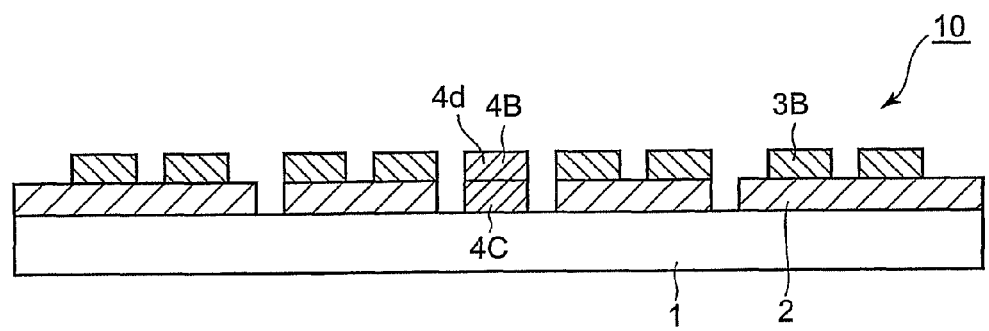
FIG. 44 is a diagrammatic cross-sectional view showing the substrate for suspension in the first form of the present invention.

The substrate for suspension in this form will be described with reference to the accompanying drawings. FIG. 43 is a plane view showing an example of the substrate for suspension in this form, and FIG. 44 is a cross-sectional view of the substrate for suspension, taken along line A-A in FIG. 43. As illustrated in FIGS. 43 and 44, the substrate for suspension 10 comprises a metallic substrate 1, an insulating layer 2 formed on the metallic substrate 1, signal conductors 3B formed on the insulating layer 2, and a grounding terminal 4B formed directly on the metallic substrate 1.

The grounding terminal 4B is connected to the metallic substrate 1 at its lower side 4c (one side), and its upper side (the other side) 4d is exposed to the outside. Namely, the substrate for suspension 10 does not have a grounding conductor that connects to the grounding terminal 4B. Further, the grounding terminal 4B is so formed that it is not in contact with the insulating layer 2.

Figure 54:
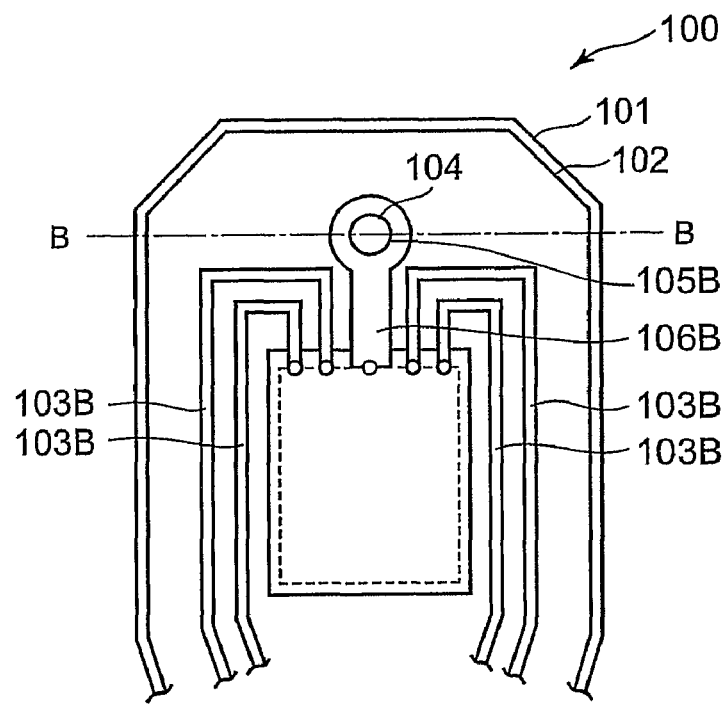
FIG. 54 is a diagrammatic plane view showing a conventional substrate for suspension.
Figure 55:
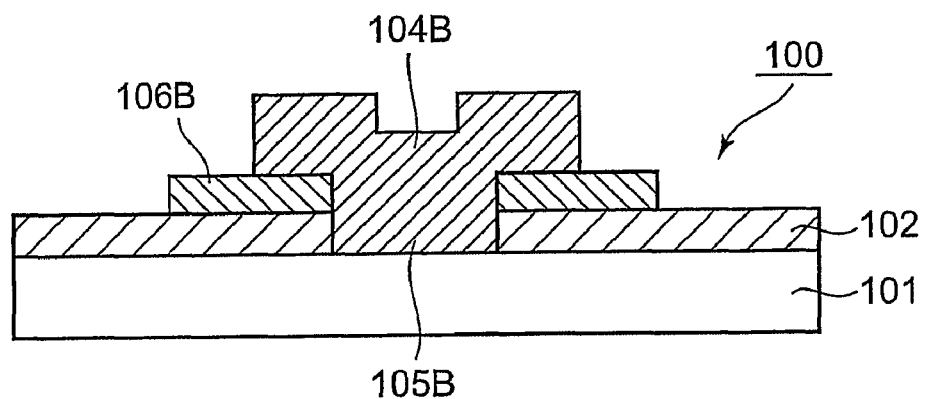
FIG. 55 is a diagrammatic cross-sectional view showing the conventional substrate for suspension.

As illustrated in a plane view in FIG. 54 and in a cross-sectional view in FIG. 55, taken along line B-B in FIG. 54, a conventional substrate for suspension 10 comprises a metallic substrate 101, an insulating layer 102 formed on the metallic substrate 101, having an opening for grounding terminal 105B, a grounding conductor 106B having an opening that surrounds the circumference of the opening for grounding terminal 105B, and signal conductors 103B, both conductors being formed on the insulating layer 102, and a grounding terminal 104B formed by filling the opening for grounding terminal 105B with a grounding-terminal-forming metal, being connected to the metallic substrate 101 and to the grounding conductor 106B. In the above conventional substrate for suspension, since the grounding conductor is so formed that it surrounds the circumference of the opening for grounding terminal, it occupies a large area. It has been not easy to use such a conventional substrate for suspension in a magnetic head because there has been a demand for substrates for suspensions that occupy only very small areas, since magnetic heads have become smaller in size with the recent increase in the density of signal conductors in HDDs.

On the other hand, according to this form, the grounding terminal is formed directly on the metallic substrate, and there is no need to form a grounding conductor that connects to the grounding terminal, so that it is not necessary to take space for the grounding conductor into account. The position of the grounding terminal, therefore, can be determined with a higher degree of freedom, and the grounding terminal can be easily formed even when higher-density, narrow-pitched signal conductors have been formed on the substrate for suspension. Moreover, there is no need to take the stability of connection between the grounding terminal and the grounding conductor into account, and poor connection between the grounding terminal and the grounding conductor never becomes a cause of decrease in yield.

Further, since the grounding terminal is formed so that it is not in contact with the insulating layer, it can have a smaller outer diameter. In the case where a grounding terminal is formed so that it is in contact with an insulating layer, a photoresist in the form of a dry film or the like, having an opening in the position in which the grounding terminal will be formed, is applied to the insulating layer. After making the opening for grounding terminal in the insulating layer, the photoresist is stripped. Subsequently, a photoresist layer having an opening that surrounds the opening for grounding terminal is formed, and the opening for grounding terminal is then filled with a grounding-terminal-forming metal to form the grounding terminal. In this form, on the other hand, a photoresist in the form of a dry film or the like having an opening in the position in which the grounding terminal will be formed is applied directly to the metallic substrate. By filling the opening in the photoresist with a grounding-terminal-forming metal, the grounding terminal is formed directly on the metallic substrate. The diameter of the opening made in the photoresist formed directly on the metallic substrate can be made smaller than the opening in the photoresist, surrounding the conventional opening for grounding terminal. Therefore, the outer diameter of the grounding terminal for use in this form can be made smaller than the outer diameter of the grounding terminal that is so formed on the above-described conventional substrate for suspension that it is in contact with the insulating layer.

Furthermore, since the grounding terminal is not in contact with the insulating layer, it can be easily formed in such a place as a slider placement position on which an insulating layer is not usually formed and at which the metallic substrate is exposed.

Figure 45:
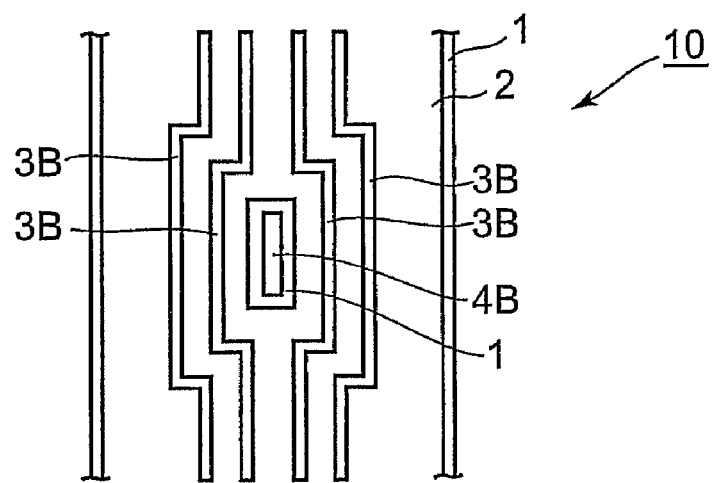
FIG. 45 is a view illustrating a grounding terminal for use in the present invention.

Furthermore, signal conductors and a grounding conductor are usually plated with gold or the like. To cut costs, this plating process is usually conducted in the following manner: after connecting the signal conductors that will connect to the grounding terminal and the grounding conductor by a connecting line, a deposit is formed on the surfaces of the signal conductors and that of the grounding conductor at one time by plating using as feeder layers the signal conductors and the grounding conductor. Therefore, in the case where the grounding conductor is formed, it is necessary to determine the position in which the grounding terminal will be situated, with consideration for the positions in which the connecting line and the grounding conductor will be formed. On the other hand, in this form, a grounding conductor that will connect to the grounding terminal is not formed, so that there is no need to take the formation of the connecting line into account, which can make the degree of freedom in determining the position of the grounding terminal higher. It is therefore easy to produce a substrate for suspension comprising a metallic substrate 1, an insulating layer 2 formed on the metallic substrate 1, signal conductors 3B formed on the insulating layer 2, and an independent grounding terminal 4B formed between the signal conductors 3B, 3B, as illustrated in FIG. 45.

Furthermore, since there is no need to form a line for connecting the grounding conductor and the signal conductors, the formation of a bridge is unnecessary. The bridge herein means a place in which a line for connecting signal conductors and a grounding conductor is formed. Since a conventional substrate for suspension is relatively large and the layout of conductors to be formed on it can be designed with a high degree of freedom, it has been possible to form a grounding conductor extended to a point apart from the position in which the grounding conductor must be formed, and to form a bridge for the extended grounding conductor. However, in a substrate for suspension, on which higher-density, narrow-pitched signal conductors have been formed, it is often difficult to extend the grounding conductor to a point apart from the position in which the grounding conductor must be formed, and in this case, it is necessary to form a bridge around the position in which the grounding conductor must be formed. When such a bridge is formed in the front part of the substrate for suspension, on which a slider for reading out the data from a disk and writing the data on a disk is mounted, the substrate for suspension is not easy to control the degree of springness, etc., and may be difficult to read out the data from a disk and write the data on a disk with a slider while stably floating on the desk in a hard disk drive. On the other hand, in this form, since there is no need to form the above-described grounding conductor, it is not necessary to form the above-described connecting line or bridge, which makes the substrate for suspension in this form easy to control the degree of springness, etc.

The substrate for suspension in this form has at least the metallic substrate, the insulating layer, the signal conductors, and the grounding terminal. These components of the substrate for suspension in this form will be described hereinafter.

(1) Grounding Terminal 4B

The grounding terminal for use in this form is made directly on the metallic substrate that will be described later and is not in contact with the insulating layer that will be described later.

The expression "the grounding terminal is made directly on the metallic substrate" means that a grounding conductor that is formed in a conventional substrate for suspension and connects to a grounding terminal is not formed. The grounding terminal in this form is formed singly so that it connects to the metallic substrate at its lower side, and that its upper side is exposed.

The grounding conductor that connects to the grounding terminal herein encompasses not only one that connects directly to the grounding terminal, but also one that connects electrically to the grounding terminal. Namely, this form excludes not only a grounding conductor directly connecting to the grounding terminal, but also a grounding conductor electrically connecting to the grounding terminal via other layer made from an electrically conductive material.

The grounding terminal for use in this form is formed directly on the metallic substrate and is not in contact with the insulating layer that will be described later. It is therefore possible to make the outer diameter of the grounding terminal small. Moreover, the grounding terminal can be easily formed on such a place as a slider placement position on which an insulating layer is usually not formed, and at which the metallic substrate is exposed.

Any metal can be used in this form as the grounding-terminal-forming material, as long as it is an electrically conductive metal. It is however preferable to use a metal having excellent adhesion to the metallic substrate that will be described later. Specifically, it is possible to use silver (Ag), gold (Au), copper (Cu), nickel (Ni), and so forth. Of these, silver (Ag) and nickel (Ni) are preferred, and nickel (Ni) is most preferred because it has high conductivity and is inexpensive.

These materials can be identified by XPS (X-ray Photoelectron Spectroscopy).

The grounding terminal for use in this from can be in any shape in a plane view, as long as it can achieve prevention of electrostatic destruction and suppression of the occurrence of noises, and the shape can be selected depending on the use of the substrate for suspension in this form. Examples of shapes useful herein include half circles, circles, ovals, polygons such as squares and pentagons, combs, crosses, and rods.

The section of the grounding terminal for use in this form can be in any shape, as long as the grounding terminal is formed directly on the metallic substrate that will be described later, and is not in contact with the insulating layer that will be described later.

For example, in this form, after applying, in accordance with the production method in this form that will be described later, a photoresist in the form of a dry film or the like, having an opening only in the position in which the grounding terminal will be formed, the grounding terminal that is square is formed, as illustrated in FIG. 44.

The grounding terminal for use in this form can be formed in any position as long as it can achieve prevention of electrostatic destruction and suppression of the occurrence of noises. Specifically, the grounding terminal may be formed in the front part of the substrate for suspension on which a magnetic head slider is mounted, as illustrated in FIG. 43 whose explanation has been given already. In FIG. 43, the grounding terminal 4B is present in such a position that it can connect to a slider placed in a slider placement position 20. Further, signal conductors 3B extended to the points at which they connect to the slider are present, as well.

Figure 46:
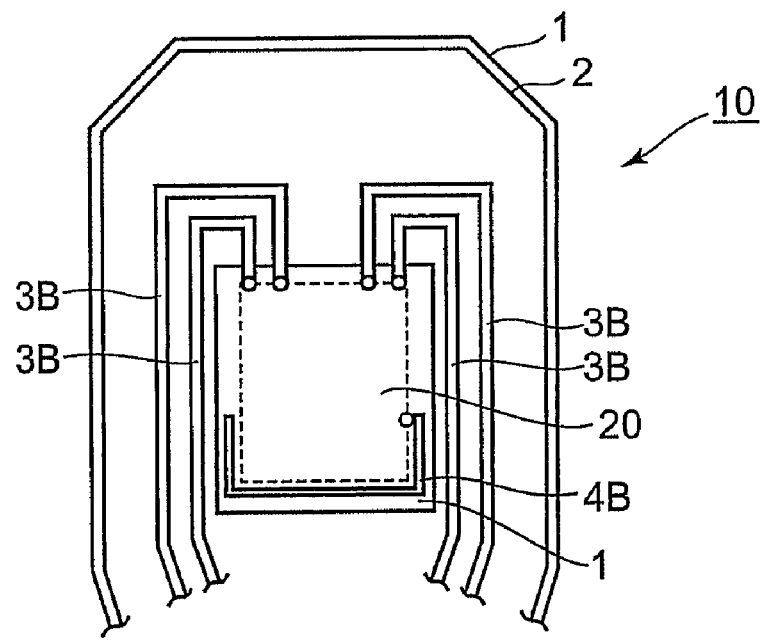
FIG. 46 is a view illustrating a grounding terminal for use in the present invention.

Furthermore, the grounding terminal 4B may also be so formed that it surrounds the slider placement position 20, as illustrated in FIG. 46. This is because, since a substrate for suspension and a slider are usually bonded with an adhesive, the grounding terminal formed around the slider placement position, in which a substrate for suspension and a slider are bonded with an adhesive, can prevent the adhesive from running off.

Moreover, the grounding terminal 4B may be formed in a part other than the front part of the substrate for suspension, as illustrated in FIG. 45. In FIG. 45, the grounding terminal 4B is present between the signal conductors 3B, 3B.

In this form, although the grounding terminal 4B can be suitably formed in any of the above-described positions, it is particularly preferred that the grounding terminal 4B be formed in the front part of the substrate for suspension, on which a magnetic head slider is mounted. Since the metallic substrate is usually exposed at the slider placement position in which a slider is situated, and the grounding terminal is formed so that it is not in contact with the insulating layer, it is easy to form the grounding terminal.

It is preferred that the thickness of the grounding terminal for use in this form be greater than that of the insulating layer that will be described later. Particularly, it is preferred that the thickness of the grounding terminal be greater than that of the insulating layer and be equal to (preferred) or smaller than the total of the thickness of the insulating layer and that of the signal conductor that will be described later. It is easy to connect a grounding terminal greater than the insulating layer in thickness to those components, such as a slider, that are mounted on the substrate for suspension of the present invention. Moreover, such a grounding terminal can efficiently achieve suppression of the occurrence of noises.

Further, a grounding terminal whose thickness is greater than that of the insulating layer and is equal to or smaller than the total of the thickness of the insulating layer and that of the signal conductor that will be described later is free from such a trouble as contact with those components that are mounted on the substrate for suspension in this form.

Furthermore, when the grounding terminal has a thickness equal to the total of the thickness of the insulating layer and that of the signal conductor, i.e., when the surface of the grounding terminal is level with that of the signal conductor, it is more easy to connect the grounding terminal to those components, such as a slider, that are mounted on the substrate for suspension of the present invention.

The grounding terminal for use in this form can have any maximum width as long as it can achieve prevention of electrostatic destruction and suppression of the occurrence of noises. When the grounding terminal is circular or rectangular, its maximum width is preferably between 30 μm and 200 μm, more preferably between 50 μm and 100 μm. This is because a grounding terminal having a maximum width in the above range can be easily formed even when higher-density, narrow-pitched signal conductors have been formed on the substrate for suspension. Moreover, since this form can provide a smaller-sized grounding terminal, the substrate for suspension in this form can more fully exhibit its effects when the maximum width of the grounding terminal is in the above range.

Furthermore, when the grounding terminal is linear, it is preferred that its line width be in the above maximum width range.

The grounding terminal can have any resistivity as long as it can achieve prevention of electrostatic destruction and suppression of the occurrence of noises. The resistivity of the grounding terminal is preferably 5Ω or less, more preferably 1Ω or less, most preferably from 0.10 to 0.25 Ω.

(2) Signal Conductors 3B

The signal conductors for use in this form are formed on the insulating layer that will be described later. They transmit the data, in the form of electrical signals, to be written on or read out from a disk with a slider, when the substrate for suspension in this form is used in an HDD.

Examples of materials useful for the signal conductors in this form include copper (Cu).

Although the signal conductors for use in this form can have any thickness as long as they can exhibit the desired conductivity, their thickness is usually in the range of 6 to 18 μm, preferably in the range of 8 to 12 μm. This is because signal conductors with a thickness in the above range are not obstructive when such a component as a slider is mounted on the substrate for suspension.

Although the signal conductors for use in this form can have any line width as long as they can exhibit the desired conductivity, their line width is preferably from 10 to 100 μm, more preferably from 15 to 50 μm. This is because when the line width is in the above range, higher-density, narrow-pitched signal conductors can be stably formed on the substrate for suspension.

The narrowest of the pitches with which the signal conductors are formed in this form is preferably in the range of 60 to 200 μm, more preferably in the range of 60 to 100 μm. The grounding terminal can be easily formed even when higher-density, narrow-pitched signal conductors have been formed on the substrate for suspension. Therefore, when the narrowest pitch is in the above range, the substrate for suspension in this form can more fully exhibit its effects.

It is preferred that a protective deposit of nickel (Ni) or gold (Au) be formed on the surfaces of the signal conductors for use in this form. Such a protective deposit can make the signal conductors resistant to corrosion.

The protective deposit can have any thickness as long as it can ensure corrosion resistance for the signal conductors. The thickness of the protective deposit is preferably 5 μm or less, more preferably between 1 μm and 2 μm.

(3) Insulating Layer 2

The insulating layer for use in this form is formed on the metallic substrate that will be described later.

Examples of materials useful for the insulating layer include polyimide (PI).

The insulating layer can have any thickness as long as it can have the desired insulating properties, and its thickness is usually about 5 to 30 μm.

(4) Metallic Substrate 1

The metallic substrate for use in this form has electrical conductivity. Moreover, it usually has a moderate degree of springness because it constitutes a substrate to be used for a suspension.

Examples of materials useful for the metallic substrate include SUS.

Preferably, the metallic substrate for use in this form has an electrically conductive layer on the side on which the grounding terminal will be formed. This is because when such an electrically conductive layer is present, the grounding terminal can produce continuity more efficiently. Specific examples of materials useful for the electrically conductive layer include copper (Cu). The electrically conductive layer can be formed by a variety of methods including plating.

The metallic substrate can have any thickness as long as it can exhibit the desired degree of springness. The thickness of the metallic substrate is usually from 10 μm to 30 μm, preferably from 15 μm to 25 μm, although it depends on the material for the metallic substrate, and so on.

(5) Substrate for Suspension 10

The substrate for suspension in this form can have a cover lay (CL) on the insulating layer, if necessary. The cover lay may also be formed on the grounding terminal. In the case where the grounding terminal has a point of contact with such a component as a slider on the substrate for suspension so that it can eliminate static electricity from the component, the cover lay is formed so that it has an opening in the position corresponding to the point of contact. The cover lay can have any thickness and its thickness is usually about 5 to 30 μm. Any material can be used to form the cover lay, and the same materials as those used to form cover lays on ordinary flexible substrates, etc. can be used herein.

Any method can be employed to produce a substrate for suspension in this form, as long as the components of the substrate for suspension can be accurately placed in the desired positions. For example, the following method can be used to produce a substrate for suspension 10 in this form. A laminate of a metallic substrate 1, an insulating-layer-forming layer 2' of a material for an insulating layer, formed on the metallic substrate 1, and a signal-conductor-forming layer 3B' of a material for signal conductors is first made as shown in FIG. 47(a). A photoresist 11 in the form of a dry film or the like is then formed on each side of the laminate and is patterned as desired (FIG. 47(b)). Patterning of the signal-conductor-forming layer 3B' is then conducted by etching, and the photoresist 11 is stripped, thereby forming signal conductors 3B (FIG. 47(c)). Thereafter, a photoresist 11 in the form of a dry film or the like is formed and is patterned as desired (FIG. 47(d)). The insulating-layer-forming layer 2' is then subjected to patterning by etching (FIG. 47(e)), and the photoresist 11 is stripped, thereby forming an insulating layer 2 (FIG. 47(f)).

Figure 48:
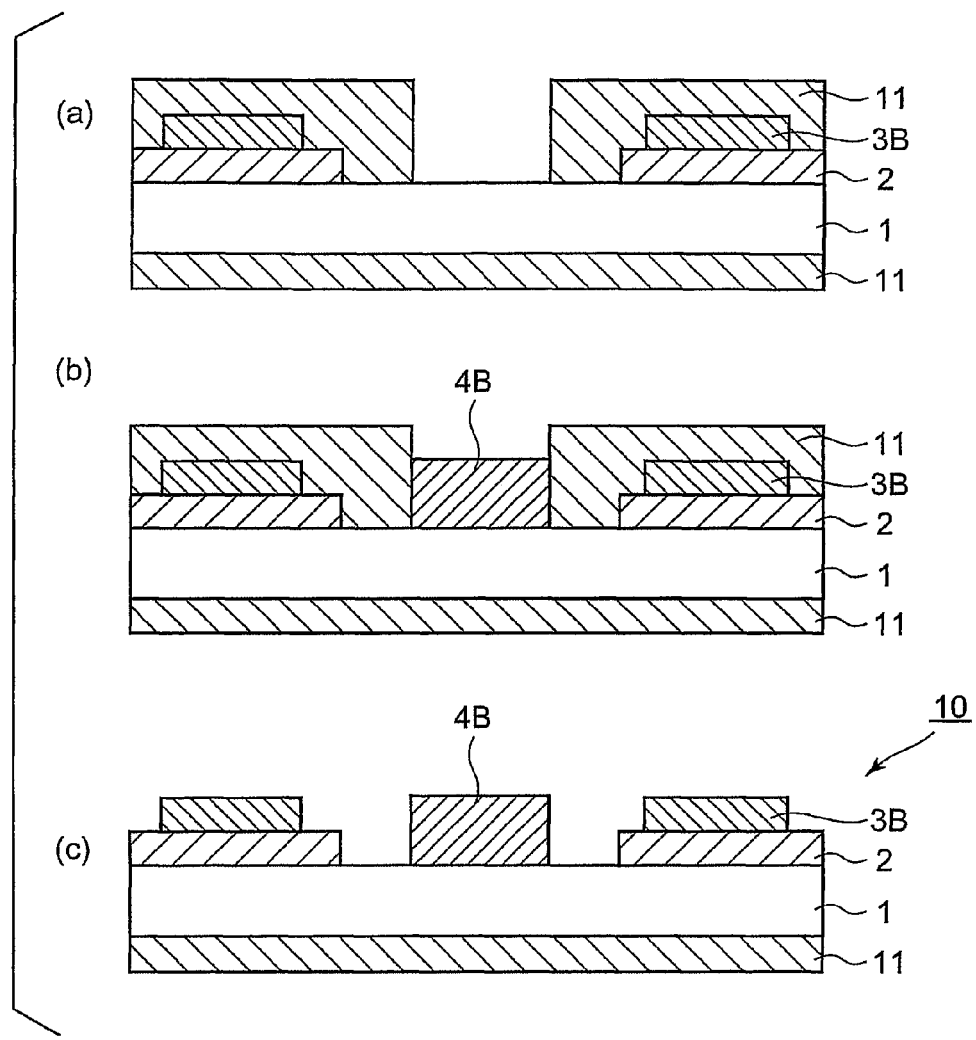
FIG. 48 is a flow chart showing a process of producing a substrate for suspension of the present invention.

Subsequently, a photoresist 11 in the form of a dry film or the like is formed and is patterned as desired, as shown in FIG. 48(*a*). Using the metallic substrate 1 as a feeder layer, the etched portions are filled with a grounding-terminal-forming metal, thereby forming a grounding terminal 4B (FIG. 48(*b*)). The photoresist 11 is then stripped. In this manner, a substrate for suspension 10 in this form can be obtained (FIG. 48(*c*)).

Figure 47:
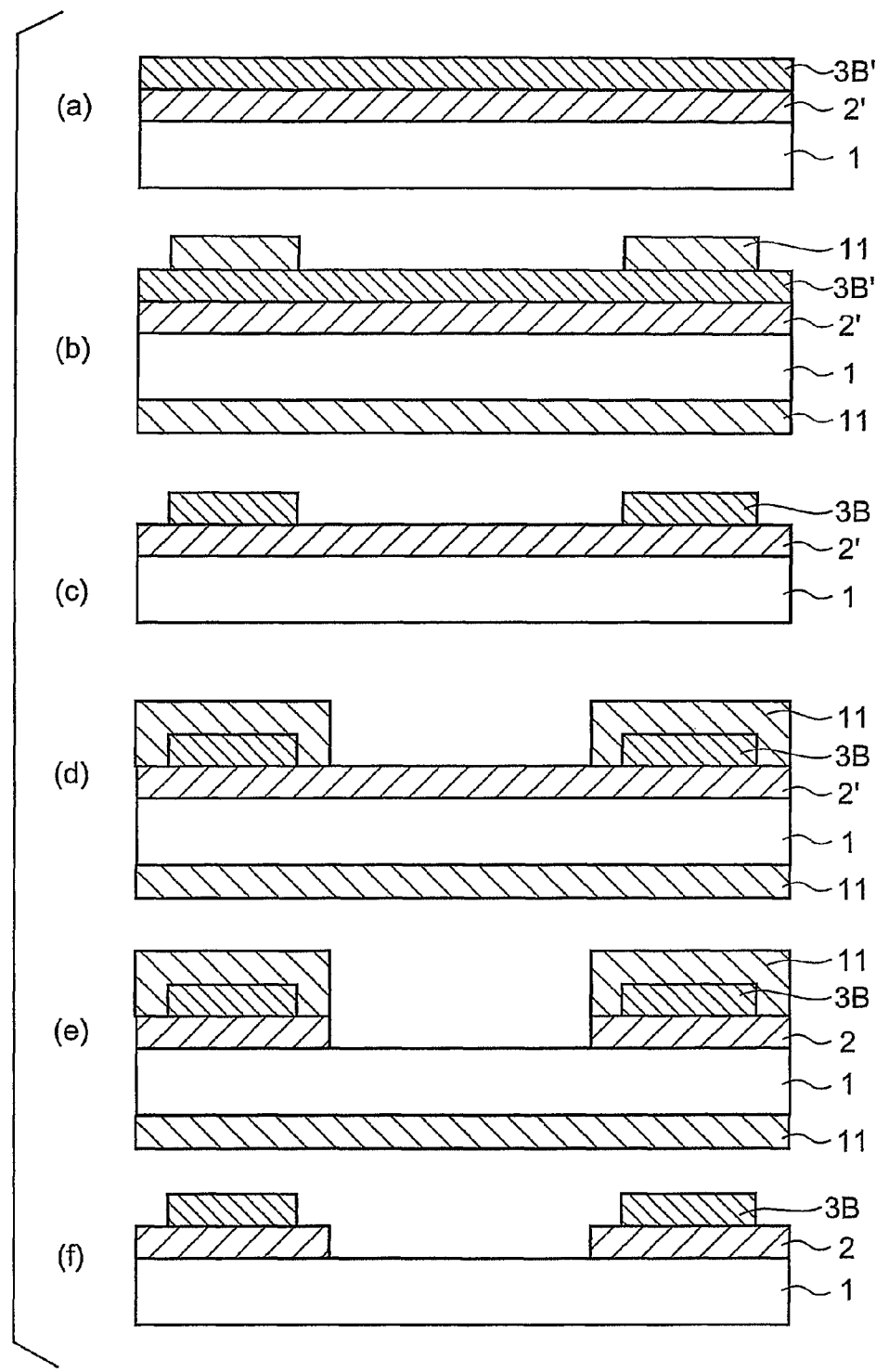
FIG. 47 is a flow chart showing a process of producing a substrate for suspension of the present invention.

FIGS. 47(*a*)-(*c*) show the process of signal conductor formation, and FIGS. 47(*d*)-(*f*), the process of insulating layer formation. FIGS. 48(*a*)-(*c*) show the process of grounding terminal formation.

The substrate for suspension in this form is used for a magnetic head suspension in a hard disc drive (HDD). In particular, it is favorably used for a magnetic head suspension for use in an HDD having higher-density, narrow-pitched signal conductors.

2. Second Form

Next, the second form of the substrate for suspension according to the present invention will be described. A substrate for suspension in the second form is equivalent to the above-described substrate for suspension in which the insulating layer is formed so that it has an opening for grounding terminal, and the grounding terminal is formed in the opening for grounding terminal so that it is in contact with the insulating layer.

In the substrate for suspension in this form, the grounding terminal is formed directly on the metallic substrate. The expression "the grounding terminal is formed directly on the metallic substrate" means that a grounding conductor that is formed in a conventional substrate for suspension and connects to a grounding terminal is not formed, as mentioned previously, and that the grounding terminal is formed singly.

Figure 49:
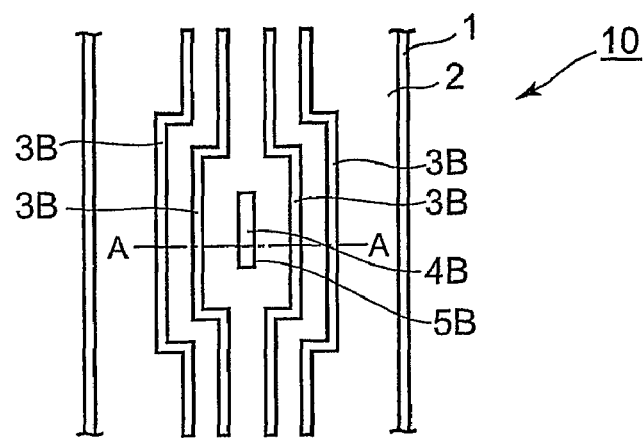
FIG. 49 is a diagrammatic plane view showing a substrate for suspension in the second form according to the third embodiment of the present invention.
Figure 50:
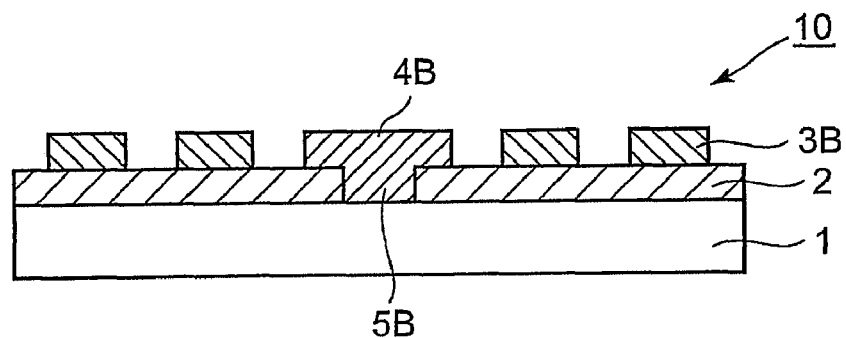
FIG. 50 is a diagrammatic plane view showing the substrate for suspension in the second form of the present invention.

A substrate for suspension in the second form will be described with reference to the accompanying drawings. FIG. 49 is a plane view of a substrate for suspension in this form, and FIG. 50 is a cross-sectional view of the substrate for suspension, taken along line A-A in FIG. 49. The substrate for suspension 10 comprises a metallic substrate 1, an insulating layer 2 formed on the metallic substrate 1, signal conductors 3B formed on the insulating layer 2, and a grounding terminal 4B formed directly on the metallic substrate 1, as illustrated in FIGS. 49 and 50.

The substrate for suspension 10 in this form does not comprise a grounding conductor that will connect to the grounding terminal 4B. The insulating layer 2 is formed so that it has an opening for grounding terminal 5B, and the grounding terminal 4B is formed in the opening for grounding terminal 5B so that it is in contact with the insulating layer 2.

According to this form, it is easy to form the grounding terminal even when higher-density, narrow-pitched signal conductors have been formed on the substrate for suspension, and it is possible to make the grounding terminal smaller in size. Moreover, it is possible to make the substrate for suspension in this form easy to control the degree of springness, etc.

Further, since a grounding conductor that will connect to the grounding terminal is not formed, poor connection between the grounding terminal and the grounding conductor never becomes a cause of decrease in yield.

Furthermore, since the grounding terminal is formed so that it is in contact with the insulating layer, it is easy to make the thickness of the grounding terminal great, and it is also possible to make the grounding terminal scarcely undergo damage or the like.

The substrate for suspension in this form has at least the metallic substrate, the insulating layer, the signal conductors, and the grounding terminal. These components of the substrate for suspension in this form will be described hereinafter. The metallic substrate and the signal conductors in the substrate for suspension in this form are the same as the ones described in the above "1. First Form", so that explanations of them will not be repeated in the following description.

(1) Grounding Terminal 4B

The grounding terminal for use in this form is formed directly on the metallic substrate. In the opening for grounding terminal made in the insulating layer that will be described later, the grounding terminal is formed so that it is in contact with the insulating layer.

The expression "the grounding terminal is formed directly on the metallic substrate" means that a grounding conductor that is formed in a conventional substrate for suspension and connects to a grounding conductor is not formed. The grounding terminal connects to the metallic substrate at its lower side, and its upper side is exposed. Namely, the grounding terminal is formed singly.

The grounding conductor that connects to the grounding terminal refers not only to a grounding conductor that is brought into direct contact with the grounding terminal, but also to a grounding conductor that connects electrically to the grounding terminal, as mentioned above. Namely, in this form, there is formed neither a grounding conductor that is in contact with the grounding terminal, nor a grounding conductor that is electrically connected to the grounding terminal via an electrically conductive material.

Figure 51:
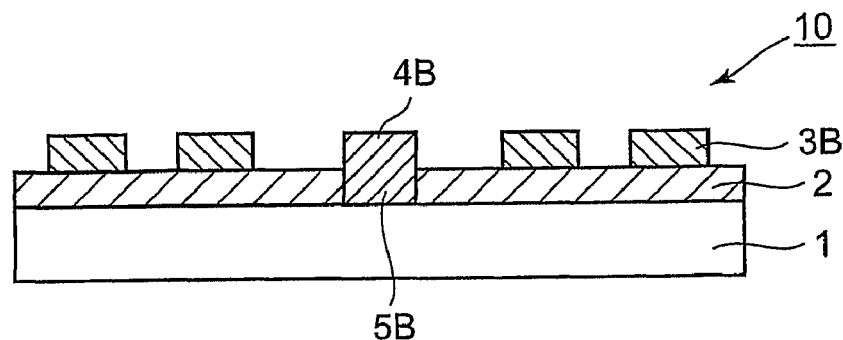
FIG. 51 is a view illustrating a grounding terminal for use in the present invention.

The section of the grounding terminal can be in any shape, as long as the grounding terminal is in contact with the insulating layer that will be described later. Specifically, the grounding terminal may be in contact with the insulating layer at the sidewall of and the surface around the opening for grounding terminal, as shown in FIGS. 49 and 50 whose explanations have been given already. Alternatively, the grounding terminal may be in contact with the insulating layer only at the sidewall of the opening for grounding terminal, as illustrated in FIG. 51.

Figure 52:
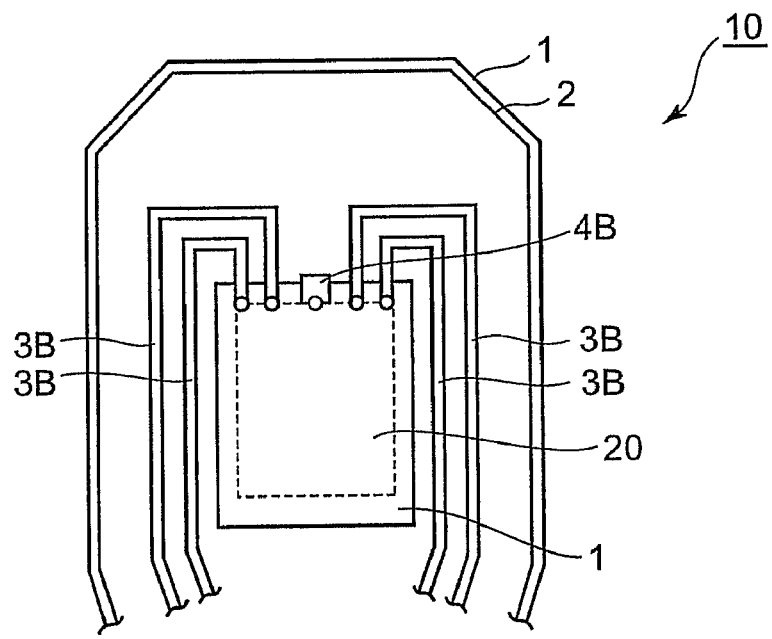
FIG. 52 is a view illustrating a grounding terminal for use in the present invention.
Figure 53:
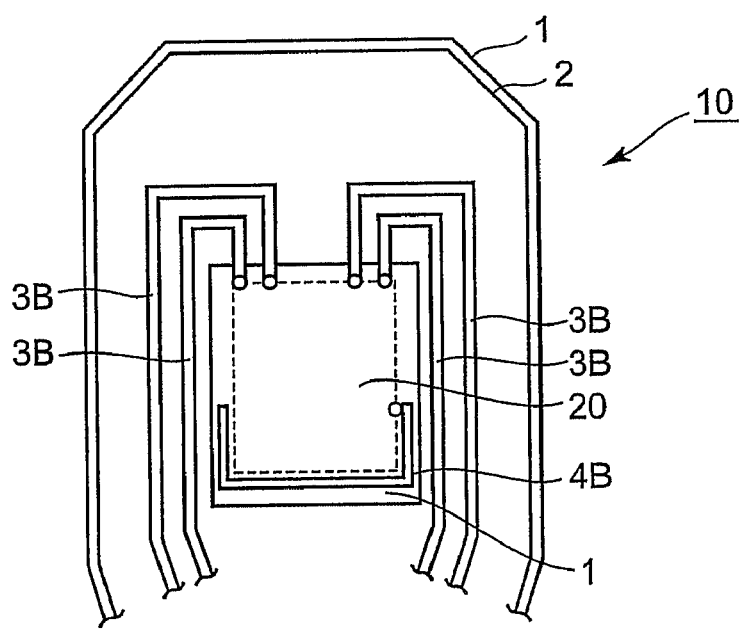
FIG. 53 is a view illustrating a grounding terminal for use in the present invention.

The grounding terminal for use in this form can be formed in any position on the substrate for suspension and may be formed in the front part of the substrate for suspension, on which a slider for a magnetic head will be mounted, as illustrated in FIGS. 52 and 53. In FIG. 52, the grounding terminal 4B is present in such a position at which it can connect to a slider situated in a slider placement position 20. Moreover, signal conductors 3B extended to the points at which they can connect to the slider are present, as well.

Alternatively, the grounding terminal 4B may be formed around the slider placement position 20, as illustrated in FIG. 53. This is because, since a substrate for suspension and a slider are usually bonded with an adhesive, the grounding terminal formed around the slider placement position, in which a substrate for suspension and a slider are bonded with an adhesive, can prevent the adhesive from running off.

Furthermore, the grounding terminal 4B may be formed in a part other than the front part of the substrate for suspension, as illustrated in FIG. 49. In FIG. 49, the grounding terminal 4B is present between two signal conductors 3B, 3B.

In this form, the grounding terminal can be suitably formed in any of the above-described positions. It is particularly preferred that the grounding terminal be formed in the vicinity of signal conductors formed with a narrow pitch. Since the grounding terminal can be made smaller in size and is formed so that it is in contact with the insulating layer, it can be easily formed even between signal conductors formed with a narrow pitch.

The grounding terminal for use in this form can have any maximum width as long as it can achieve prevention of electrostatic destruction and suppression of the occurrence of noises. When the grounding terminal is circular or rectangular, its maximum width is preferably between 30 μm and 200 μm, more preferably between 50 μm and 100 μm. This is because a grounding terminal having a maximum width in the above range can be easily formed even when higher-density, narrow-pitched signal conductors have been formed on the substrate for suspension. Further, in this form, the grounding terminal can be made smaller in size, so that as long as its maximum width is in the above range, the substrate for suspension in this form can exhibit its effects more fully.

Furthermore, when the grounding terminal is linear, its line width is preferably in the above maximum width range.

The shape in a plane view, thickness, and resistivity of the grounding terminal for use in this form, and the type of metal useful for the grounding terminal may be the same as those described in the item "(1) Grounding Terminal" in the above "1. First Form".

(2) Insulating layer 2

The insulating layer for use in this form has the opening for grounding terminal so made that the metallic substrate is exposed.

The opening for grounding terminal for use in this form may be in any shape in a plane view, as long as a grounding-terminal-forming metal can be placed in the opening to form the grounding terminal. Examples of shapes useful herein include half circles, circles, ovals, polygons such as squares and pentagons, combs, crosses, and rods.

When the opening for grounding terminal for use in this form is circular or rectangular, its maximum width is preferably from 30 to 300 μm, more preferably from 30 to 200 μm, most preferably from 50 to 100 μm. This is because when the maximum width of the opening for grounding terminal is in the above range, there can be obtained a smaller grounding terminal by filling the opening with a grounding-terminal-forming metal.

In the case where the opening for grounding terminal is linear, it is preferred that its line width be in the above maximum width range.

The material for and thickness of the insulating layer for use in this form may be the same as those described in the item "(3) Insulating Layer" in the above "1. First Form", so that their explanations will not be repeated here any more.

(3) Substrate for Suspension 10

The substrate for suspension in this form can have a cover lay (CL) on the insulating layer, if necessary. Such a cover lay may also be formed on the grounding terminal. In the case where the grounding terminal has a point of contact with such a component as a slider on the substrate for suspension so that it can eliminate static electricity from the component, a cover lay is usually formed so that it has an opening in the position corresponding to the point of contact. The same materials as those described in the item "(5) Substrate for Suspension" in the above "1. First Form" can be used to form the cover lay.

A substrate for suspension in this form can be produced by the same method as the above-described method for producing a substrate for suspension in the first form, except for the following. The opening for grounding terminal is made in the process of insulating layer formation, and, in the next process of grounding terminal formation, a photoresist in the form of a dry film or the like is formed so that it has an opening around the opening for grounding terminal. Subsequently, a grounding-terminal-forming metal is placed in the opening for grounding terminal so that it is in contact with the insulating layer, thereby forming the grounding terminal.

The substrate for suspension in this form is used, for example, for a magnetic head suspension in a hard disc drive (HDD). In particular, it is favorably used as a substrate of a magnetic head suspension for use in an HDD having higher-density, narrow-pitched signal conductors.

The present invention is not limited to the above-described embodiment. The aforementioned embodiment is to be considered in all respects as illustrative and not restrictive, and all changes which come within the meaning and range of equivalency of the appended claims are therefore intended to be embraced in the scope of the invention.

EXAMPLE

The present invention will now be described more specifically by way of Example.

Example

A laminate of SUS 304 with a thickness of 20 μm (metallic substrate), a polyimide layer with a thickness of 10 μm (insulating-layer-forming layer), and a 9-μm thick electrolytic copper layer (conductor-forming layer), the layers being laminated in the order named, was prepared and was then subjected to chemical etching, electroplating, etc., as will be described below. In this manner, there was obtained a substrate for suspension having an independent grounding terminal that had a maximum width smaller than ever and that was formed directly on the metallic substrate, as shown in FIG. 4.

The conductor-forming Cu layer in the laminate was first chemically etched to form, with a narrowest pitch of 25 μm, signal conductors with a line width of 25 μm.

Thereafter, patterning of the 10-μm thick polyimide layer was conducted by chemical etching using a photosensitive resist, thereby obtaining an insulating layer in such a pattern that a portion of the metallic substrate, including a slider placement position in which a slider would be mounted, was exposed.

Subsequently, a 40-μm thick dry film having a linear opening that had a line width of 60 μm and that was in such a shape that it would surround the slider placement position was stuck to the exposed portion of the metallic substrate. By conducting electroplating using the metallic substrate as a feeder layer, nickel was deposited in the opening made in the dry film to form a grounding terminal, the distance between the surface of the metallic surface and that of the nickel deposit being 25 μm. In this manner, there was obtained a substrate for suspension having the grounding terminal formed directly on the exposed portion of the metallic substrate, the portion being exposed to provide a slider placement position.

In the above-described manner, there was obtained the substrate for suspension having a means of grounding that was the grounding terminal formed directly on a part of the metallic substrate on which it has been difficult to mount a conventional means of grounding composed of a grounding terminal and a grounding conductor connected to the grounding terminal.

The resistivity of the above-obtained substrate for suspension, determined at the grounding terminal, was 0.2Ω. The grounding terminal on the substrate for suspension obtained was thus confirmed to be comparable in properties to a grounding terminal constituting the means of grounding of a conventional substrate for suspension.

Further, in a conventional means of grounding composed of a grounding terminal and a grounding conductor connected to the grounding terminal, the maximum width of the whole means of grounding, the total of the width the grounding terminal and that of the grounding conductor, is about 270

µm. On the other hand, the maximum width of the grounding terminal obtained in this Example was 60 µm, and it was thus confirmed that the grounding terminal obtained was smaller in size terminal.

The invention claimed is:

1. A substrate for suspension, comprising:
a metallic substrate;
an insulating layer formed on the metallic substrate, having an opening for grounding terminal so that the metallic substrate is exposed;
a grounding conductor formed on the insulating layer, including an opening forming area that has an opening situated above the opening for grounding terminal and that surrounds the circumference of the opening for grounding terminal; and
a grounding terminal made of a grounding-terminal-forming material placed in the opening for grounding terminal, connecting the metallic substrate and the grounding conductor, the opening forming area being entirely covered with the grounding-terminal-forming material.

2. The substrate for suspension according to claim 1, wherein the entire surface of the grounding conductor is covered directly with a protective deposit.

3. The substrate for suspension according to claim 1, wherein the entire surface of the grounding conductor is covered directly with the grounding-terminal-forming material.

4. The substrate for suspension according to claim 1, wherein the opening forming area has an outer diameter ranging from 50 to 400 µm.

5. The substrate for suspension according to claim 1, wherein the opening for grounding terminal in the insulating layer, has a diameter ranging from 30 to 300 µm.

6. A substrate for suspension, comprising:
a metallic substrate;
an insulating layer formed on the metallic substrate;
signal conductors formed on the insulating layer; and
a grounding terminal formed on the metallic substrate, one side of the grounding terminal being connected to the metallic substrate, the other side exposed outside, wherein the grounding terminal is separated from the insulating layer.

7. The substrate for suspension according to claim 6, wherein the insulating layer has an opening for grounding terminal and the grounding terminal is so situated in the opening for grounding terminal that the grounding terminal is in contact with the insulating layer.

8. The substrate for suspension according to claim 6, wherein the grounding terminal is greater than the insulating layer in thickness.

* * * * *